(12) United States Patent
Fuji

(10) Patent No.: US 12,062,634 B2
(45) Date of Patent: Aug. 13, 2024

(54) SEMICONDUCTOR DEVICE AND PRODUCTION METHOD FOR SEMICONDUCTOR DEVICE

(71) Applicant: ROHM CO., LTD., Kyoto (JP)

(72) Inventor: Kazunori Fuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 367 days.

(21) Appl. No.: 17/596,608

(22) PCT Filed: May 28, 2020

(86) PCT No.: PCT/JP2020/021069
§ 371 (c)(1),
(2) Date: Dec. 14, 2021

(87) PCT Pub. No.: WO2020/255663
PCT Pub. Date: Dec. 24, 2020

(65) Prior Publication Data
US 2022/0302071 A1   Sep. 22, 2022

(30) Foreign Application Priority Data
Jun. 20, 2019   (JP) ................................ 2019-114357

(51) Int. Cl.
*H01L 23/00* (2006.01)
*H01L 23/495* (2006.01)

(52) U.S. Cl.
CPC ........ *H01L 24/37* (2013.01); *H01L 23/49524* (2013.01); *H01L 24/84* (2013.01);
(Continued)

(58) Field of Classification Search
CPC ..................................................... H01L 24/37
(Continued)

(56) References Cited

U.S. PATENT DOCUMENTS

| 2008/0006437 | A1 | 1/2008 | Reinold et al. |
| 2009/0152697 | A1 | 6/2009 | Tamimoto et al. |
| 2011/0073921 | A1 | 3/2011 | Tamimoto et al. |
| 2016/0343590 | A1 | 11/2016 | Yoshihara et al. |
| 2018/0090338 | A1 | 3/2018 | Yoshihara et al. |

(Continued)

FOREIGN PATENT DOCUMENTS

| DE | 102006025867 A1 | 12/2007 |
| DE | 102012222791 A1 | 6/2014 |

(Continued)

OTHER PUBLICATIONS

Office Action issued for German Patent Application No. 11 2020 002 920.4, dated Dec. 7, 2023, 16 pages including informal English translation.

(Continued)

*Primary Examiner* — Ajay Arora
(74) *Attorney, Agent, or Firm* — HSML P.C.

(57) ABSTRACT

A semiconductor device includes a semiconductor element (30), an input lead, and first drive leads (60) connecting a source electrode of the semiconductor element (30) to the input lead. The first drive leads (60) are formed of a thin metal plate that is belt-shaped as viewed in a thickness-wise direction (Z). The first drive leads (60) include at least a metal plate (60A) connected to the semiconductor element (60) and a metal plate (60B) stacked on the metal plate (60A). The metal plate (60A) includes a first connector (61A) connected to the semiconductor element (30). The metal plate (60B) includes a first connector (61B) connected to the first connector (61A). The first connectors (61A, 61B) are stacked in the thickness-wise direction (Z).

20 Claims, 49 Drawing Sheets

(52) U.S. Cl.
CPC .............. *H01L 2224/37005* (2013.01); *H01L 2224/37033* (2013.01); *H01L 2224/37147* (2013.01); *H01L 2224/84214* (2013.01)

(58) Field of Classification Search
USPC ........................................................ 257/666
See application file for complete search history.

(56) References Cited

U.S. PATENT DOCUMENTS

| | | | |
|---|---|---|---|
| 2019/0139873 A1 | 5/2019 | Saito | |
| 2020/0211937 A1 | 7/2020 | Saito | |
| 2021/0280556 A1* | 9/2021 | Kato | ................. H01L 23/49844 |
| 2022/0352105 A1* | 11/2022 | Nishimura | ........ H01L 23/49894 |

FOREIGN PATENT DOCUMENTS

| | | |
|---|---|---|
| JP | 2008-212977 A | 9/2008 |
| JP | 2009-105266 A | 5/2009 |
| JP | 2009-147103 A | 7/2009 |
| JP | 2011159933 A | 8/2011 |
| JP | 2011-204968 A | 10/2011 |
| JP | 2015115471 A | 6/2015 |
| JP | 2015-149326 A | 8/2015 |
| JP | 2019-087741 A | 6/2019 |

OTHER PUBLICATIONS

International Search Report issued in International Application No. PCT/JP2020/021069, Aug. 25, 2020, 3 pages.
International Preliminary Report on Patentability issued for International Patent Application No. PCT/JP2020/021069, Date of issuance: Dec. 21, 2021, 12 pages including English translation.
Notice of Reasons for Refusal issued for Japanese Patent Application No. 2021-527519, Dispatch Date: Oct. 3, 2023, 11 pages including English machine translation.

* cited by examiner

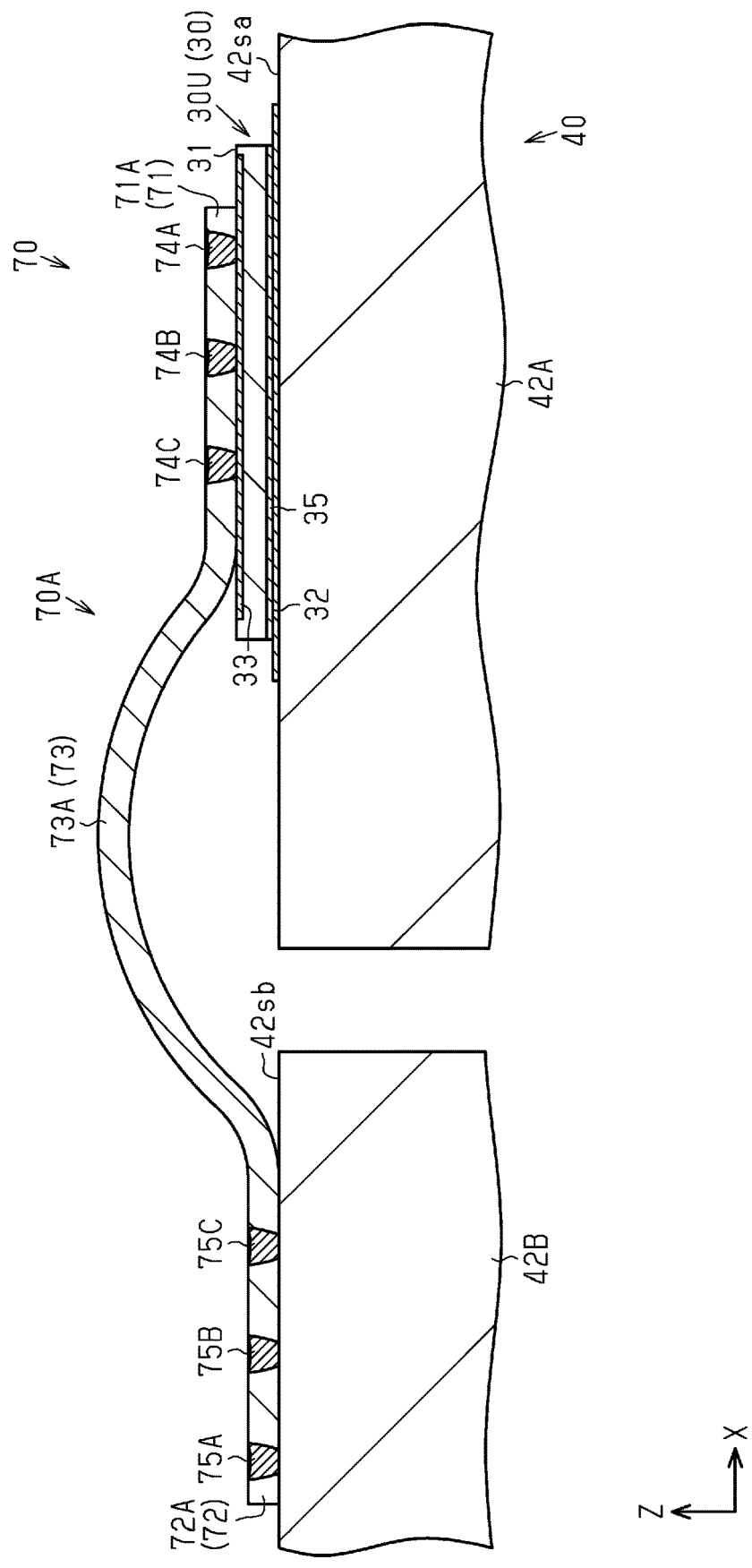

SEMICONDUCTOR DEVICE AND PRODUCTION METHOD FOR SEMICONDUCTOR DEVICE

TECHNICAL FIELD

The present disclosure is related to a semiconductor device and a method for manufacturing a semiconductor device.

BACKGROUND ART

A known semiconductor device includes, for example, a semiconductor element, a conductive member used as an electrical conductor arranged outside the semiconductor element, and a wire connecting a drive electrode of the semiconductor element to the conductive member. The drive electrode and the conductive member may be connected by a belt-shaped clip instead of a wire so that a large current is supplied to the semiconductor device (for example, refer to Patent Document 1).

PRIOR ART DOCUMENT

Patent Document

Patent Document 1: Japanese Laid-Open Patent Publication No. 2019-87741

SUMMARY OF THE DISCLOSURE

Problems that the Invention is to Solve

Even when the drive electrode and the conductive member are connected by a clip, it is difficult to supply a large current to the semiconductor device if the area of contact of the drive electrode with the clip is small or the clip is thin and has a small width.

It is an objective of the present disclosure to provide a semiconductor device and a method for manufacturing a semiconductor device that increase an allowable current amount.

Means for Solving the Problems

To achieve to the above objective, a semiconductor device includes a semiconductor element, a drive conductor, and drive connection members. The semiconductor element includes an element main surface on which a drive electrode is formed. The drive conductor includes a drive connection surface facing in a same direction as the element main surface. The drive connection members connect the drive electrode to the drive conductor. The drive connection members are formed of a thin metal plate that is belt-shaped as viewed in a first direction, which is a direction orthogonal to the element main surface of the semiconductor element. The drive connection members include at least a first connection member connected to the semiconductor element and a second connection member connected to the first connection member. The first connection member includes a first element-side connector connected to the drive electrode. The second connection member includes a second element-side connector connected to the first element-side connector. The first element-side connector and the second element-side connector are stacked in the first direction.

In this configuration, the stacking structure of the first element-side connector and the second element-side connector increases a cross-sectional area obtained by cutting the drive connection members along a plane extending in the first direction and a direction orthogonal to the first direction. Thus, the allowable current amount, that is, the upper limit value of current allowed to flow from the semiconductor element to the drive connection members, is increased.

To achieve the above objective, a method is for manufacturing a semiconductor device that includes a semiconductor element including an element main surface on which an drive electrode is formed, a drive conductor including a drive connection surface facing in a same direction as the element main surface, and drive connection members connecting the drive electrode to the drive conductor and being formed of a thin plate that is belt-shaped as viewed in a first direction, which is a direction orthogonal to the element main surface of the semiconductor element. The method includes a connection member preparing step of preparing at least one of a first connection member configured to be connected to the semiconductor element and a second connection member configured to be connected to the first connection member as the drive connection members, a drive electrode connecting step of connecting a first element-side connector of the first connection member to the drive electrode through laser beam processing, and a first stacking and connecting process of stacking a second element-side connector of the second connection member on the first element-side connector in the first direction and connecting and connecting the second connection member to the first element-side connector through laser beam processing.

In this configuration, the stacking structure of the first element-side connector and the second element-side connector increases a cross-sectional area obtained by cutting the drive connection members along a plane extending in the first direction and a direction orthogonal to the first direction. Thus, the allowable current amount, that is, the upper limit value of current allowed to flow from the semiconductor element to the drive connection members, is increased.

In addition, the first element-side connector is bonded to the drive electrode by laser beam processing. Thus, the load applied to the drive electrode during the bonding of the first element-side connector to the drive electrode is decreased as compared to, for example, a configuration in which the first element-side connector is bonded to the drive electrode by ultrasonic welding. Further, the area of contact of the first element-side connector with the drive electrode is increased as compared to, for example, a configuration in which the first element-side connector is bonded to the drive electrode by ultrasonic welding. Thus, the allowable amount of current from the semiconductor element to the drive connection members is increased.

Effects of the Invention

As described above, the semiconductor device and the method for manufacturing the semiconductor device increase the allowable current amount.

BRIEF DESCRIPTION OF THE DRAWINGS

FIG. 46 is a cross-sectional view showing a structure that joins second drive leads to a semiconductor element and a conductive member in a modified example of a semiconductor device.

MODES FOR CARRYING OUT THE INVENTION

Embodiments of a semiconductor device and a method for manufacturing a semiconductor device will be described below with reference to the drawings. The embodiments described below exemplify configurations and methods for embodying a technical concept and are not intended to limit the material, shape, structure, layout, dimensions, and the like of each component to those described below. The embodiments described below may undergo various modifications.

First Embodiment

Structure of Semiconductor Device

Figure 3:
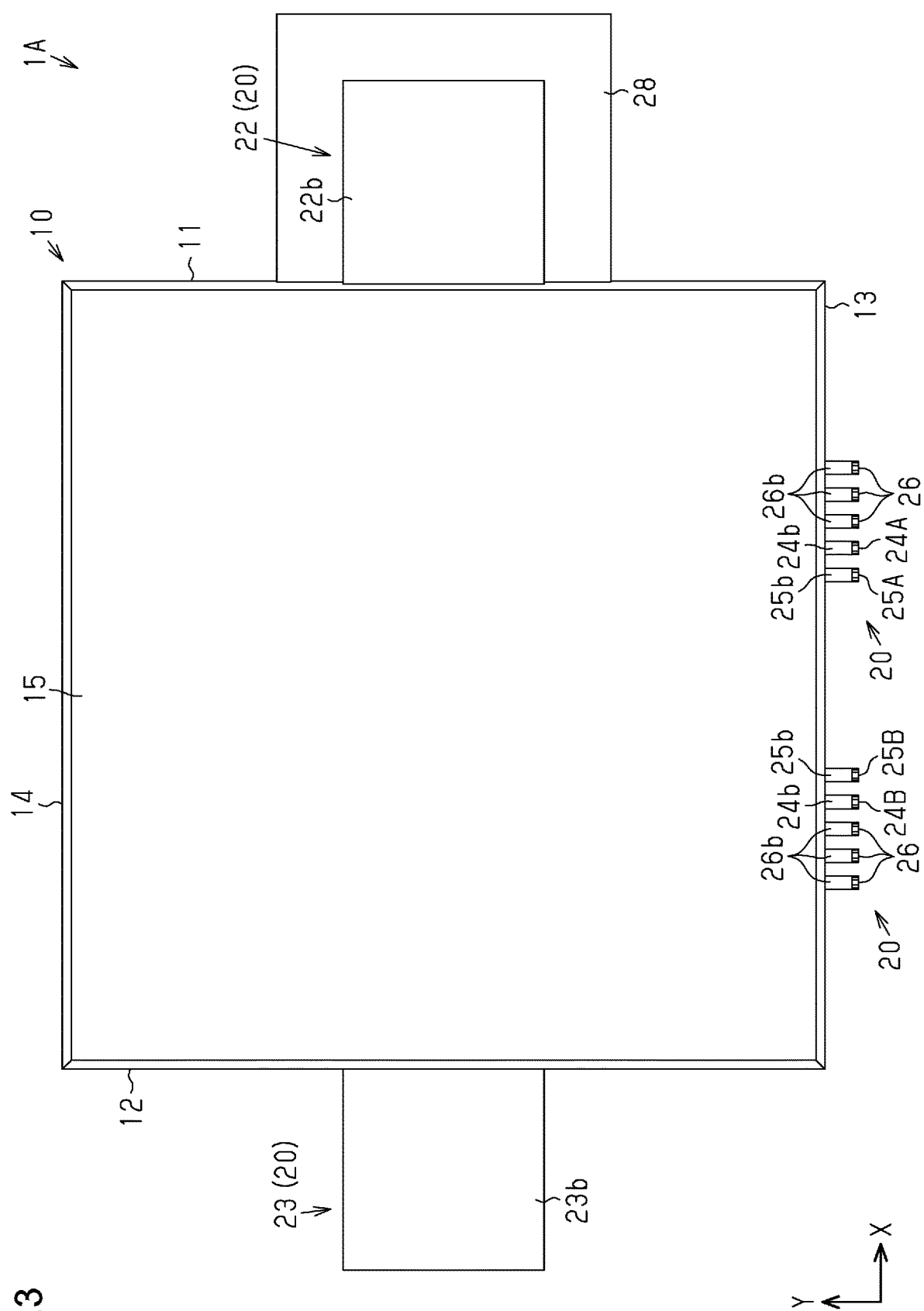
FIG. 3 is a plan view of the semiconductor device shown in FIG. 1.
Figure 4:
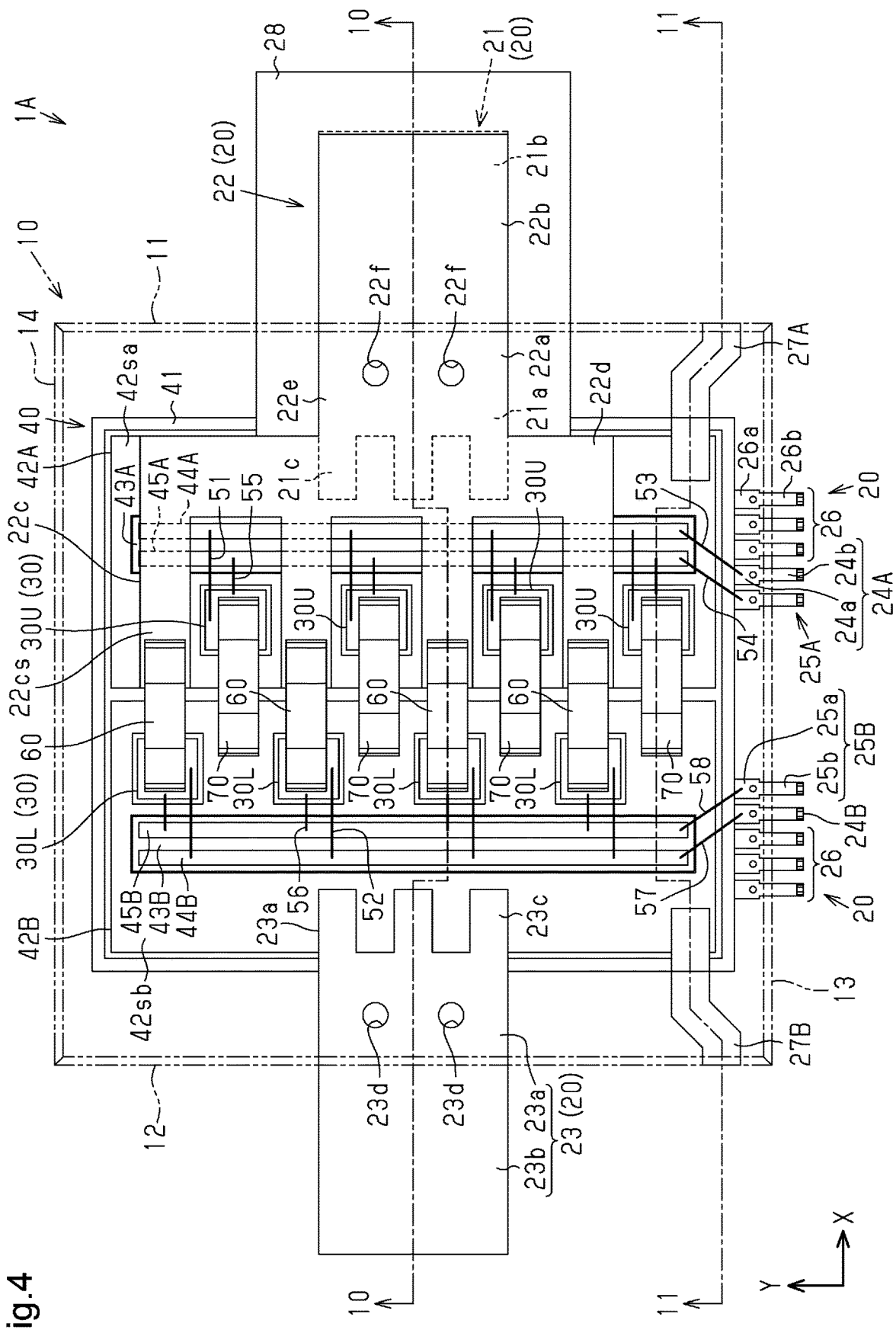
FIG. 4 is a plan view of the semiconductor device shown in FIG. 3 with the encapsulation resin indicated by double-dashed lines.
Figure 5:
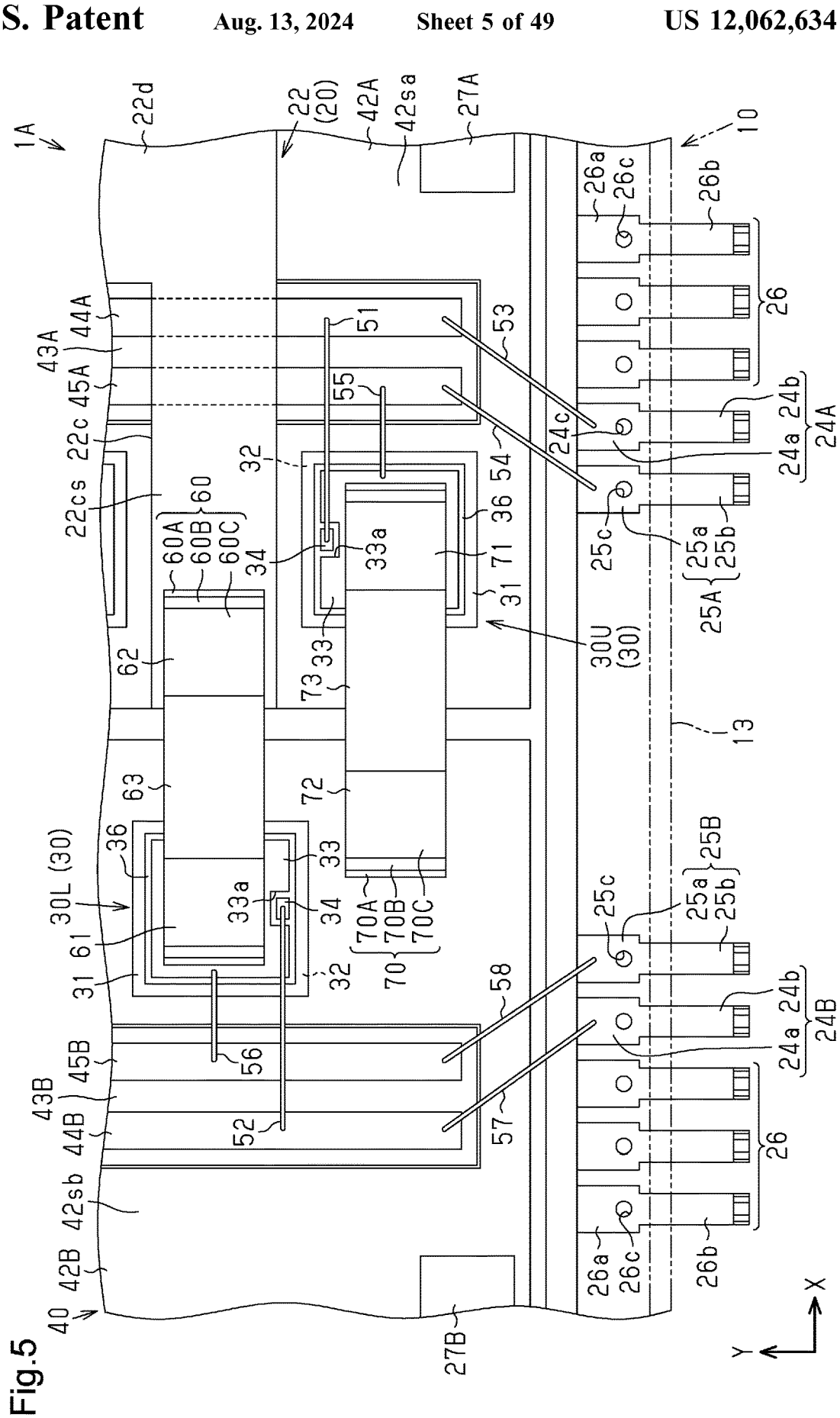
FIG. 5 is an enlarged view of FIG. 4 showing the semiconductor elements and their surroundings.

A first embodiment of a semiconductor device 1A will now be described with reference to FIGS. 1 to 23. To facilitate understanding, FIG. 2 shows a semiconductor device 1A without showing an encapsulation resin 10, and FIGS. 4 and 5 show the encapsulation resin 10 by double-dashed lines.

Figure 1:
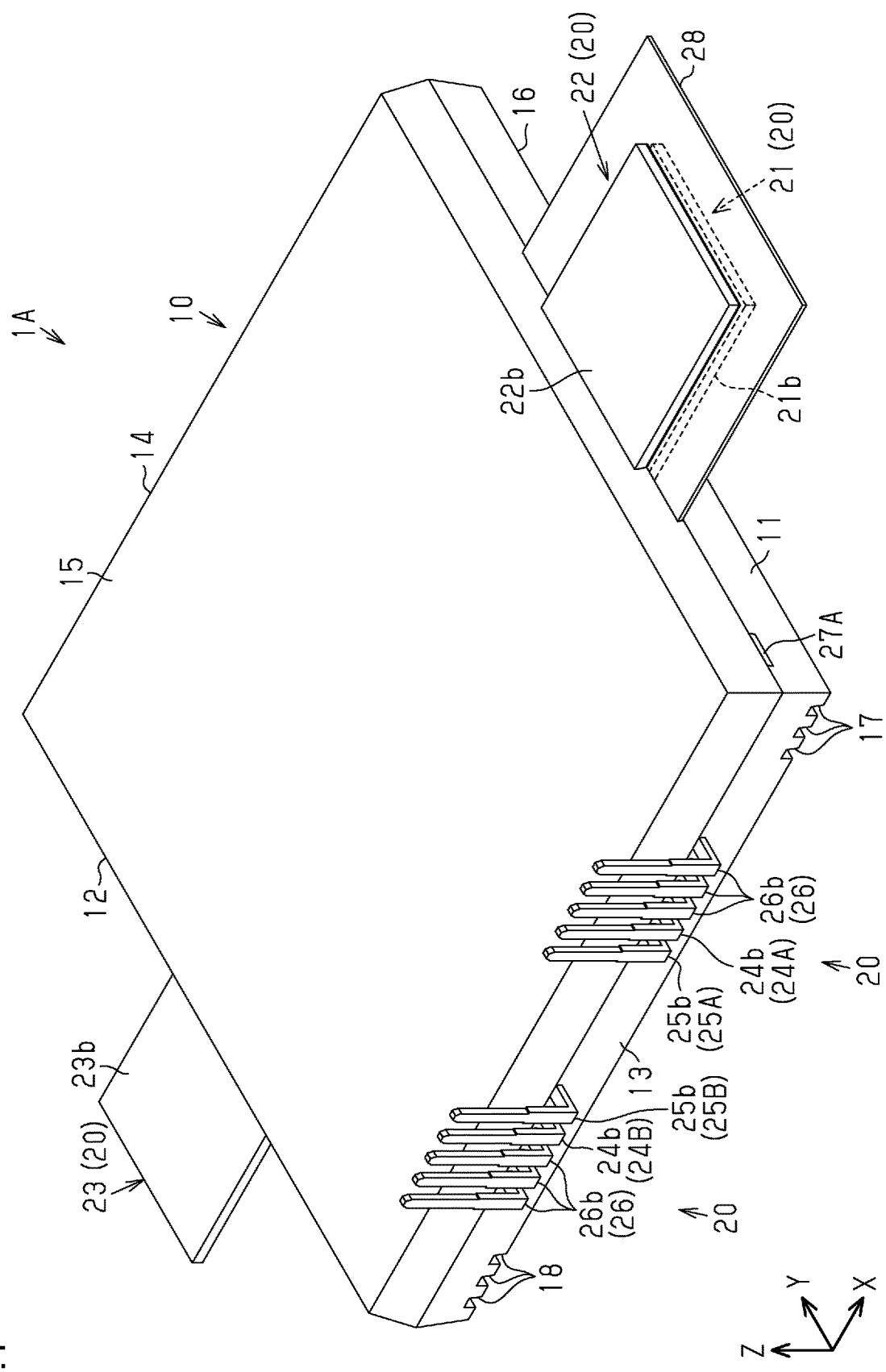
FIG. 1 is a perspective view showing a first embodiment of a semiconductor device.
Figure 2:
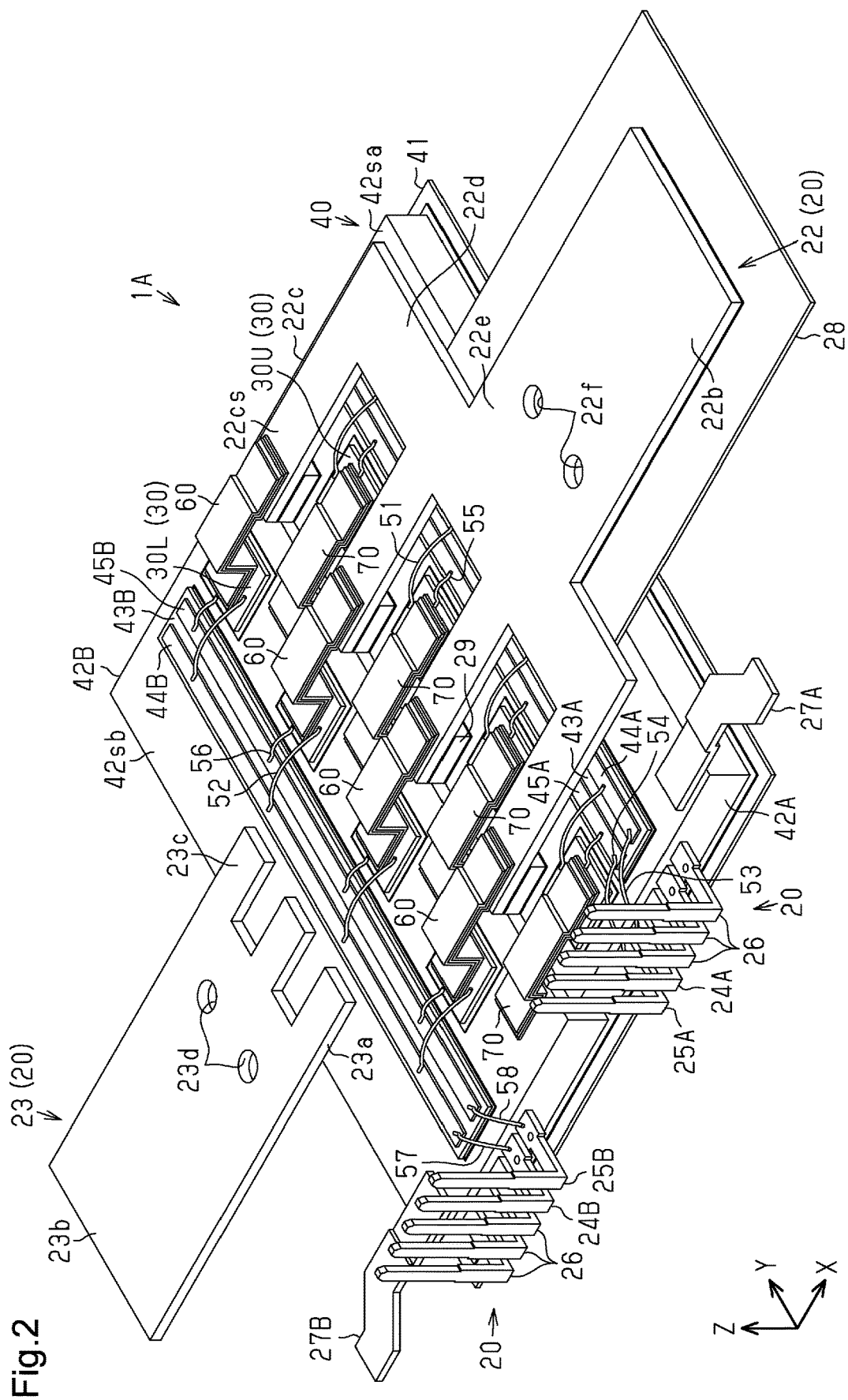
FIG. 2 a perspective view of the semiconductor device shown in FIG. 1 with the encapsulation resin removed.

As shown in FIGS. 1 and 2, the semiconductor device 1A includes the encapsulation resin 10 used as a casing, leads 20 having parts projecting from the encapsulation resin 10, semiconductor elements 30 electrically connected to the leads 20, and a support substrate 40 supporting the leads 20 and the semiconductor elements 30. The semiconductor device 1A includes, for example, a half-bridge switching circuit. In the following description, for the sake of brevity, directions that are orthogonal to each other are defined as a width-wise direction X, a length-wise direction Y, and a thickness-wise direction Z. The width-wise direction X refers to, for example, a direction in which input leads 21 and 22 and an output lead 23, which will be described later, are arranged in the semiconductor device 1A. The length-wise direction Y refers to a direction that is orthogonal to the width-wise direction X as the semiconductor device 1A is viewed in the thickness-wise direction Z (hereafter, referred to as "plan view").

As shown in FIG. 1, the encapsulation resin 10 is generally flat. As shown in FIG. 3, in plan view, the shape of the encapsulation resin 10 is a rectangle. In the present embodiment, in plan view, the encapsulation resin 10 is rectangular such that the long sides extend in the width-wise direction X and the short sides extend in the length-wise direction Y. In plan view, the shape of the encapsulation resin 10 may be changed in any manner. For example, in plan view, the shape of the encapsulation resin 10 may be a square. The material of the encapsulation resin 10 is a thermosetting resin. In the present embodiment, the material of the encapsulation resin 10 is a black epoxy resin.

As shown in FIG. 1, the encapsulation resin 10 includes a resin top surface 15 and a resin back surface 16 facing in opposite directions in the thickness-wise direction Z. The encapsulation resin 10 further includes a first resin side surface 11, a second resin side surface 12, a third resin side surface 13, and a fourth resin side surface 14 formed between the resin top surface 15 and the resin back surface 16 in the thickness-wise direction Z. In the present embodiment, the first resin side surface 11 and the second resin side surface 12 face in opposite directions in the width-wise direction X. The first resin side surface 11 and the second resin side surface 12 extend in the length-wise direction Y. The third resin side surface 13 and the fourth resin side surface 14 face in opposite directions in the length-wise direction Y. The third resin side surface 13 and the fourth resin side surface 14 extend in the width-wise direction X. In plan view, the first resin side surface 11 and the second resin side surface 12 are the short sides of the encapsulation resin 10, and the third resin side surface 13 and the fourth resin side surface 14 are the long sides of the encapsulation resin 10.

Figure 6:
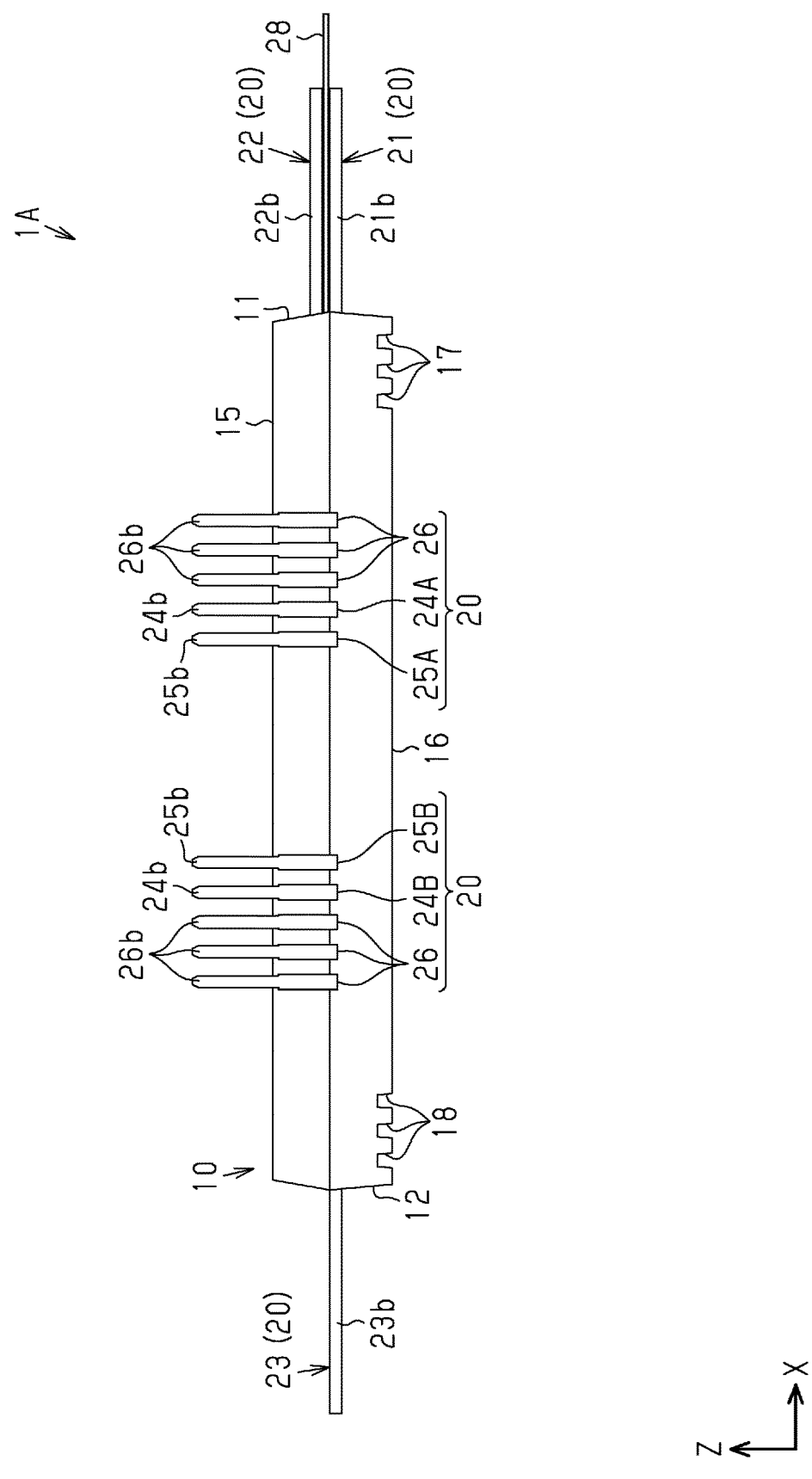
FIG. 6 is a side view of the semiconductor device shown in FIG. 1.
Figure 7:
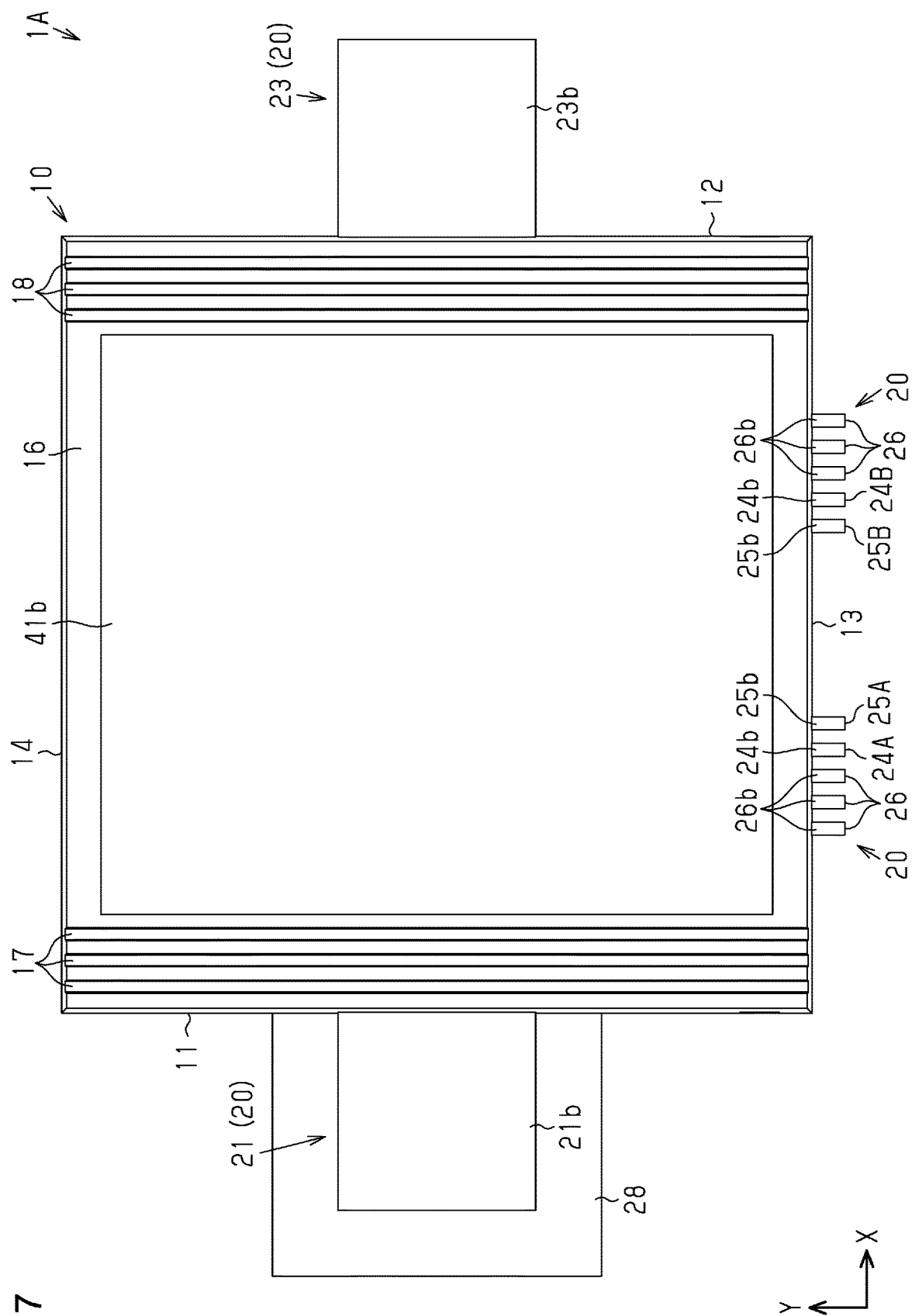
FIG. 7 is a bottom view of the semiconductor device shown in FIG. 1.

As shown in FIGS. 6 and 7, grooves 17 and 18 are recessed from the resin back surface 16 of the encapsulation resin 10 in the thickness-wise direction Z. The grooves 17 are disposed at an end of the encapsulation resin 10 located close to the first resin side surface 11 in the width-wise direction X. Three grooves 17 are provided and separated from each other in the width-wise direction X. The grooves 18 are disposed at an end of the encapsulation resin 10 located close to the second resin side surface 12 in the width-wise direction X. Three grooves 18 are provided and separated from each other in the width-wise direction X. The grooves 17 and 18 extend in the length-wise direction Y. In an example, the grooves 17 and 18 extend from the third resin side surface 13 to the fourth resin side surface 14 of the encapsulation resin 10. The number of grooves 17 and the number of grooves 18 may be changed in any manner. Either or both of grooves 17 and 18 may be omitted from the encapsulation resin 10.

Figure 8:
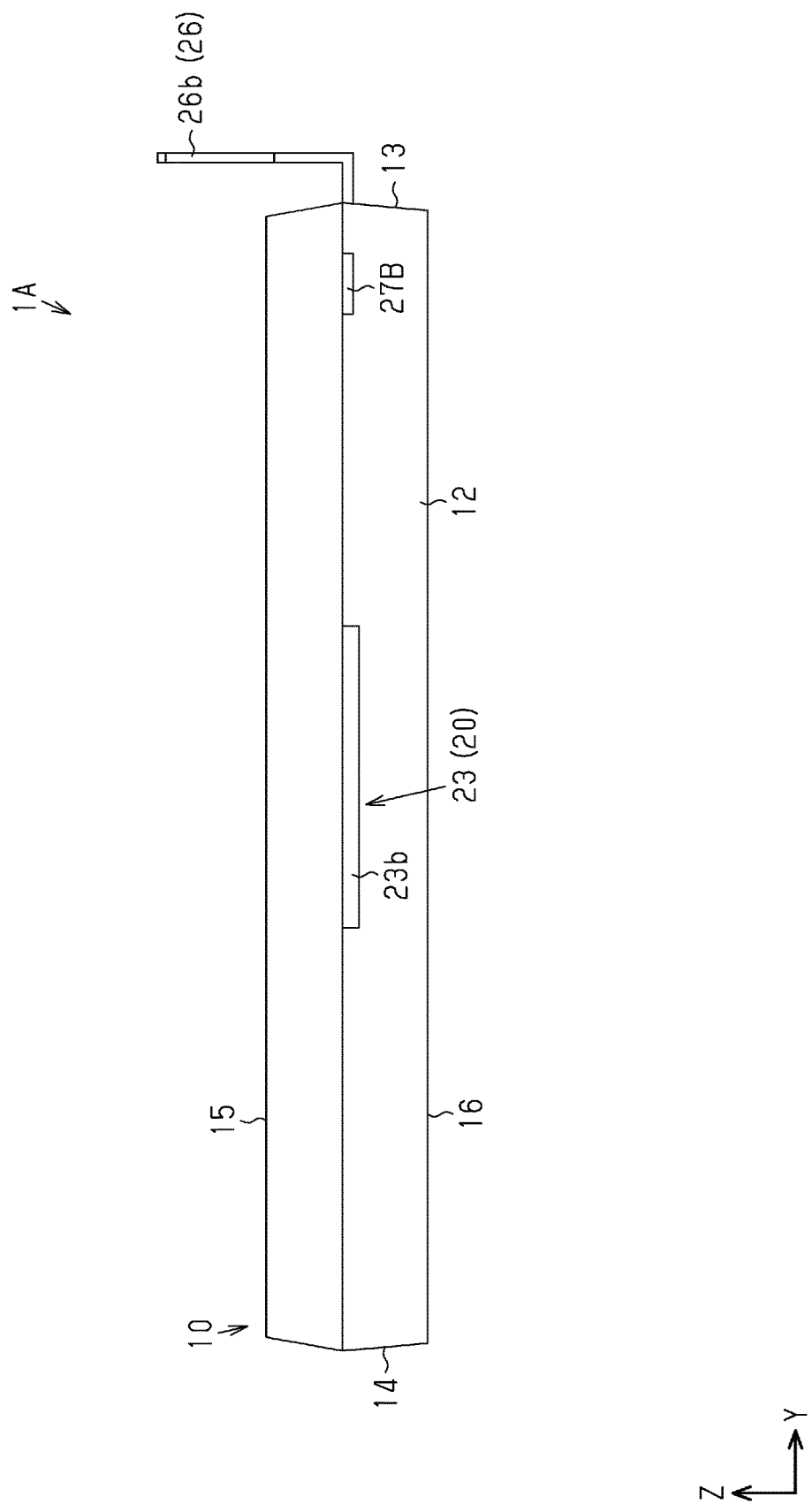
FIG. 8 is a side view of the semiconductor device shown in FIG. 1 as viewed in a direction different from that of FIG. 6.
Figure 9:
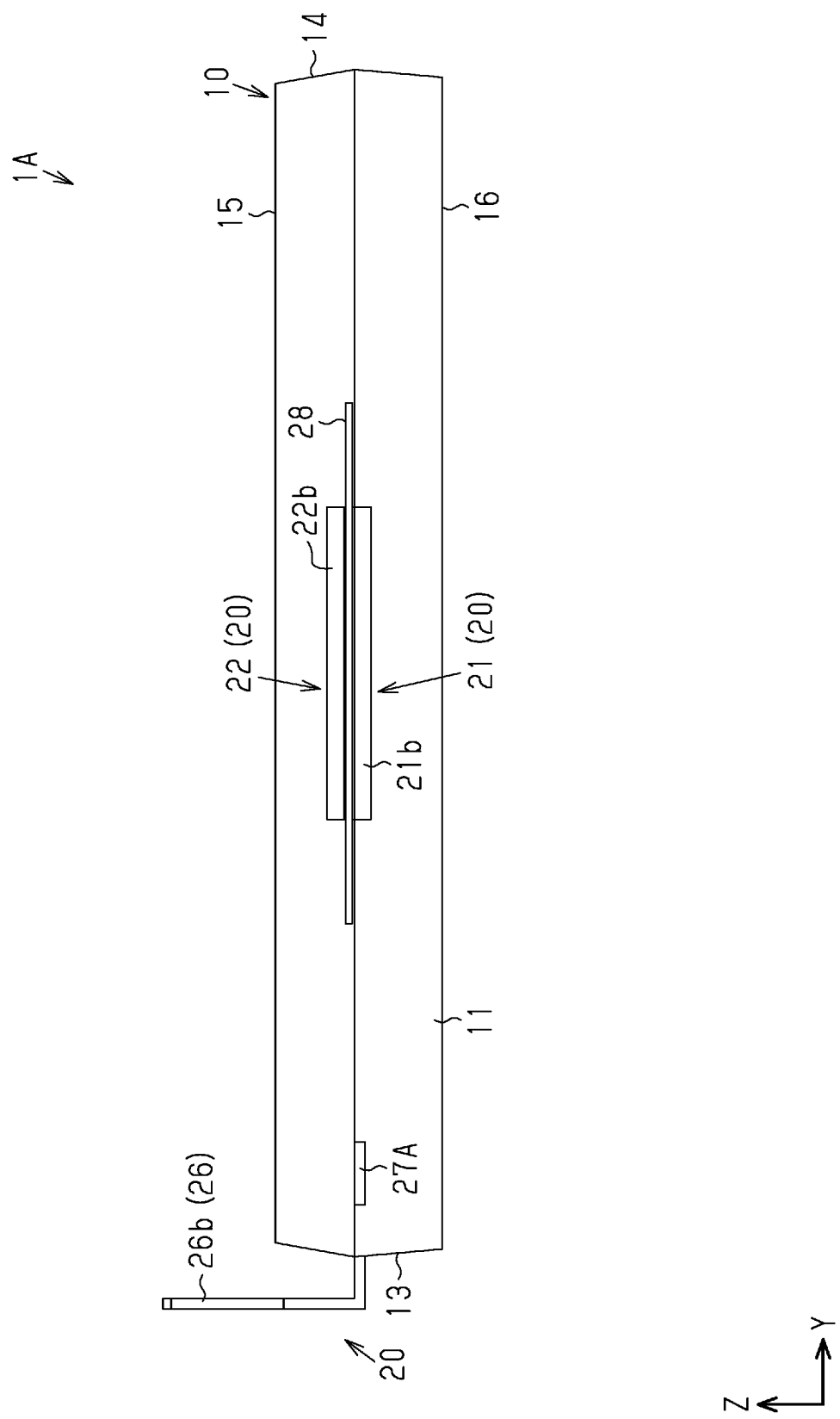
FIG. 9 is a side view of the semiconductor device shown in FIG. 1 as viewed in a direction different from those of FIGS. 6 and 8.

As shown in FIGS. 1 and 2, the leads 20 of the present embodiment include two input leads 21 and 22, an output lead 23, two control leads 24A and 24B, two detection leads 25A and 25B, dummy leads 26, and two side leads 27A and 27B. As shown in FIG. 9, the input leads 21 and 22 project from the first resin side surface 11 of the encapsulation resin 10. The side lead 27A is exposed from the first resin side surface 11. As shown in FIGS. 6 and 8, the output lead 23 projects from the second resin side surface 12 of the encapsulation resin 10. The side lead 27B is exposed from the second resin side surface 12. As shown in FIGS. 3 and 4, the two control leads 24A and 24B, the two detection leads 25A and 25B, and the dummy leads 26 project from the third resin side surface 13 of the encapsulation resin 10.

Positions of the two control leads 24A and 24B, the two detection leads 25A and 25B, and the dummy leads 26 projecting from the resin side surfaces of the encapsulation resin 10 may be changed in any manner. For example, some of the two control leads 24A and 24B, the two detection leads 25A and 25B, and the dummy leads 26 may project from the third resin side surface 13, and the remaining leads may project from the fourth resin side surface 14.

As shown in FIGS. 2 and 4, the semiconductor device 1A includes the semiconductor elements 30 as switching elements that form a switching circuit. The semiconductor elements 30 are encapsulated by the encapsulation resin 10. Each semiconductor element 30 is formed from a semiconductor material mainly containing silicon carbide (SiC). The semiconductor material is not limited to SiC and may be silicon (Si), gallium arsenide (GaAs), or gallium nitride (GaN). In the present embodiment, the semiconductor element 30 is a metal-oxide-semiconductor field-effect transistor (MOSFET). The semiconductor elements 30 are not limited to MOSFETs and may be field effect transistors including a metal-insulator-semiconductor FET (MISFET), bipolar transistors including an insulated gate bipolar transistor (IGBT), or IC chips such as a large scale integration (LSI). In the present embodiment, the semiconductor elements 30 are identical elements and n-channel MOSFETs. Each semiconductor element 30 is capable of high-speed switching in response to a drive signal having a frequency between 1 kHz and a few hundred kHz, inclusive. Preferably, the semiconductor element 30 is capable of high-speed switching in response to a drive signal having a frequency between 1 kHz and 100 kHz, inclusive. In the present embodiment, the semiconductor element 30 performs high-speed switching in response to a drive signal having a frequency of 100 kHz.

In the present embodiment, the semiconductor elements 30 may be divided into four first semiconductor elements 30U forming the upper arm of the switching circuit and four second semiconductor elements 30L forming the lower arm of the switching circuit. In the present embodiment, the semiconductor device 1A has a structure in which the first semiconductor element 30U and the second semiconductor elements 30L are connected in series to form four switching arms that are connected in parallel. The number of semiconductor elements 30 may be changed in any manner in accordance with required performance of the semiconductor device 1A.

The structure of the semiconductor elements 30 will now be described in detail. The semiconductor elements 30 have the same structure. Thus, the structure of some of the semiconductor elements 30 will be described. The same reference characters are given to the remaining semiconductor elements 30, and the structure of the remaining semiconductor elements 30 will not be described in detail.

As shown in FIG. 2, the semiconductor elements 30 are flat. As shown in FIG. 5, in plan view, the shape of each semiconductor element 30 is a square. In plan view, the shape of the semiconductor element 30 may be changed in any manner. For example, in plan view, the semiconductor element 30 may be rectangular such that the long sides extend in one of the width-wise direction X and the length-wise direction Y and the short sides extend in the other one of the width-wise direction X and the length-wise direction Y.

Figure 10A:
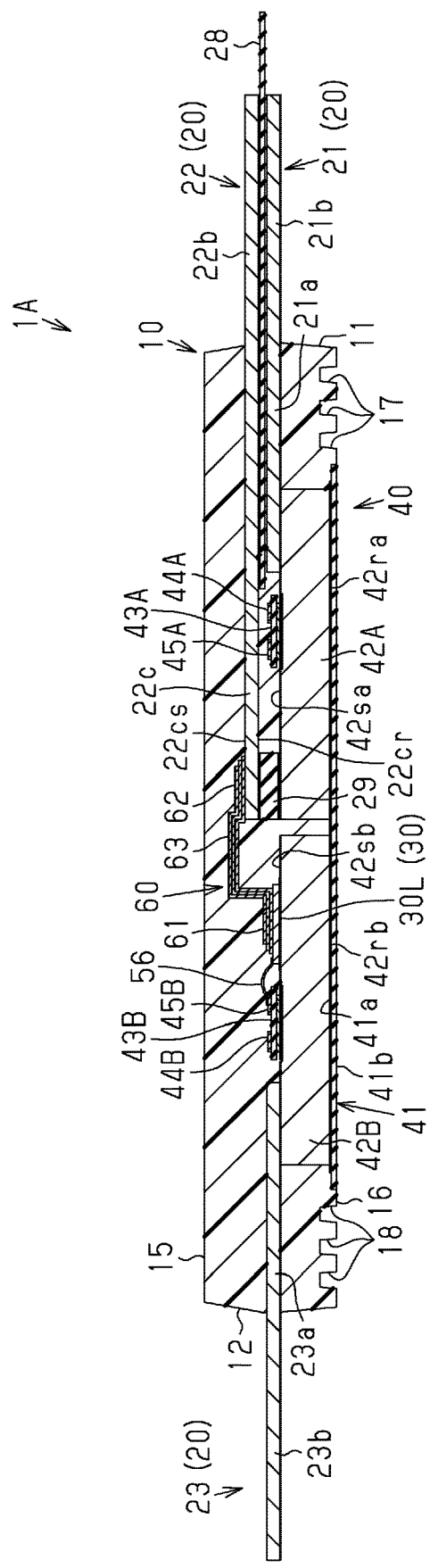
FIG. 10A is a cross-sectional view taken along line 10-10 in FIG. 4.
Figure 10B:
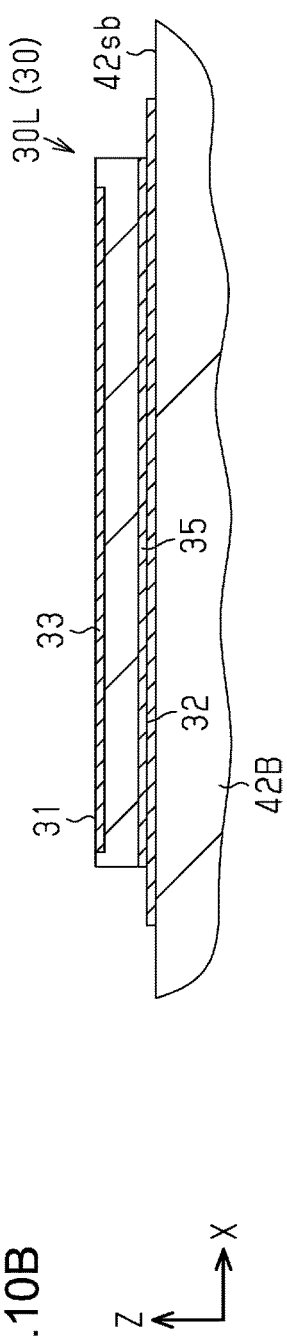
FIG. 10B is an enlarged view of the semiconductor element.

As shown in FIG. 10B, each semiconductor element 30 includes an element main surface 31 and an element back surface 32 that face in opposite directions in the thickness-wise direction Z. As shown in FIGS. 5 and 10B, the element main surface 31 includes a source electrode 33, which serves as a main surface drive electrode (drive electrode), and a gate electrode 34, which serves as a control electrode. The element back surface 32 includes a drain electrode 35, which serves as a back surface drive electrode. Gate voltage is applied to the gate electrode 34 to drive the semiconductor element 30. In the semiconductor element 30, when the gate voltage applied to the gate electrode 34 is greater than or equal to a threshold value, drain current flows to the drain electrode 35, and source current flows to the source electrode 33.

As shown in FIG. 5, in plan view, the region where the source electrode 33 is formed is larger than the region where the gate electrode 34 is formed. The source electrode 33 is formed on a large portion of the element main surface 31. The gate electrode 34 is disposed in a recess 33a formed in the source electrode 33. As shown in FIG. 10, the drain electrode 35 is formed on the entirety of the element back surface 32.

As shown in FIG. 5, an insulation film 36 is disposed on the source electrode 33 and the gate electrode 34. The insulation film 36 is electrically insulative. In plan view, the insulation film 36 extends around the source electrode 33 and the gate electrode 34. The insulation film 36 is obtained, for example, by stacking a $SiO_2$ (silicon dioxide) layer, a $SiN_4$ (silicon nitride) layer, and a polybenzoxazole layer on the element main surface 31 in this order. The insulation film 36 may include a polyimide layer instead of a polybenzoxazole layer.

As shown in FIG. 4, the semiconductor elements 30 are electrically connected to the two input leads 21 and 22, the output lead 23, the two control leads 24A and 24B, and the two detection leads 25A and 25B. In the present embodiment, the semiconductor element 30 is not electrically connected to the dummy leads 26. The input lead 21 is electrically connected to the drain electrode 35 (refer to FIG. 11B) of each first semiconductor element 30U. The input lead 22 is electrically connected to the source electrode 33 (refer to FIG. 5) of each second semiconductor element 30L. The output lead 23 is electrically connected to the source electrode 33 (refer to FIG. 5) of each first semiconductor element 30U and the drain electrode 35 (refer to FIG. 10) of each second semiconductor element 30L. As shown in FIG. 5, the control lead 24A is electrically connected to the gate electrode 34 of each first semiconductor element 30U. The control lead 24B is electrically connected to the gate electrode 34 of each second semiconductor element 30L. The detection lead 25A is electrically connected to the source electrode 33 of each first semiconductor element 30U. The detection lead 25B is electrically connected to the source electrode 33 of each second semiconductor element 30L. The layout of the semiconductor elements 30 and the leads and the detailed structure of each lead will be described below.

As shown in FIG. 4, the semiconductor device 1A includes the support substrate 40. The semiconductor elements 30, the two input leads 21 and 22, the output lead 23, and the two side leads 27A and 27B are mounted on the support substrate 40. The two control leads 24A, the two detection leads 25A and 25B, and the dummy leads 26 are not mounted on the support substrate 40. The two control leads 24A, the two detection leads 25A and 25B, and the dummy leads 26 are disposed adjacent to the support substrate 40 in the length-wise direction Y.

The support substrate 40 includes an insulation substrate 41, two conductive members 42A and 42B, two insulation layers 43A and 43B, two gate layers 44A and 44B, each of which is an example of a control conductor, and two detection layers 45A and 45B. In the support substrate 40, the insulation substrate 41, the two conductive members 42A and 42B, and the two insulation layers 43A and 43B are stacked in this order. The gate layer 44A and the detection layer 45A are stacked on the insulation layer 43A. The gate layer 44B and the detection layer 45B are stacked on the insulation layer 43B.

The insulation substrate 41 is electrically insulative. The insulation substrate 41 is, for example, a ceramic having a superior thermal conductivity. Such a ceramic includes, for example, aluminum nitride (AlN), silicon nitride (SiN), and aluminum oxide ($Al_2O_3$). In the present embodiment, in plan view, the insulation substrate 41 is rectangular such that the long sides extend in the length-wise direction Y and the short sides extend in the width-wise direction X. As shown in FIG. 10, the insulation substrate 41 includes a substrate main surface 41a and a substrate back surface 41b facing in opposite directions in the thickness-wise direction Z. The two conductive members 42A and 42B are disposed on the substrate main surface 41a. The encapsulation resin 10 encapsulates the substrate main surface 41a together with the two conductive members 42A and 42B, the two insulation layers 43A and 43B, the two gate layers 44A and 44B, and the two detection layers 45A and 45B. As shown in FIG. 7, the substrate back surface 41b is exposed from the encapsulation resin 10. Although not illustrated, for example, a heatsink is connected to the substrate back surface 41b. The substrate back surface 41b is disposed between the grooves 17 and the grooves 18 of the encapsulation resin 10 in the width-wise direction X. In this structure, the grooves 17 increase the creepage distance between the substrate back surface 41b and the input leads 21 and 22. The grooves 18 increase the creepage distance between the output lead 23 and the substrate back surface 41b. Thus, the dielectric strength of the semiconductor device 1A is improved. The structure of the insulation substrate 41 is not limited to that described above and may be changed in any manner. In an example, the insulation substrate 41 is divided into two parts in correspondence with the conductive members 42A and 42B.

The two conductive members 42A and 42B are each a metal plate. The material of the metal plate is copper (Cu) or a Cu alloy. The two conductive members 42A and 42B and the leads 20 form conductive paths to the semiconductor elements 30. The two conductive members 42A and 42B are separated from each other in the length-wise direction Y on the substrate main surface 41a of the insulation substrate 41. The two conductive members 42A and 42B are, for example, bonded to the substrate main surface 41a by a bonding material such as silver paste or solder. The bonding material may be a conductive material such as silver paste or solder or may be an insulative material. In the present embodiment, the thickness (dimension in the thickness-wise direction Z) of the two conductive members 42A and 42B is greater than the thickness (dimension in the thickness-wise direction Z) of the insulation substrate 41. Also, the thickness (dimension in the thickness-wise direction Z) of the two conductive members 42A and 42B is greater than the thickness (dimension in the thickness-wise direction Z) of each of the semiconductor elements 30, the input leads 21 and 22, and the output lead 23. The thickness of the two conductive members 42A and 42B is, for example, 0.4 mm to 3.0 mm. The surface of each of the two conductive members 42A and 42B may be covered by silver plating. The two conductive members 42A and 42B are identical in shape. In plan view, each of the two conductive members 42A and 42B is rectangular such that the long sides extend in the length-wise direction Y and the short sides extend in the width-wise direction X.

As shown in FIGS. 4 and 10, the conductive member 42A is disposed closer to the first resin side surface 11 of the encapsulation resin 10 than the conductive member 42B in the width-wise direction X. The conductive member 42A is electrically connected to the four first semiconductor elements 30U, the input lead 21, and the side lead 27A. The conductive member 42A includes a main surface 42sa and a back surface 42ra facing in opposite directions in the thickness-wise direction Z. The main surface 42sa faces in the same direction as the substrate main surface 41a of the insulation substrate 41 in the thickness-wise direction Z. Also, the main surface 42sa faces in the same direction as the element main surfaces 31 of the first semiconductor elements 30U in the thickness-wise direction Z. The four first semiconductor elements 30U and the input lead 21 are disposed on the main surface 42sa. The back surface 42ra faces in the same direction as the substrate back surface 41b of the insulation substrate 41 in the thickness-wise direction Z. The back surface 42ra faces in the same direction as the element back surfaces 32 of the first semiconductor elements 30U in the thickness-wise direction Z. The back surface 42ra is connected to the substrate main surface 41a of the insulation substrate 41 by a bonding material. The four first semiconductor elements 30U are aligned in the width-wise direction X and separated from each other in the length-wise direction Y. The four first semiconductor elements 30U are disposed on a portion of the conductive member 42A located toward the conductive member 42B in the width-wise direction X. The input lead 21 is disposed on an end of the conductive member 42A located close to the first resin side surface 11 of the encapsulation resin 10 in the width-wise direction X at a center of the conductive member 42A in the length-wise direction Y. The side lead 27A is disposed on an end of the conductive member 42A close to the first resin side surface 11 in the width-wise direction X and close to the third resin side surface 13 of the encapsulation resin 10 in the length-wise direction Y.

The conductive member 42B is disposed closer to the second resin side surface 12 of the encapsulation resin 10 than the conductive member 42A in the width-wise direction X. The conductive member 42B is electrically connected to the four second semiconductor elements 30L, the output lead 23, and the side lead 27B. The conductive member 42B includes a main surface 42sb and a back surface 42rb facing in opposite directions in the thickness-wise direction Z. The main surface 42sb faces in the same direction as the substrate main surface 41a of the insulation substrate 41 in the thickness-wise direction Z. The main surface 42sb also faces in the same direction as the element main surfaces 31 of the second semiconductor elements 30L in the thickness-wise direction Z. The back surface 42rb faces in the same direction as the substrate back surface 41b of the insulation substrate 41 in the thickness-wise direction Z. The back surface 42rb faces in the same direction as the element back surfaces 32 of the second semiconductor elements 30L in the thickness-wise direction Z. The four second semiconductor elements 30L and the output lead 23 are disposed on the main surface 42sb. The back surface 42rb is connected to the substrate main surface 41a of the insulation substrate 41 by a bonding material. The four second semiconductor elements 30L are aligned in the width-wise direction X and separated from each other in the length-wise direction Y. The four second semiconductor elements 30L are disposed on a portion of the conductive member 42B located toward the conductive member 42A in the width-wise direction X. As viewed in the width-wise direction X, the four second semiconductor elements 30L and the four first semiconductor elements 30U are disposed so as not to overlap each other. As shown in FIG. 4, the four second semiconductor elements 30L alternate with the four first semiconductor elements 30U in the length-wise direction Y. The output lead 23 is disposed on an end of the conductive member 42B located close to the second resin side surface 12 of the encapsulation resin 10 in the width-wise direction X at a center of the conductive member 42B in the length-wise direction Y. The side lead 27B is disposed on an end of the conductive member 42B located close to the second resin side surface 12 in the width-wise direction X and close to the third resin side surface 13 of the encapsulation resin 10 in the length-wise direction Y.

The two insulation layers 43A and 43B are electrically insulative. The material forming the two insulation layers 43A and 43B is, for example, a glass epoxy resin. The two insulation layers 43A and 43B are separated from each other in the width-wise direction X. In plan view, each of the two insulation layers 43A and 43B is belt-shaped and extends in the length-wise direction Y.

The insulation layer 43A is bonded to the main surface 42sa of the conductive member 42A. The insulation layer 43A overlaps the four first semiconductor elements 30U, the input lead 21, and the side lead 27A as viewed in the width-wise direction X. The insulation layer 43A is disposed closer to the first resin side surface 11 of the encapsulation resin 10 than the four first semiconductor elements 30U in the width-wise direction X. More specifically, the insulation layer 43A is disposed closer to the first resin side surface 11 than the four first semiconductor elements 30U so as to be adjacent to the first semiconductor elements 30U in the width-wise direction X. In addition, the insulation layer 43A is disposed closer to the four first semiconductor elements 30U than the input lead 21 in the width-wise direction X.

The insulation layer 43B is bonded to the main surface 42sb of the conductive member 42B. The insulation layer 43B overlaps the four second semiconductor elements 30L, the output lead 23, and the side lead 27B as viewed in the width-wise direction X. The insulation layer 43B is disposed closer to the second resin side surface 12 of the encapsulation resin 10 than the four second semiconductor elements 30L in the width-wise direction X. More specifically, the insulation layer 43B is disposed closer to the second resin side surface 12 than the four second semiconductor elements 30L so as to be adjacent to the second semiconductor elements 30L in the width-wise direction X. In addition, the insulation layer 43B is disposed closer to the four second semiconductor elements 30L than the output lead 23 in the width-wise direction X.

The two gate layers 44A and 44B are electrically conductive. The material forming the two gate layers 44A and 44B is, for example, Cu. In plan view, each of the two gate layers 44A and 44B is, for example, belt-shaped and extends in the length-wise direction Y.

The gate layer 44A is disposed on the insulation layer 43A. The gate layer 44A is disposed on a portion of the insulation layer 43A located toward the first resin side surface 11 in the width-wise direction X. The gate layer 44A is electrically connected to the gate electrode 34 (refer to FIG. 5) of each first semiconductor element 30U by a first control wire 51, which is an example of a control connection member and will be described later. The gate layer 44A is also electrically connected to the control lead 24A by a first connection wire 53, which will be described later.

The gate layer 44B is disposed on the insulation layer 43B. The gate layer 44B is disposed on a portion of the insulation layer 43B located toward the second resin side surface 12 in the width-wise direction X. The gate layer 44B is electrically connected to the gate electrode 34 (refer to FIG. 5) of each second semiconductor element 30L by a second control wire 52, which is an example of a control connection member and will be described later. The gate layer 44B is also electrically connected to the control lead 24B by a second connection wire 57, which will be described later.

The two detection layers 45A and 45B are electrically conductive. The material forming the two detection layers 45A and 45B is, for example, Cu. In plan view, each of the two detection layers 45A and 45B is, for example, belt-shaped and extends in the length-wise direction Y. In the present embodiment, the two detection layers 45A and 45B are equal to the two gate layers 44A and 44B in the dimension in the width-wise direction X. The two detection layers 45A and 45B are equal to the two gate layers 44A and 44B in the dimension in the length-wise direction Y.

The detection layer 45A is disposed on the insulation layer 43A together with the gate layer 44A. The detection layer 45A is separated from the gate layer 44A and adjacent to the gate layer 44A in the width-wise direction X. In the present embodiment, the detection layer 45A is disposed closer to the four first semiconductor elements 30U than the gate layer 44A in the width-wise direction X. The layout position of the detection layer 45A in the width-wise direction X may be changed in any manner. For example, the detection layer 45A may be disposed closer to the first resin side surface 11 than the gate layer 44A in the width-wise direction X. The detection layer 45A is electrically connected to the source electrode 33 of each first semiconductor element 30U by a first detection wire 55, which will be described later. The detection layer 45A is also electrically connected to the detection lead 25A by a first connection wire 54, which will be described later.

The detection layer 45B is disposed on the insulation layer 43B together with the gate layer 44B. The detection layer 45B is separated from the gate layer 44B and adjacent to the gate layer 44B in the width-wise direction X. In the present embodiment, the detection layer 45B is disposed closer to the four second semiconductor elements 30L than the gate layer 44B in the width-wise direction X. The layout position of the detection layer 45B in the width-wise direction X may be changed in any manner. For example, the detection layer 45B may be disposed closer to the output lead 23 than the gate layer 44B in the width-wise direction X. The detection layer 45B is electrically connected to the source electrode 33 of each first semiconductor element 30U by a second detection wire 56, which will be described later. The detection layer 45B is also electrically connected to the detection lead 25B by a second connection wire 58, which will be described later.

As shown in FIG. 10, each of the input leads 21 and 22 is a metal plate. The material of the metal plate is, for example, Cu or a Cu alloy. In the present embodiment, the thickness (the dimension in the thickness-wise direction Z) of the input leads 21 and 22 is 0.8 mm but is not limited to 0.8 mm. The input leads 21 and 22 are disposed toward the first resin side surface 11 of the encapsulation resin 10. For example, a power supply voltage is applied to the input leads 21 and 22. In the present embodiment, a first power supply voltage is applied to the input lead 21, and a second power supply voltage that is lower than the first power supply voltage is applied to the input lead 22. Thus, the input lead 21 is a positive electrode (P terminal), and the input lead 22 is a negative electrode (N terminal). The input lead 21 and the input lead 22 overlap each other in the thickness-wise direction Z. The input lead 21 and the input lead 22 are separated from each other in the thickness-wise direction Z.

As shown in FIG. 4, the input lead 21 is flat and extends in the width-wise direction X. The input lead 21 includes a pad part 21a and a terminal part 21b. In the present embodiment, the pad part 21a and the terminal part 21b are integrally formed to be a single member.

The pad part 21a is part of the input lead 21 covered by the encapsulation resin 10. The end of the pad part 21a located close to the second resin side surface 12 of the encapsulation resin 10 includes comb teeth 21c. The comb teeth 21c are bonded and electrically connected to the main surface 42sa of the conductive member 42A. The bonding process may be laser beam welding that uses laser beams, ultrasonic bonding, or bonding that uses a conductive bonding material. In the present embodiment, each of the comb teeth 21c is located on an end of the main surface 42sa of the conductive member 42A located close to the first resin side surface 11 of the encapsulation resin 10 at a center of the main surface 42sa in the length-wise direction Y. Through holes (not shown) extend through portions of the pad part 21a located toward the first resin side surface 11 of the encapsulation resin 10. Each through hole extends through the pad part 21a in the thickness-wise direction Z. The through hole receives a portion of the encapsulation resin 10. This resists separation of the encapsulation resin 10 from the input lead 21.

The terminal part 21b is part of the input lead 21 projecting from the first resin side surface 11 of the encapsulation resin 10. In plan view, the terminal part 21b is rectangular such that the long sides extend in the width-wise direction X and the short sides extend in the length-wise direction Y.

The input lead 22 includes a pad part 22a and a terminal part 22b. In the present embodiment, the pad part 22a and the terminal part 22b are integrally formed to be a single member.

The pad part 22a is part of the input lead 22 covered by the encapsulation resin 10. The pad part 22a may be divided into (in the present embodiment, four) extensions 22c, each of which is an example of a drive conductor, a joint portion 22d that joins the extensions 22c, and an intermediate portion 22e located between the joint portion 22d and the terminal part 22b. The extensions 22c and the joint portion 22d are disposed toward the fourth resin side surface 14 of the encapsulation resin 10 in the length-wise direction Y.

As shown in FIGS. 4 and 10A, the extensions 22c are provided in correspondence with the number of the second semiconductor elements 30L. The extensions 22c are separated from each other in the length-wise direction Y. In plan view, the extensions 22c are belt-shaped and extend in the width-wise direction X. Each extension 22c includes a main surface 22cs and a back surface 22cr. The main surface 22cs faces in the same direction as the element main surfaces 31 of the semiconductor elements 30 in the thickness-wise direction Z and is an example of a drive connection surface. The back surface 22cr faces in the same direction as the element back surfaces 32 of the semiconductor elements 30 in the thickness-wise direction Z. The distal portion of each extension 22c is supported by a support table 29. In the present embodiment, the support tables 29 are provided in correspondence with the number of extensions 22c. The support tables 29 are disposed on an end of the conductive member 42A located close to the conductive member 42B in the width-wise direction X. The support tables 29 are separated from each other in the length-wise direction Y. The support tables 29 are, for example, electrically insulative. The material forming the support table 29 is, for example, a ceramic. The support tables 29 are bonded to the main surface 42sa of the conductive member 42A. The support tables 29 are also bonded to the back surfaces 22cr of the extensions 22c. The support tables 29 are aligned with each other in the width-wise direction X and separated from each other in the length-wise direction Y. The thickness (dimension in the thickness-wise direction Z) of each support table 29 is substantially equal to the sum of the thickness (dimension in the thickness-wise direction Z) of the input lead 21 and the thickness (dimension in the thickness-wise direction Z) of an insulation member 28. The distal portion of each extension 22c is bonded to the corresponding one of the support tables 29. Thus, the support tables 29 stabilize the position of the input lead 22.

In plan view, the extensions 22c are aligned with the second semiconductor elements 30L in the length-wise direction Y. In other words, as viewed in the width-wise direction X, the extensions 22c overlap the second semiconductor elements 30L. In addition, the distal edge of each extension 22c is separated from the second semiconductor element 30L in the width-wise direction X.

The joint portion 22d is joined to an end of each extension 22c located close to the first resin side surface 11 in the width-wise direction X. In plan view, the joint portion 22d is rectangular such that the long sides extend in the length-wise direction Y and the short sides extend in the width-wise direction X. The intermediate portion 22e is continuous with an end of the joint portion 22d located close to the first resin side surface 11 in the width-wise direction X at a center of the joint portion 22d in the length-wise direction Y. In plan view, the intermediate portion 22e is rectangular such that the long sides extend in the width-wise direction X and the short sides extend in the length-wise direction Y. The intermediate portion 22e has through holes 22f. The through holes 22f extend through the intermediate portion 22e in the thickness-wise direction Z. Each through hole 22f receives a portion of the encapsulation resin 10. This resists separation of the encapsulation resin 10 from the input lead 22.

The terminal part 22b is part of the input lead 22 projecting from the first resin side surface 11 of the encapsulation resin 10. In plan view, the terminal part 22b is rectangular such that the long sides extend in the width-wise direction X and the short sides extend in the length-wise direction Y. In plan view, the terminal part 22b is the same size as the terminal part 21b.

The insulation member 28 is disposed between the input lead 21 and the input lead 22 in the thickness-wise direction Z to electrically insulate the input lead 21 from the input lead 22. The input lead 21 and the input lead 22 are, for example, bonded to the insulation member 28 by a bonding material. The bonding material may be a conductive material or may be an insulative material. The material forming the insulation member 28 is, for example, insulation paper. In plan view, the insulation member 28 is rectangular such that the long sides extend in the width-wise direction X and the short sides extend in the length-wise direction Y. In the thickness-wise direction Z, the insulation member 28 overlaps with the pad part 21a and the terminal part 21b of the input lead 21. In the thickness-wise direction Z, the insulation member 28 overlaps with the joint portion 22d, the intermediate portion 22e, and the terminal part 22b of the input lead 22. Thus, the insulation member 28 is partially covered by the encapsulation resin 10. The insulation member 28 is greater than the terminal parts 21b and 22b of the input leads 21 and 22 in the dimension in the length-wise direction Y. As shown in FIG. 4, in plan view, the insulation member 28 projects from opposite sides of the terminal parts 21b and 22b in the length-wise direction Y. The insulation member 28 also projects from the distal ends of the terminal parts 21b and 22b in the width-wise direction X.

The output lead 23 is a metal plate. The material of the metal plate is, for example, Cu or a Cu alloy. The output lead 23 is disposed toward the second resin side surface 12 of the encapsulation resin 10. The semiconductor elements 30 convert power into alternating current power (voltage). The alternating current power is output from the output lead 23.

The output lead 23 is flat and extends in the width-wise direction X. The output lead 23 and the input lead 21 are identical in shape. The output lead 23 includes a pad part 23a and a terminal part 23b. In the present embodiment, the pad part 23a and the terminal part 23b are integrally formed to be a single member.

The pad part 23a is part of the output lead 23 covered by the encapsulation resin 10. The end of the pad part 23a located close to the first resin side surface 11 of the encapsulation resin 10 includes comb teeth 23c. The comb teeth 23c are bonded and electrically connected to the main surface 42sb of the conductive member 42B, which will be described later. The bonding process may be laser beam welding that uses laser beams, ultrasonic bonding, or bonding that uses a conductive bonding material. Through holes 23d extend through portions of the pad part 23a located toward the second resin side surface 12 of the encapsulation resin 10. Each through hole 23d extends through the pad part 23a in the thickness-wise direction Z. Each through hole 23d receives a portion of the encapsulation resin 10. This resists separation of the encapsulation resin 10 from the output lead 23.

The terminal part 23b is part of the output lead 23 projecting from the second resin side surface 12 of the encapsulation resin 10. In plan view, the terminal part 23b is rectangular such that the long sides extend in the width-wise direction X and the short sides extend in the length-wise direction Y. The terminal part 23b extends in a direction away from the terminal part 23b of the input lead 21.

As shown in FIG. 5, in plan view, the two control leads 24A and 24B, the two detection leads 25A and 25B, and the dummy leads 26 are arranged in the width-wise direction X. More specifically, in plan view, the control lead 24A, the detection lead 25A, and three of the dummy leads 26 are disposed adjacent to the conductive member 42A of the support substrate 40 in the length-wise direction Y. In plan view, the control lead 24B, the detection lead 25B, and the other three of the dummy leads 26 are disposed adjacent to the conductive member 42B of the support substrate 40 in the length-wise direction Y. The control lead 24A, the detection lead 25A, the three dummy leads 26 form one lead group. The control lead 24B, the detection lead 25B, and the other three dummy leads 26 form another lead group. The distance between the two lead groups in the width-wise direction X is greater than a distance between two leads that are adjacent in the width-wise direction X in each of the group of the control lead 24A, the detection lead 25A, and the three dummy leads 26 and the group of the control lead 24B, the detection lead 25B, and the other three dummy leads 26. In the present embodiment, the two control leads 24A and 24B, the two detection leads 25A and 25B, and the dummy leads 26 are formed from the same lead frame.

In plan view, the control lead 24A is disposed closer to the first semiconductor elements 30U than the gate layer 44A and the detection layer 45A in the width-wise direction X. As viewed in the length-wise direction Y, the control lead 24A overlaps with the first semiconductor elements 30U. Gate voltage is applied to the control lead 24A to drive the first semiconductor elements 30U. The control lead 24B is disposed closer to the second semiconductor elements 30L than the gate layer 44B and the detection layer 45B in the width-wise direction X. As viewed in the length-wise direction Y, the control lead 24B overlaps with the second semiconductor elements 30L. Gate voltage is applied to the control lead 24B to drive the second semiconductor elements 30L.

Each of the two control leads 24A and 24B includes a pad part 24a and a terminal part 24b. The two control leads 24A and 24B are identical in shape. In the present embodiment, in each of the two control leads 24A and 24B, the pad part 24a and the terminal part 24b are integrally formed to be a single member.

The pad part 24a is part of the two control leads 24A and 24B covered by the encapsulation resin 10. Thus, the two control leads 24A and 24B are supported by the encapsulation resin 10. The surface of the pad part 24a may be plated with, for example, silver. The pad part 24a has a through hole 24c. The through hole 24c extends through the pad part 24a in the thickness-wise direction Z. The through hole 24c receives a portion of the encapsulation resin 10. This resists separation of the encapsulation resin 10 from the two control leads 24A and 24B. The terminal part 24b is part of the two control leads 24A and 24B projecting from the encapsulation resin 10. The terminal part 24b is L-shaped as viewed in the width-wise direction X (refer to FIGS. 1 and 2).

The control lead 24A and the gate layer 44A are connected by the first connection wire 53. More specifically, the first connection wire 53 has an end configured to be connected to the gate layer 44A, and the end is connected to an end of the gate layer 44A located close to the control lead 24A in the length-wise direction Y. The first connection wire 53 has another end configured to be connected to the control lead 24A, and the end is connected to the pad part 24a of the control lead 24A.

The control lead 24B and the gate layer 44B are connected by the second connection wire 57. More specifically, the second connection wire 57 has an end configured to be connected to the gate layer 44B, and the end is connected to an end of the gate layer 44B located close to the control lead 24B in the length-wise direction Y. The second connection wire 57 has another end configured to be connected to the control lead 24B, and the end is connected to the pad part 24a of the control lead 24B.

The detection lead 25A is disposed adjacent to the control lead 24A in the width-wise direction X. In plan view, the detection lead 25A is disposed closer to the first semiconductor elements 30U than the detection layer 45A in the width-wise direction X. Also, as viewed in the length-wise direction Y, the detection lead 25A overlaps a portion of each first semiconductor element 30U located close to the insulation layer 43A in the width-wise direction X. Voltage applied to the source electrodes 33 of the first semiconductor elements 30U (voltage corresponding to source current) is detected via the detection lead 25A. The detection lead 25B is disposed adjacent to the control lead 24B in the width-wise direction X. The detection lead 25B is disposed closer to the second semiconductor elements 30L than the detection layer 45B in the width-wise direction X. Also, as viewed in the length-wise direction Y, the detection lead 25B overlaps a portion of each second semiconductor element 30L located close to the insulation layer 43B in the width-wise direction X. Voltage applied to the source electrodes 33 of the second semiconductor elements 30L (voltage corresponding to source current) is detected via the detection lead 25B.

Each of the two detection leads 25A and 25B includes a pad part 25a and a terminal part 25b. The two detection leads 25A and 25B are identical in shape to each other and the two control leads 24A and 24B. In the present embodiment, the pad part 25a and the terminal part 25b are integrally formed to be a single member.

The pad part 25a is part of the two detection leads 25A and 25B covered by the encapsulation resin 10. Thus, the two detection leads 25A and 25B are supported by the encapsulation resin 10. The surface of the pad part 25a may be plated with, for example, silver. The pad part 25a has a through hole 25c. The through hole 25c extends through the pad part 25a in the thickness-wise direction Z. The through hole 25c receives a portion of the encapsulation resin 10. This resists separation of the encapsulation resin 10 from the two detection leads 25A and 25B. The terminal part 25b is part of the two detection leads 25A and 25B projecting from the encapsulation resin 10. In the same manner as the terminal part 24b, the terminal part 25b is L-shaped as viewed in the width-wise direction X (refer to FIGS. 1 and 2).

The detection lead 25A and the detection layer 45A are connected by the first connection wire 54. More specifically, the first connection wire 54 has an end configured to be connected to the detection layer 45A, and the end is connected to an end of the detection layer 45A located close to the detection lead 25A in the length-wise direction Y. The first connection wire 54 has an end configured to be connected to the detection lead 25A, and the end is connected to the pad part 25a of the detection lead 25A.

The detection lead 25B and the detection layer 45B are connected by the second connection wire 58. More specifically, the second connection wire 58 has an end configured to be connected to the detection layer 45B, and the end is connected to an end of the detection layer 45B located close to the detection lead 25B in the length-wise direction Y. The second connection wire 58 has an end configured to be connected to the detection lead 25B, and the end is connected to the pad part 25a of the detection lead 25B.

As shown in FIG. 5, the three dummy leads 26 are disposed adjacent to the control lead 24A at a side opposite from the detection lead 25A in the width-wise direction X. The three dummy leads 26 are separated from each other in the width-wise direction X. Of the three dummy leads 26, the two dummy leads 26 located closer to the control lead 24A overlap the insulation layer 43 as viewed in the length-wise direction Y. The remaining dummy lead 26 is disposed closer to the first resin side surface 11 (refer to FIG. 4) of the encapsulation resin 10 than the insulation layer 43A in the width-wise direction X.

The other three dummy leads 26 are disposed adjacent to the control lead 24B at a side opposite from the detection lead 25B in the width-wise direction X. The three dummy leads 26 are separated from each other in the width-wise direction X. Of the three dummy leads 26, the two dummy leads 26 located closer to the control lead 24B overlap the insulation layer 43B as viewed in the length-wise direction Y. The remaining dummy lead 26 is disposed closer to the second resin side surface 12 (refer to FIG. 4) of the encapsulation resin 10 than the insulation layer 43B in the width-wise direction X.

Each dummy lead 26 includes a pad part 26a and a terminal part 26b. The dummy leads 26 are identical in shape to each other and the two control leads 24A and 24B. In the present embodiment, the pad part 26a and the terminal part 26b are integrally formed to be a single member.

The pad part 26a is part of the dummy lead 26 covered by the encapsulation resin 10. Thus, the dummy leads 26 are supported by the encapsulation resin 10. The surface of the pad part 26a may be plated with, for example, silver. The pad part 26a has a through hole 26c. The through hole 26c extends through the pad part 26a in the thickness-wise direction Z. The through hole 26c receives a portion of the encapsulation resin 10. This resists separation of the encapsulation resin 10 from the dummy leads 26. The terminal part 26b is part of each dummy lead 26 projecting from the encapsulation resin 10. In the same manner as the terminal part 24b, the terminal part 26b is L-shaped as viewed in the width-wise direction X (refer to FIGS. 1 and 2). In the present embodiment, the six dummy leads 26 are not connected to the conductive members 42A and 42B, the gate layers 44A and 44B, and the detection layers 45A and 45B by wires or the like. At least one of the six dummy leads 26 may be omitted.

The structure for connecting the first semiconductor elements 30U to the input lead 22 and the structure for connecting the second semiconductor elements 30L to the conductive member 42B will now be described.

As shown in FIG. 4, the semiconductor device 1A includes first drive leads 60 connecting the second semiconductor elements 30L to the input lead 22 and second drive leads 70 connecting the first semiconductor elements 30U to the conductive member 42B. The first drive leads 60 and the second drive leads 70 are an example of drive connection members. Each of the first drive leads 60 is an example of a second drive connection member connected to the drive electrode of the second semiconductor element. Each of the second drive leads 70 is an example of a first drive connection member connected to the drive electrode of the first semiconductor element. The first drive leads 60 and the second drive leads 70 are encapsulated by the encapsulation resin 10. The first drive leads 60 are provided in correspondence with the number of second semiconductor elements 30L. In the present embodiment, the number of second semiconductor elements 30L is four. Hence, the semiconductor device 1A includes four first drive leads 60. The second drive leads 70 are provided in correspondence with the number of first semiconductor elements 30U. In the present embodiment, the number of first semiconductor elements 30U is four. Hence, the semiconductor device 1A includes four second drive leads 70.

Figure 12:
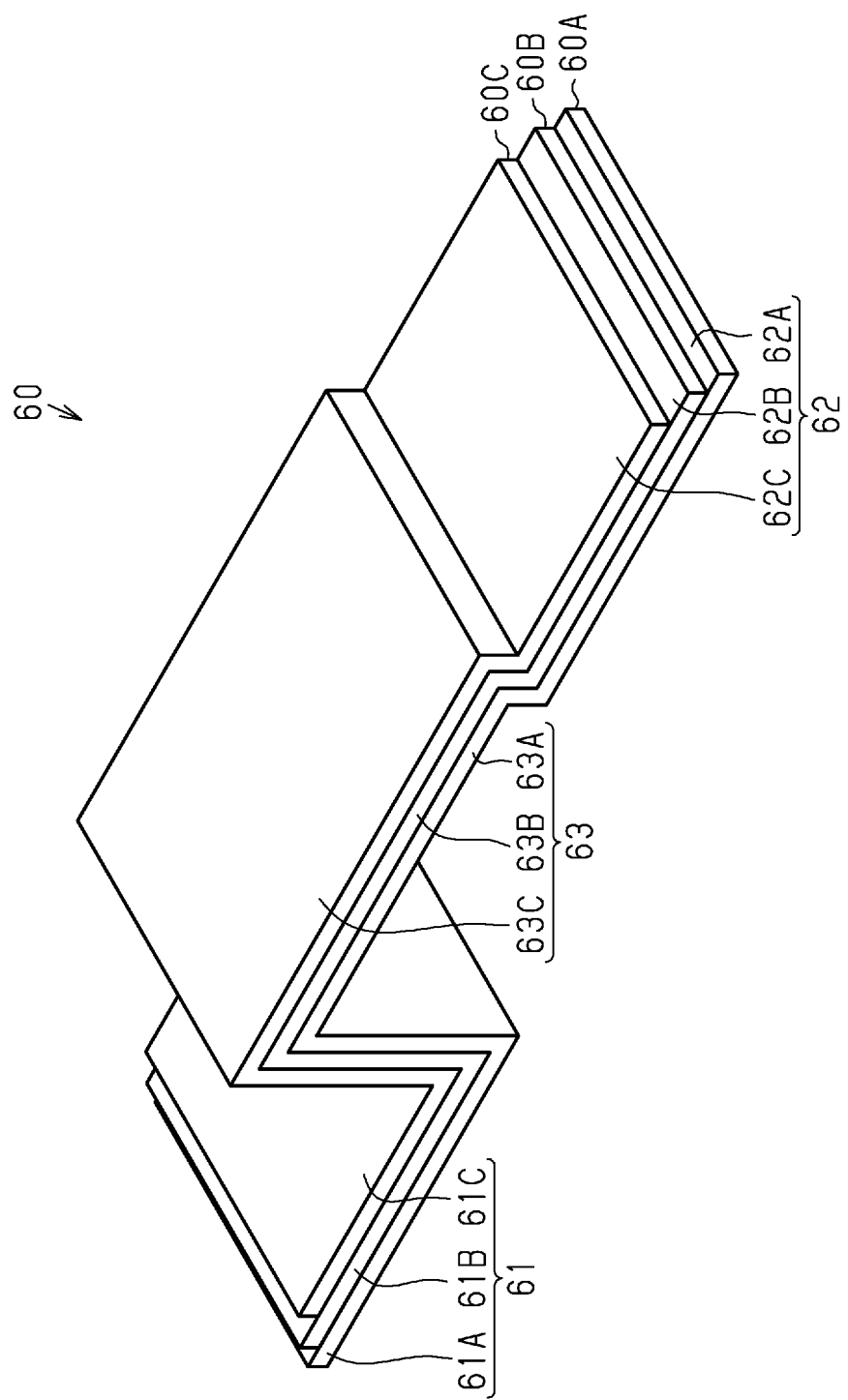
FIG. 12 is a perspective view of first drive leads in the semiconductor device shown in FIG. 1.
Figure 13:
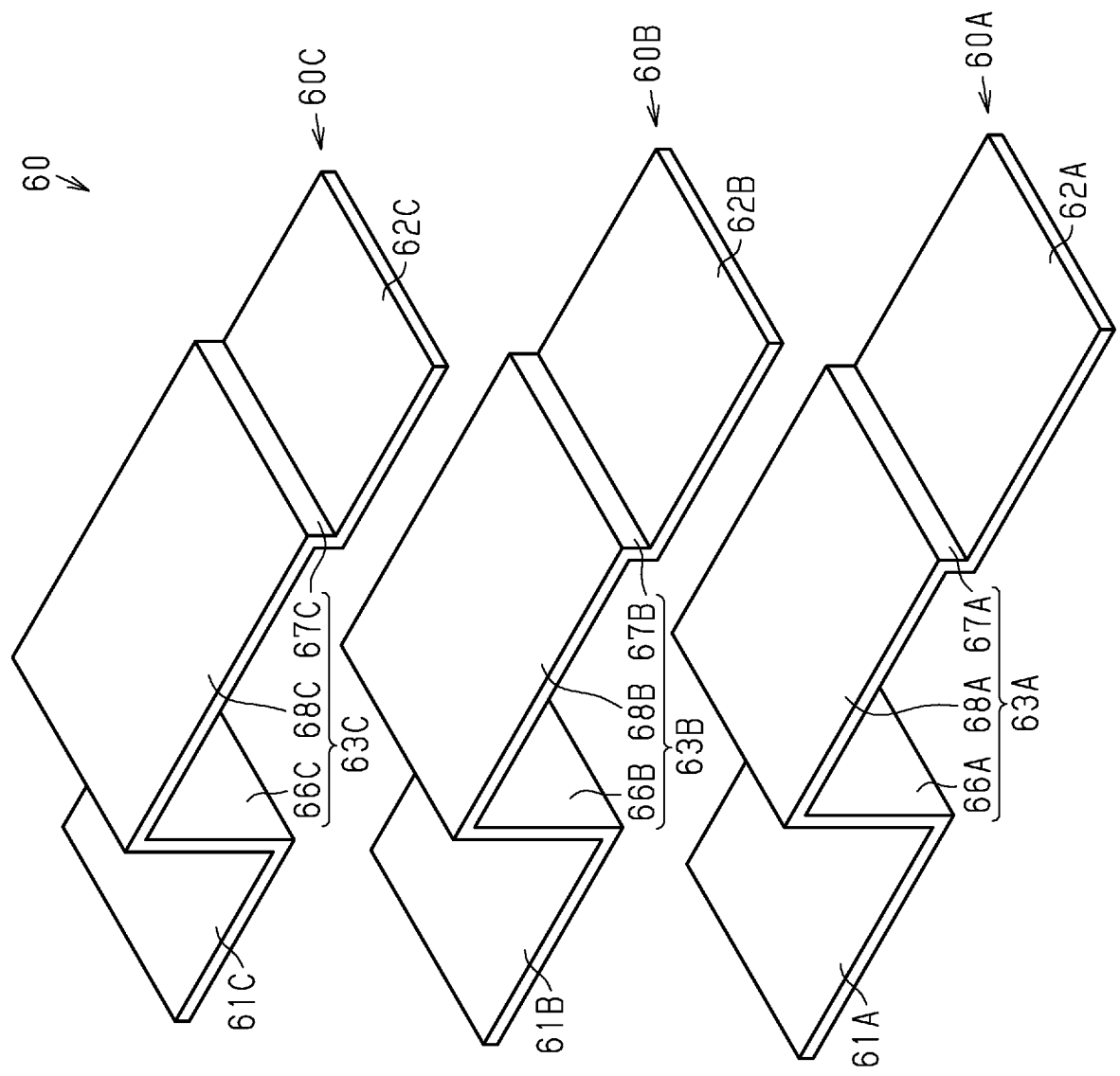
FIG. 13 is an exploded perspective view of the first drive leads shown in FIG. 12.

As shown in FIG. 5, the first drive lead 60 is bonded to the source electrode 33 of the second semiconductor element 30L and the extension 22c of the input lead 22. That is, the first drive lead 60 connects the source electrode 33 of the second semiconductor element 30L and the input lead 22. In plan view, the first drive lead 60 is belt-shaped and extends in the width-wise direction X. The first drive lead 60 has a structure obtained by stacking thin metal plates in the thickness-wise direction Z. In the present embodiment, as shown in FIGS. 5, 12, and 13, the first drive lead 60 is obtained by stacking three thin metal plates, namely, metal plates 60A, 60B, and 60C, in this order in the thickness-wise direction Z. The metal plates 60A, 60B, and 60C are formed from the same metal material. An example of the material forming the metal plates 60A, 60B, and 60C is Cu (copper). The number of metal plates forming the first drive lead 60 may be changed in any manner. In an example, the number of metal plates forming the first drive lead 60 is set in accordance with the allowable current amount of the second semiconductor element 30L. The thickness (the dimension in the thickness-wise direction Z) of each of the metal plates 60A, 60B, and 60C is 0.05 mm to 0.2 mm. In the present embodiment, metal plates having the thickness of 0.05 mm are used for the metal plates 60A, 60B, and 60C.

As shown in FIG. 5, the first drive lead 60 includes a first connector 61 bonded to the source electrode 33 of the second semiconductor element 30L, a second connector 62 bonded to the main surface 22cs of the extension 22c of the input lead 22, and a joint 63 joining the first connector 61 to the second connector 62. Since the metal plates 60A to 60C are stacked to form the first drive lead 60, each of the metal plates 60A to 60C includes the first connector 61, the second connector 62, and the joint 63. To distinguish between the metal plates 60A to 60C, the first connector 61, the second connector 62, and the joint 63 are provided with a suffix of respective Roman letters A to C. In the present embodiment, as shown in FIGS. 12 and 13, the metal plate 60A is a single member in which the first connector 61A, the second connector 62A, and the joint 63A are integrally formed. The metal plate 60B is a single member in which the first connector 61B, the second connector 62B, and the joint 63B are integrally formed. The metal plate 60C is a single member in which the first connector 61C, the second connector 62C, and the joint 63C are integrally formed. The joint 63A is an example of a first joint. The joint 63B is an example of a second joint. The joint 63C is an example of a third joint. The first connector 61 is formed by stacking the first connector 61A, the first connector 61B, and the first connector 61C in this order in the thickness-wise direction Z. The second connector 62 is formed by stacking the second connector 62A, the second connector 62B, and the second connector 62C in this order in the thickness-wise direction Z.

Figure 14:
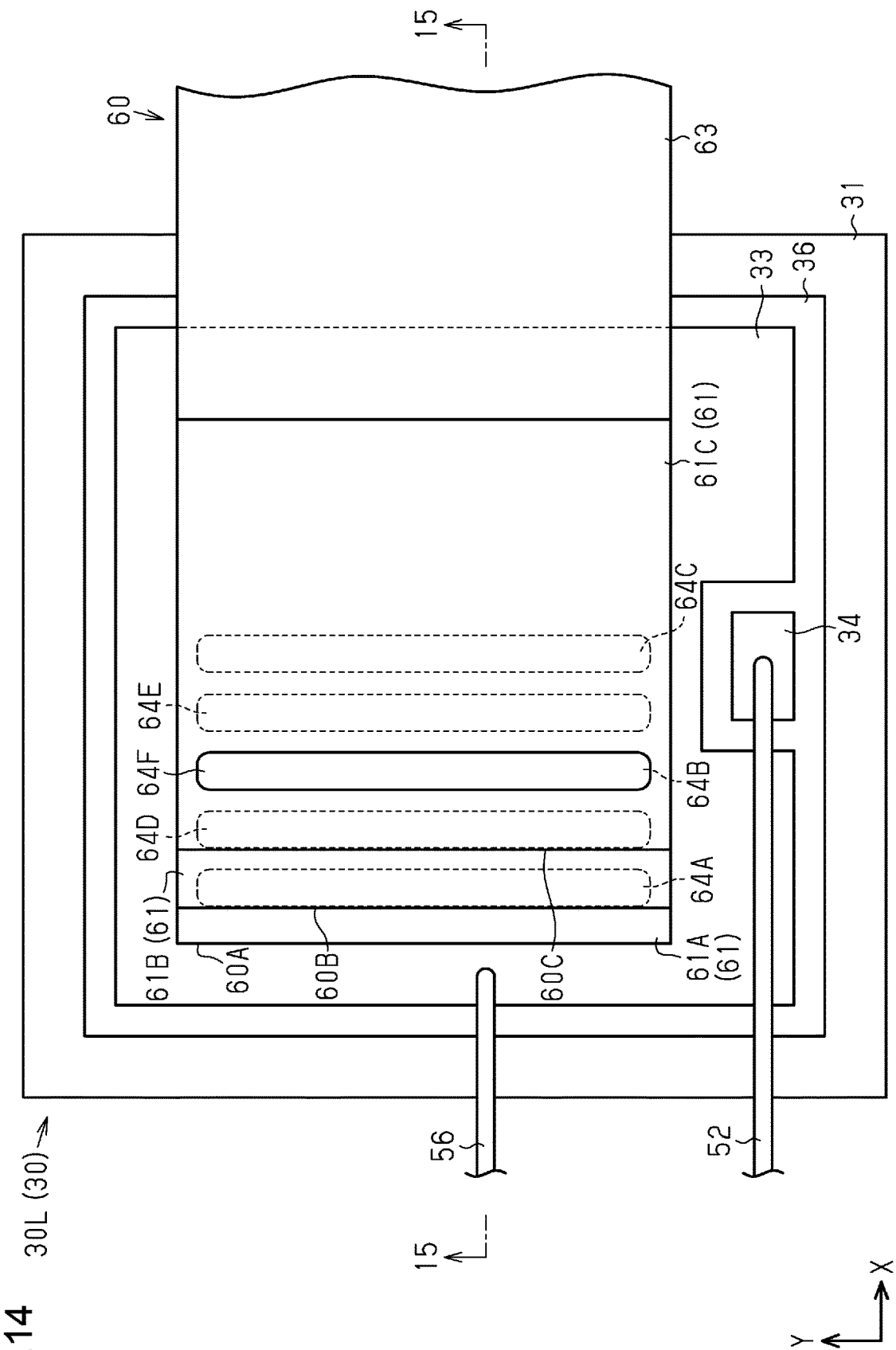
FIG. 14 is a plan view showing a structure that joins the first drive leads to the semiconductor element.
Figure 15:
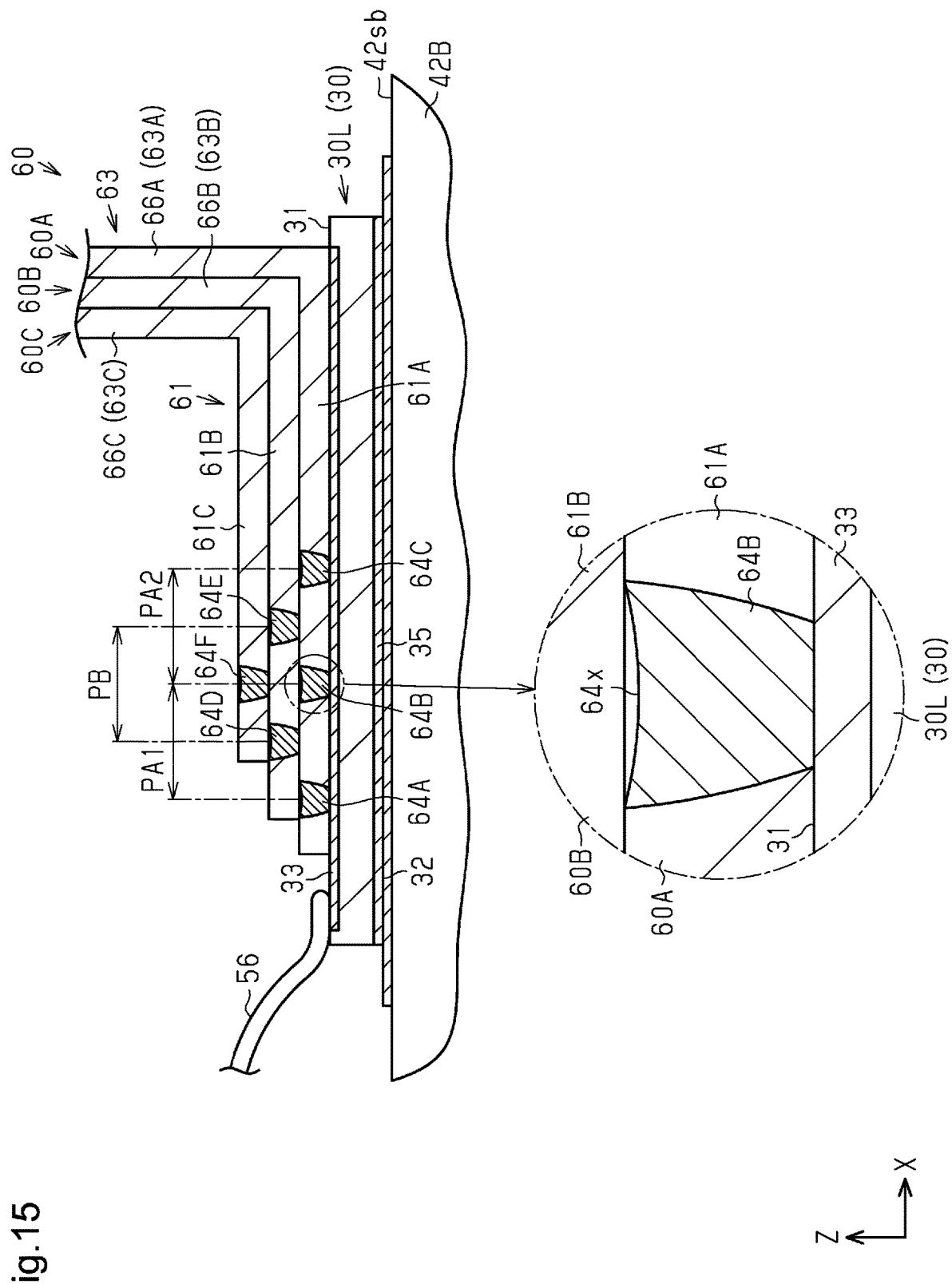
FIG. 15 is a cross-sectional view taken along line 15-15 in FIG. 14.

As shown in FIGS. 14 and 15, the first connector 61A of the metal plate 60A is bonded to the source electrode 33 of the second semiconductor element 30L. The metal plate 60A is an example of a first metal plate connected to the semiconductor element. The first connector 61A is an example of a first element-side connector of the first metal plate. The entire surface of the first connector 61A is in contact with the source electrode 33. In plan view, the first connector 61A is rectangular such that the long sides extend in the width-wise direction X and the short sides extend in the length-wise direction Y. The first connector 61A is bonded to a large portion of the source electrode 33. In an example, in plan view, the first connector 61A is bonded to the source electrode 33 in a range of area that is 50% or greater and less than 100% of the area of the source electrode 33. Preferably, in plan view, the first connector 61A is bonded to the source electrode 33 in a range of area that is 60% or greater and less than 100% of the area of the source electrode 33. In the present embodiment, in plan view, the first connector 61A is bonded to the source electrode 33 in a range of area that is 60% or greater and less than 70% of the area of the source electrode 33.

The area of the source electrode 33 bonded to the first connector 61A may be changed in any manner. In an example, in plan view, the first connector 61A is bonded to the source electrode 33 in a range of area that is 70% or greater and less than 100% of the area of the source electrode 33. In an example, in plan view, the first connector 61A is bonded to the source electrode 33 that is in a range of area that is 80% or greater and less than 100% of the area of the source electrode 33.

As shown in FIGS. 14 and 15, the first connector 61B of the metal plate 60B is stacked on the first connector 61A in the thickness-wise direction Z. The metal plate 60B is an example of a second metal plate connected to the first metal plate. The first connector 61B is an example of a second element-side connector of the second metal plate. Almost the entire surface of the first connector 61B is in contact with the first connector 61A. In plan view, the first connector 61B is rectangular such that the long sides extend in the width-wise direction X and the short sides extend in the length-wise direction Y. The distal edge of the first connector 61B is spaced from the distal edge of the first connector 61A in the width-wise direction X. More specifically, the distal edge of the first connector 61B is disposed closer to the extension 22c of the input lead 22 than the distal edge of the first connector 61A in the width-wise direction X. Thus, in plan view, the first connector 61B is less than the first connector 61A in the dimension in the width-wise direction X. In plan view, the first connector 61B is equal to the first connector 61A in the dimension in the length-wise direction Y (width). The first connector 61B is equal to the first connector 61A in thickness (dimension in the thickness-wise direction Z). When a difference in the dimension in the length-wise direction Y between the first connector 61B and the first connector 61A is within, for example, 5% of the dimension of the first connector 61A in the length-wise direction Y, it is considered that the first connector 61B is equal to the first connector 61A in the dimension in the length-wise direction Y. Also, when a difference in thickness between the first connector 61B and the first connector 61A is within, for example, 5% of the thickness of the first connector 61A, it is considered that the first connector 61B is equal to the first connector 61A in thickness. The distal edge of the first connector 61B may be aligned with the distal edge of the first connector 61A in the width-wise direction X.

The first connector 61C of the metal plate 60C is stacked on the first connector 61B in the thickness-wise direction Z. The metal plate 60C is an example of a third metal plate stacked on the second metal plate. The first connector 61C is an example of a third element-side connector of the third metal plate. The almost entire surface of the first connector 61C is in contact with the first connector 61B. In plan view, the first connector 61C is rectangular such that the long sides extend in the width-wise direction X and the short sides extend in the length-wise direction Y. The distal edge of the first connector 61C is spaced from the distal edge of the first connector 61B in the width-wise direction X. More specifically, the distal edge of the first connector 61C is disposed closer to the extension 22c of the input lead 22 than the distal edge of the first connector 61B in the width-wise direction X. Thus, in plan view, the first connector 61C is less than the first connector 61B in the dimension in the width-wise direction X. In the present embodiment, the distal edge of the first connector 61C is spaced from the distal edge of the first connector 61B by a greater amount than the distal edge of the first connector 61B is spaced from the distal edge of the first connector 61A. In plan view, the first connector 61B is equal to the first connector 61B in the dimension in the length-wise direction Y (width). The first connector 61C is equal to the first connector 61B in thickness (dimension in the thickness-wise direction Z). When a difference in the dimension in the length-wise direction Y between the first connector 61C and the first connector 61B is within, for example, 5% of the dimension of the first connector 61B in the length-wise direction Y, it is considered that the first connector 61C is equal to the first connector 61B in the dimension in the length-wise direction Y. Also, when a difference in thickness between the first connector 61C and the first connector 61B is within, for example, 5% of the thickness of the first connector 61B, it is considered that the first connector 61C is equal to the first connector 61B in thickness. The distal edge of the first connector 61C may be aligned with the distal edge of the first connector 61B in the width-wise direction X.

The first connector 61A is bonded to the source electrode 33 by laser beam welding, which is an example of laser beam processing that uses laser beams. The first connector 61B is bonded to the first connector 61A by laser beam welding. The first connector 61C is bonded to the first connector 61B by laser beam welding.

More specifically, three laser bonding portions 64A, 64B, and 64C are formed in the first connector 61A. The laser bonding portions 64A, 64B, and 64C are bonded to the source electrode 33 of the second semiconductor element 30L. Each of the laser bonding portions 64A, 64B, and 64C is an example of a first element bonding portion of the first element-side connector. The laser bonding portions 64A, 64B, and 64C are separated from each other in the width-wise direction X and formed in the first connector 61A. In plan view, the laser bonding portions 64A, 64B, and 64C extend in the length-wise direction Y. In the present embodiment, the laser bonding portions 64A, 64B, and 64C are equal to each other in the dimension in the length-wise direction Y. When the largest difference in the dimension in the length-wise direction Y between the laser bonding portion 64A, the laser bonding portion 64B, and the laser bonding portion 64C is within, for example, 5% of the dimension of the laser bonding portion 64A in the length-wise direction Y, it is considered that the laser bonding portions 64A, 64B, and 64C are equal to each other in the dimension in the length-wise direction Y.

The laser bonding portion 64A is disposed closer to the distal end of the first connector 61A than the laser bonding portions 64B and 64C. In an example, the laser bonding portion 64A is formed in a portion of the first connector 61A overlapping a distal portion of the first connector 61B as viewed in the thickness-wise direction Z. More specifically, the laser bonding portion 64A is formed in a portion of the first connector 61A adjacent to the distal edge of the first connector 61B in the width-wise direction X. The laser bonding portion 64B is disposed closer to the basal end of the first connector 61A than the laser bonding portion 64A and closer to the distal end of the first connector 61A than the laser bonding portion 64C. The laser bonding portion 64C is formed in a central portion of the first connector 61A in the width-wise direction X. As shown in FIG. 15, in the present embodiment, a pitch PA1 between the laser bonding portion 64A and the laser bonding portion 64B is equal to a pitch PA2 between the laser bonding portion 64B and the laser bonding portion 64C. When a difference between the pitch PA1 and the pitch PA2 is within, for example, 5% of the pitch PA1, it is considered that the pitch PA1 is equal to the pitch PA2. The pitches PA1 and PA2 may be changed in any manner. In an example, the pitch PA2 may be larger than the pitch PA1.

As shown in FIGS. 14 and 15, two laser bonding portions 64D and 64E are formed in the first connector 61B. The laser bonding portions 64D and 64E are bonded to the first connector 61A. Each of the laser bonding portions 64D and 64E is an example of a second element bonding portion of the second element-side connector. The laser bonding portions 64D and 64E are separated from each other in the width-wise direction X and formed in the first connector 61B. In plan view, the laser bonding portions 64D and 64E extend in the length-wise direction Y. In the present embodiment, the laser bonding portions 64D and 64E are equal to each other in the dimension in the length-wise direction Y. The laser bonding portions 64D and 64E is equal to the laser bonding portions 64A, 64B, and 64C in the dimension in the length-wise direction Y.

When a difference in the dimension in the length-wise direction Y between the laser bonding portion 64D and the laser bonding portion 64E is within, for example, 5% of the dimension of the laser bonding portion 64D in the length-wise direction Y, it is considered that the laser bonding portions 64D and 64E are equal to each other in the dimension in the length-wise direction Y. Also, when the largest difference of the laser bonding portion 64D from the laser bonding portion 64A, the laser bonding portion 64B, and the laser bonding portion 64C in the dimension in the length-wise direction Y is within, for example, 5% of the dimension of the laser bonding portion 64A in the length-wise direction Y, it is considered that the laser bonding portion 64D is equal to the laser bonding portions 64A, 64B, and 64C in the dimension in the length-wise direction Y. When the largest difference of the laser bonding portion 64E from the laser bonding portion 64A, the laser bonding portion 64B, and the laser bonding portion 64C in the dimension in the length-wise direction Y is within, for example, 5% of the dimension of the laser bonding portion 64A in the length-wise direction Y, it is considered that the laser bonding portion 64E is equal to the laser bonding portions 64A, 64B, and 64C in the dimension in the length-wise direction Y.

The laser bonding portion 64D is disposed closer to the distal end of the first connector 61B than the laser bonding portion 64E. In an example, the laser bonding portion 64D is formed in a portion of the first connector 61B overlapping a distal portion of the first connector 61C as viewed in the thickness-wise direction Z. More specifically, the laser bonding portion 64D is formed in a portion of the first connector 61B adjacent to the distal edge of the first connector 61C in the width-wise direction X. As viewed in the thickness-wise direction Z, the laser bonding portion 64D is disposed between the laser bonding portion 64A and the laser bonding portion 64B in the width-wise direction X. The laser bonding portion 64E is disposed closer to the distal end of the first connector 61B than the center of the first connector 61B in the width-wise direction X. As viewed in the thickness-wise direction Z, the laser bonding portion 64E is disposed between the laser bonding portion 64B and the laser bonding portion 64C in the width-wise direction X. As viewed in the thickness-wise direction Z, the laser bonding portions 64D and 64E are disposed so as not to overlap the laser bonding portions 64A, 64B, and 64C. As shown in FIG. 15, in the present embodiment, a pitch PB between the laser bonding portion 64D and the laser bonding portion 64E is equal to the pitches PA1 and PA2. When a difference between the pitch PB and the pitch PA1 or the pitch PA2 is within, for example, 5% of the pitch PA1, it is considered that the pitch PB is equal to the pitches PA1 and PA2. The pitch PB may be changed in any manner. In an example, the pitch PB may be larger than the pitches PA1 and PA2.

As shown in FIGS. 14 and 15, one laser bonding portion 64F is formed in the first connector 61C. The laser bonding portion 64F is bonded to the first connector 61B. The laser bonding portion 64F is an example of a third element bonding portion. The laser bonding portion 64F extends in the length-wise direction Y. In the present embodiment, the laser bonding portion 64F is equal to the laser bonding portions 64A, 64B, and 64C in the dimension in the length-wise direction Y. When the largest difference of the laser bonding portion 64F from the laser bonding portion 64A, the laser bonding portion 64B, and the laser bonding portion 64C in the dimension in the length-wise direction Y is within, for example, 5% of the dimension of the laser bonding portion 64A in the length-wise direction Y, it is considered that the laser bonding portion 64F is equal to the laser bonding portions 64A, 64B, and 64C in the dimension in the length-wise direction Y.

The laser bonding portion 64F is disposed closer to the distal end of the first connector 61C than the center of the first connector 61B in the width-wise direction X. The laser bonding portion 64F is disposed between the laser bonding portion 64D and the laser bonding portion 64E in the width-wise direction X. Thus, as viewed in the thickness-wise direction Z, the laser bonding portion 64F is disposed so as not to overlap the laser bonding portions 64D and 64E. As viewed in the thickness-wise direction Z, the laser bonding portion 64F overlaps the laser bonding portion 64B.

Thus, in the first connector 61 of the first drive lead 60, the laser bonding portions formed in adjacent ones of the metal layers in the stacking direction of the metal layers are disposed so as not to overlap each other in the thickness-wise direction. In contrast, in the first connector 61 of the first drive lead 60, the laser bonding portions formed in separate ones of the metal layers in the stacking direction of the metal layers are disposed to overlap each other in the thickness-wise direction.

In the present embodiment, as shown in FIG. 15, in plan view, the three laser bonding portions 64A, 64B, and 64C, the two laser bonding portions 64D and 64E, and the one laser bonding portion 64F are formed at the same pitch in the width-wise direction X.

As shown in the enlarged view in FIG. 15, a recess 64x is formed in the end of the laser bonding portion 64B located close to the metal plate 60B in the thickness-wise direction Z. The recess 64x is curved in a cross-sectional view obtained by cutting the recess 64x along a plane extending in the width-wise direction X and the thickness-wise direction Z. The laser bonding portion 64B is not in contact with the metal plate 60B because of the recess 64x. In the same manner as the laser bonding portion 64B, the laser bonding portions 64A and 64C in the metal plate 60A and the laser bonding portions 64E and 64F in the metal plate 60B each have a recess 64x. Thus, the laser bonding portions 64A and 64C in the metal plate 60A are not in contact with the metal plate 60B. Also, the laser bonding portions 64E and 64F are not in contact with the metal plate 60C.

Figure 16:
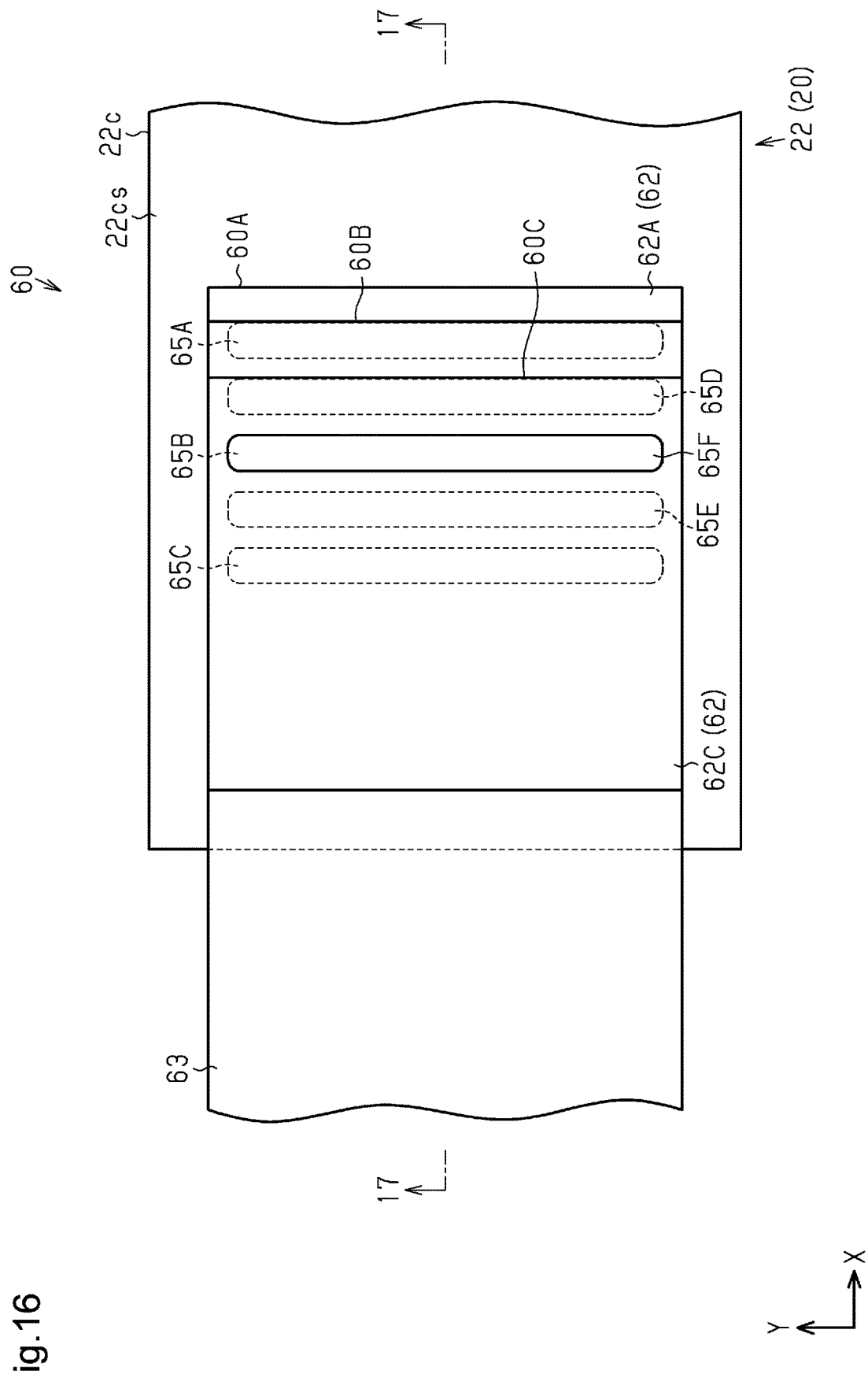
FIG. 16 is a plan view showing a structure that joins the first drive leads to an input lead.

As shown in FIG. 16, the second connector 62A of the metal plate 60A is bonded to the main surface 22cs of the extension 22c of the input lead 22. The second connector 62A is an example of a first conductor-side connector of the first metal plate. The entire surface of the second connector 62A is in contact with the main surface 22cs of the extension 22c. In plan view, the second connector 62A is rectangular such that the long sides extend in the width-wise direction X and the short sides extend in the length-wise direction Y. In the present embodiment, the second connector 62A is slightly less than the extension 22c in the dimension in the length-wise direction Y (width). Alternatively, the second connector 62A may be equal to the extension 22c in the dimension of in the length-wise direction Y. In the present embodiment, the second connector 62A is equal to the first connector 61A in the dimension in the width-wise direction X, and the second connector 62A is equal to the first connector 61A in the dimension in the length-wise direction Y. When a difference in the dimension in the width-wise direction X between the second connector 62A and the first connector 61A is within, for example, 5% of the dimension of the first connector 61A in the width-wise direction X, it is considered that the second connector 62A is equal to the first connector 61A in the dimension in the width-wise direction X. When a difference in the dimension in the length-wise direction Y between the second connector 62A and the first connector 61A is within, for example, 5% of the dimension of the first connector 61A in the length-wise direction Y, it is considered that the second connector 62A is equal to the first connector 61A in the dimension in the length-wise direction Y.

Figure 17:
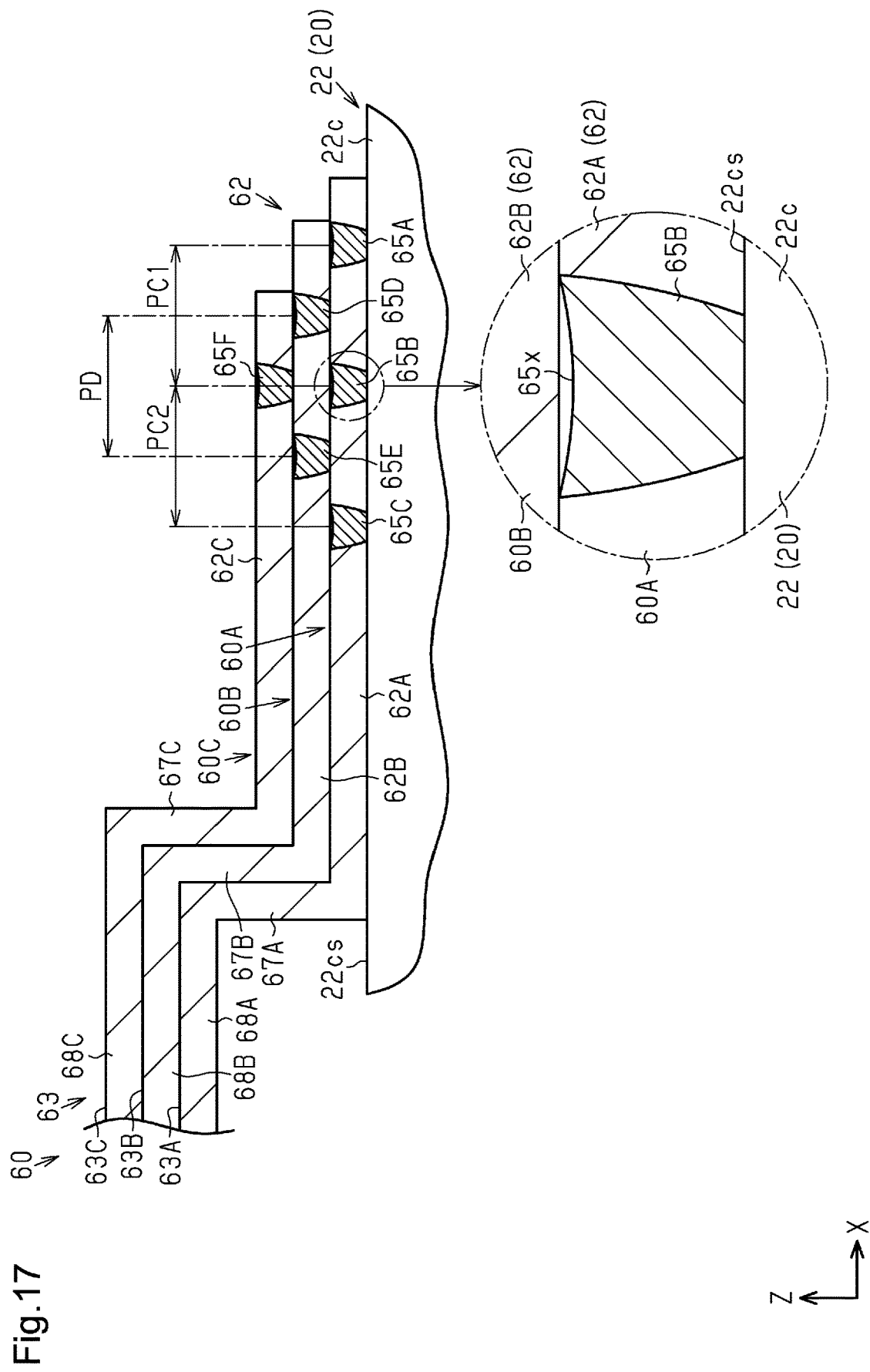
FIG. 17 is a cross-sectional view taken along line 17-17 in FIG. 16.

As shown in FIGS. 16 and 17, the second connector 62B of the metal plate 60B is stacked on the second connector 62A in the thickness-wise direction Z. The almost entire surface of the second connector 62B is in contact with the second connector 62A. The second connector 62B is an example of a second conductor-side connector of the second metal plate. In plan view, the second connector 62B is rectangular such that the long sides extend in the width-wise direction X and the short sides extend in the length-wise direction Y. The distal edge of the second connector 62B is spaced from the distal edge of the second connector 62A in the width-wise direction X. More specifically, the distal edge of the second connector 62B is disposed closer to the second semiconductor element 30L than the distal edge of the second connector 62A in the width-wise direction X. Thus, in plan view, the second connector 62B is less than the second connector 62A in the dimension in the width-wise direction X. In plan view, the second connector 62B is equal to the second connector 62A in the dimension in the length-wise direction Y (width). The second connector 62B is equal to the second connector 62A in thickness (dimension in the thickness-wise direction Z). When a difference in the dimension in the length-wise direction Y between the second connector 62B and the second connector 62A is within, for example, 5% of the dimension of the second connector 62A in the length-wise direction Y, it is considered that the second connector 62B is equal to the second connector 62A in the dimension in the length-wise direction Y. When a difference in thickness between the second connector 62B and the second connector 62A is within, for example, 5% of the thickness of the second connector 62A, it is considered that the second connector 62B is equal to the second connector 62A in thickness. In the present embodiment, the second connector 62B is equal to the first connector 61B in the dimension in the width-wise direction X, and the second connector 62B is equal to the first connector 61B in the dimension in the length-wise direction Y. When a difference in the dimension in the width-wise direction X between the second connector 62B and the first connector 61B is within, for example, 5% of the dimension of the first connector 61B in the width-wise direction X, it is considered that the second connector 62B is equal to the first connector 61B in the dimension in the width-wise direction X. When a difference in the dimension in the length-wise direction Y between the second connector 62B and the first connector 61B is within, for example, 5% of the dimension of the first connector 61B in the length-wise direction Y, it is considered that the second connector 62B is equal to the first connector 61B in the dimension in the length-wise direction Y. The distal edge of the second connector 62B may be aligned with the distal edge of the second connector 62A in the width-wise direction X.

The second connector 62C of the metal plate 60C is stacked on the second connector 62B in the thickness-wise direction Z. The almost entire surface of the second connector 62C is in contact with the second connector 62B. The second connector 62C is an example of a third conductor-side connector of the third metal plate. In plan view, the second connector 62C is rectangular such that the long sides extend in the width-wise direction X and the short sides extend in the length-wise direction Y. The distal edge of the second connector 62C is spaced from the distal edge of the second connector 62B in the width-wise direction X. More specifically, the distal edge of the second connector 62C is disposed closer to the second semiconductor element 30L than the distal edge of the second connector 62B in the width-wise direction X. Thus, in plan view, the second connector 62C is less than the second connector 62B in the dimension in the width-wise direction X. In the present embodiment, the distal edge of the first connector 61C is spaced from the distal edge of the first connector 61B by a greater amount than the distal edge of the first connector 61B is spaced from the distal edge of the first connector 61A. In plan view, the second connector 62B is equal to the second connector 62B in the dimension in the length-wise direction Y (width). The second connector 62C is equal to the second connector 62B in thickness (dimension in the thickness-wise direction Z). When a difference in the dimension in the length-wise direction Y between the second connector 62C and the second connector 62B is within, for example, 5% of the dimension of the second connector 62B in the length-wise direction Y, it is considered that the second connector 62C is equal to the second connector 62B in the dimension in the length-wise direction Y. When a difference in thickness between the second connector 62C and the second connector 62B is within, for example, 5% of the thickness of the second connector 62B, it is considered that the second connector 62C is equal to the second connector 62B in thickness. In the present embodiment, the second connector 62C is equal to the first connector 61C in the dimension in the width-wise direction X. The second connector 62C is equal to the first connector 61C in the dimension in the length-wise direction Y. When a difference in the dimension in the width-wise direction X between the second connector 62C and the first connector 61C is within, for example, 5% of the dimension of the first connector 61C in the width-wise direction X, it is considered that the second connector 62C is equal to the first connector 61C in the dimension in the width-wise direction X. When a difference in the dimension in the length-wise direction Y between the second connector 62C and the first connector 61C is within, for example, 5% of the dimension of the first connector 61C in the length-wise direction Y, it is considered that the second connector 62C is equal to the first connector 61C in the dimension in the length-wise direction Y. The distal edge of the second connector 62C may be aligned with the distal edge of the second connector 62B in the width-wise direction X.

The second connector 62A is bonded to a distal portion of the extension 22c of the input lead 22 by laser beam welding. The second connector 62B is bonded to the second connector 62A by laser beam welding. The second connector 62C is bonded to the second connector 62B by laser beam welding.

More specifically, as shown in FIGS. 16 and 17, three laser bonding portions 65A, 65B, and 65C are formed in the second connector 62A. The laser bonding portions 65A, 65B, and 65C are bonded to the main surface 22cs of the extension 22c. Each of the laser bonding portions 65A, 65B, and 65C is an example of a first conductor bonding portion. The laser bonding portions 65A, 65B, and 65C are separated from each other in the width-wise direction X and formed in the second connector 62A. In plan view, the laser bonding portions 65A, 65B, and 65C extend in the length-wise direction Y. In the present embodiment, the laser bonding portions 65A, 65B, and 65C are equal to each other in the dimension in the length-wise direction Y. When the largest difference in the dimension in the length-wise direction Y between the laser bonding portion 65A, the laser bonding portion 65B, and the laser bonding portion 65C is within, for example, 5% of the dimension of the laser bonding portion 65A in the length-wise direction Y, it is considered that the laser bonding portions 65A, 65B, and 65C are equal to each other in the dimension in the length-wise direction Y. In the present embodiment, the laser bonding portions 65A, 65B, and 65C are respectively equal to the laser bonding portions 64A, 64B, and 64C in the dimension in the length-wise direction Y. When a difference in the dimension in the length-wise direction Y between the laser bonding portion 65A and the laser bonding portion 64A is within 5% of the dimension of the laser bonding portion 64A in the length-wise direction Y, it is considered that the laser bonding portion 65A is equal to the laser bonding portion 64A in the dimension in the length-wise direction Y The relationship in the dimension in the length-wise direction Y between the laser bonding portion 65B and the laser bonding portion 64B and the relationship in the dimension in the length-wise direction Y between the laser bonding portion 65C and the laser bonding portion 64C are the same as the above-described relationship in the dimension in the length-wise direction Y between the laser bonding portion 65A and the laser bonding portion 64A.

The laser bonding portion 65A is disposed closer to the distal end of the second connector 62A than the laser bonding portions 65B and 65C. In an example, the laser bonding portion 65A is formed in a portion of the second connector 62A overlapping a distal portion of the second connector 62B in the thickness-wise direction Z. More specifically, the laser bonding portion 65A is formed in a portion of the second connector 62A adjacent to the distal edge of the second connector 62B in the width-wise direction X. The laser bonding portion 65B is disposed closer to the basal end of the second connector 62A than the laser bonding portion 65A and closer to the distal end of the second connector 62A than the laser bonding portion 65C. The laser bonding portion 65C is formed in a central portion of the second connector 62A in the width-wise direction X. In the present embodiment, as shown in FIG. 17, a pitch PC1 between the laser bonding portion 65A and the laser bonding portion 65B is equal to a pitch PC2 between the laser bonding portion 65B and the laser bonding portion 65C. When a difference between the pitch PC1 and the pitch PC2 is within, for example, 5% of the pitch PC1, it is considered that the pitch PC1 is equal to the pitch PC2. In the present embodiment, the pitch PC1 is equal to the pitch PA1 (refer to FIG. 15) between the laser bonding portion 64A and the laser bonding portion 64B, and the pitch PC2 is equal to the pitch PA2 (refer to FIG. 15) between the laser bonding portion 64B and the laser bonding portion 64C. When a difference between the pitch PC1 and the pitch PA1 is within, for example, 5% of the pitch PA1, it is considered that the pitch PC1 is equal to the pitch PA1. When a difference between the pitch PC2 and the pitch PA2 is within, for example, 5% of the pitch PA2, it is considered that the pitch PC2 is equal to the pitch PA2.

As shown in FIGS. 16 and 17, two laser bonding portions 65D and 65E are formed in the second connector 62B. The laser bonding portions 65D and 65E are bonded to the second connector 62A. Each of the laser bonding portions 65D and 65E is an example of a second conductor bonding portion. The laser bonding portions 65D and 65E are separated from each other in the width-wise direction X and formed in the second connector 62B. In plan view, the laser bonding portions 65D and 65E extend in the length-wise direction Y. In the present embodiment, the laser bonding portions 65D and 65E are qual to each other in the dimension in the length-wise direction Y. The laser bonding portions 65D and 65E are equal to the laser bonding portions 65A, 65B, and 65C in the dimension in the length-wise direction Y.

When a difference in the dimension in the length-wise direction Y between the laser bonding portion 65D and the laser bonding portion 65E is within, for example, 5% of the dimension of the laser bonding portion 65D in the length-wise direction Y, it is considered that the laser bonding portions 65D and 65E are equal to each other in the dimension in the length-wise direction Y. When the largest difference of the laser bonding portion 65D from the laser bonding portion 65A, the laser bonding portion 65B, and the laser bonding portion 65C in the dimension in the length-wise direction Y is within, for example, 5% of the dimension of the laser bonding portion 65A in the length-wise direction Y, it is considered that the laser bonding portion 65D is equal to the laser bonding portions 65A, 65B, and 65C in the dimension in the length-wise direction Y. When the largest difference of the laser bonding portion 65E from the laser bonding portion 65A, the laser bonding portion 65B, and the laser bonding portion 65C in the dimension in the length-wise direction Y is within, for example, 5% of the dimension of the laser bonding portion 65A in the length-wise direction Y, it is considered that the laser bonding portion 65E is equal to the laser bonding portions 65A, 65B, and 65C in the dimension in the length-wise direction Y.

In the present embodiment, the laser bonding portion 65D is equal to the laser bonding portion 64D of the first connector 61B (refer to FIG. 14) in the dimension in the length-wise direction Y. The laser bonding portion 65E is equal to the laser bonding portion 64E of the first connector 61B (refer to FIG. 14) in the dimension in the length-wise direction Y. When a difference in the dimension in the length-wise direction Y between the laser bonding portion 65D and the laser bonding portion 64D is within, for example, 5% of the dimension of the laser bonding portion 64D in the length-wise direction Y, it is considered that the laser bonding portion 65D is equal to the laser bonding portion 64D in the dimension in the length-wise direction Y. When a difference in the dimension in the length-wise direction Y between the laser bonding portion 65E and the laser bonding portion 64E is within, for example, 5% of the dimension of the laser bonding portion 64E in the length-wise direction Y, it is considered that the laser bonding portion 65E is equal to the laser bonding portion 64E in the dimension in the length-wise direction Y The laser bonding portion 65D is disposed closer to the distal end of the second connector 62B than the laser bonding portion 65E. In an example, the laser bonding portion 65D is formed in a portion of the second connector 62B overlapping a distal portion of the second connector 62C in the thickness-wise direction Z. More specifically, the laser bonding portion 65D is formed in a portion of the second connector 62B adjacent to the distal edge of the second connector 62C in the width-wise direction X. As viewed in the thickness-wise direction Z, the laser bonding portion 65D is disposed between the laser bonding portion 65A and the laser bonding portion 65B in the width-wise direction X. The laser bonding portion 65E is disposed closer to the distal end of the second connector 62B than the center of the second connector 62B in the width-wise direction X. As viewed in the thickness-wise direction Z, the laser bonding portion 65E is disposed between the laser bonding portion 65B and the laser bonding portion 65C in the width-wise direction X. Thus, as viewed in the thickness-wise direction Z, the laser bonding portions 65D and 65E are disposed so as not to overlap the laser bonding portions 65A, 65B, and 65C. As shown in FIG. 17, in the present embodiment, a pitch PD between the laser bonding portion 65D and the laser bonding portion 65E is equal to the pitches PC1 and PC2. When a difference between the pitch PD and the pitch PC1 or the pitch PC2 is within, for example, 5% of the pitch PC1, it is considered that the pitch PD is equal to the pitches PC1 and PC2. In the present embodiment, the pitch PD is equal to the pitch PB between the laser bonding portion 64D and the laser bonding portion 64E in the first connector 61B. When a difference between the pitch PD and the pitch PB is within, for example, 5% of the pitch PB, it is considered that the pitch PD is equal to the pitch PB.

As shown in FIGS. 16 and 17, one laser bonding portion 65F is formed in the second connector 62C. The laser bonding portion 65F is bonded to the second connector 62B. The laser bonding portion 65F is an example of a third conductor bonding portion. The laser bonding portion 65F extends in the length-wise direction Y. In the present embodiment, the laser bonding portion 65F is equal to the laser bonding portions 65A, 65B, and 65C in the dimension in the length-wise direction Y. When the largest difference of the laser bonding portion 65F from the laser bonding portion 65A, the laser bonding portion 65B, and the laser bonding portion 65C in the dimension in the length-wise direction Y is within, for example, 5% of the dimension of the laser bonding portion 65A in the length-wise direction Y, it is considered that the laser bonding portion 65F is equal to the laser bonding portions 65A, 65B, and 65C in the dimension in the length-wise direction Y In the present embodiment, the laser bonding portion 65F is equal to the laser bonding portion 64F of the second connector 62C (refer to FIG. 14) in the dimension in the length-wise direction Y. When a difference in the dimension in the length-wise direction Y between the laser bonding portion 65F and the laser bonding portion 64F is within, for example, 5% of the dimension of the laser bonding portion 64F in the length-wise direction Y, it is considered that the laser bonding portion 65F is equal to the laser bonding portion 64F in the dimension in the length-wise direction Y The laser bonding portion 65F is disposed closer to the distal end of the second connector 62C than the center of the second connector 62C in the width-wise direction X. The laser bonding portion 65F is disposed between the laser bonding portion 65D and the laser bonding portion 65E in the width-wise direction X. Thus, as viewed in the thickness-wise direction Z, the laser bonding portion 65F is disposed so as not to overlap the laser bonding portions 65D and 65E. As viewed in the thickness-wise direction Z, the laser bonding portion 65F overlaps the laser bonding portion 65B.

Thus, in the second connector 62 of the first drive lead 60, the laser bonding portions formed in adjacent ones of the metal layers in the stacking direction of the metal layers are disposed so as not to overlap each other in the thickness-wise direction. In contrast, in the second connector 62 of the first drive lead 60, the laser bonding portions formed in separate ones of the metal layers in the stacking direction of the metal layers are disposed to overlap each other in the thickness-wise direction.

In the present embodiment, as shown in FIG. 17, in plan view, the three laser bonding portions 65A, 65B, and 65C, the two laser bonding portions 65D and 65E, and the one laser bonding portion 65F are formed at the same pitch in the width-wise direction X.

As shown in the enlarged view of FIG. 17, a recess 65x is formed in the end of the laser bonding portion 65B located close to the metal plate 60B in the thickness-wise direction Z. The recess 65x is curved in a cross-sectional view obtained by cutting the recess 65x along a plane extending in the width-wise direction X and the thickness-wise direction Z. The laser bonding portion 65B is not in contact with the metal plate 60B because of the recess 65x. In the same manner as the laser bonding portion 65B, the laser bonding portions 65A and 65C of the metal plate 60A and the laser bonding portions 65D and 65E of the metal plate 60B each have a recess 65x. Thus, the laser bonding portions 65A and 65C of the metal plate 60A are not in contact with the metal plate 60B. Also, the laser bonding portions 65D and 65E are not in contact with the metal plate 60C.

As shown in FIGS. 12 and 13, in a side view of the metal plate 60A in the length-wise direction Y, the joint 63A of the metal plate 60A has the shape of a rectangular recess that is open toward the support substrate 40 (refer to FIG. 10A). The joint 63A may be divided into a first vertical part 66A, a second vertical part 67A, and a horizontal part 68A. The first vertical part 66A and the second vertical part 67A are separate in the width-wise direction X. The horizontal part 68A joins the first vertical part 66A and the second vertical part 67A in the width-wise direction X. The first vertical part 66A extends from the basal end of the first connector 61A in the thickness-wise direction Z. The second vertical part 67A extends from the basal end of the second connector 62A in the thickness-wise direction Z. The first vertical part 66A is greater than the second vertical part 67A in the dimension in the thickness-wise direction Z. The horizontal part 68A joins an end of the first vertical part 66A that is opposite from the first connector 61A in the thickness-wise direction Z to an end of the second vertical part 67A that is opposite from the second connector 62A in the thickness-wise direction Z. Thus, the horizontal part 68A is disposed closer to the resin top surface 15 of the encapsulation resin 10 (refer to FIG. 10A) than the input lead 22 in the thickness-wise direction Z.

The joint 63B of the metal plate 60B is stacked on the joint 63A of the metal plate 60A. More specifically, in a side view of the metal plate 60B in the length-wise direction Y, the joint 63B has the shape of a rectangular recess in the same manner as the joint 63A. The joint 63B may be divided into a first vertical part 66B, a second vertical part 67B, and a horizontal part 68B. The first vertical part 66B is stacked on the first vertical part 66A in the width-wise direction X. The entire surface of the first vertical part 66B is in contact with the first vertical part 66A. The second vertical part 67B is stacked on the second vertical part 67A in the width-wise direction X. The entire surface of the second vertical part 67B is in contact with the second vertical part 67A. The horizontal part 68B is stacked on the horizontal part 68A in the thickness-wise direction Z. The entire surface of the horizontal part 68B is in contact with the horizontal part 68A.

The joint 63C of the metal plate 60C is stacked on the joint 63B of the metal plate 60B. More specifically, in a side view of the metal plate 60C in the length-wise direction Y, the joint 63C has the shape of a rectangular recess in the same manner as the joint 63A. The joint 63B may be divided into a first vertical part 66C, a second vertical part 67C, and a horizontal part 68C. The first vertical part 66C is stacked on the first vertical part 66B in the width-wise direction X. The entire surface of the first vertical part 66C is in contact with the first vertical part 66B. The second vertical part 67C is stacked on the second vertical part 67B in the width-wise direction X. The entire surface of the second vertical part 67C is in contact with the second vertical part 67B. The horizontal part 68C is stacked on the horizontal part 68B in the thickness-wise direction Z. The entire surface of the horizontal part 68C is in contact with the horizontal part 68B.

As shown in FIG. 5, the second drive lead 70 is bonded to the source electrode 33 of the first semiconductor element 30U and an end of the main surface 42sb of the conductive member 42B located close to the conductive member 42A in the width-wise direction X. The conductive member 42B is an example of a drive conductor. The main surface 42sb of the conductive member 42B is an example of a drive connection surface of the drive conductor.

Figure 18:
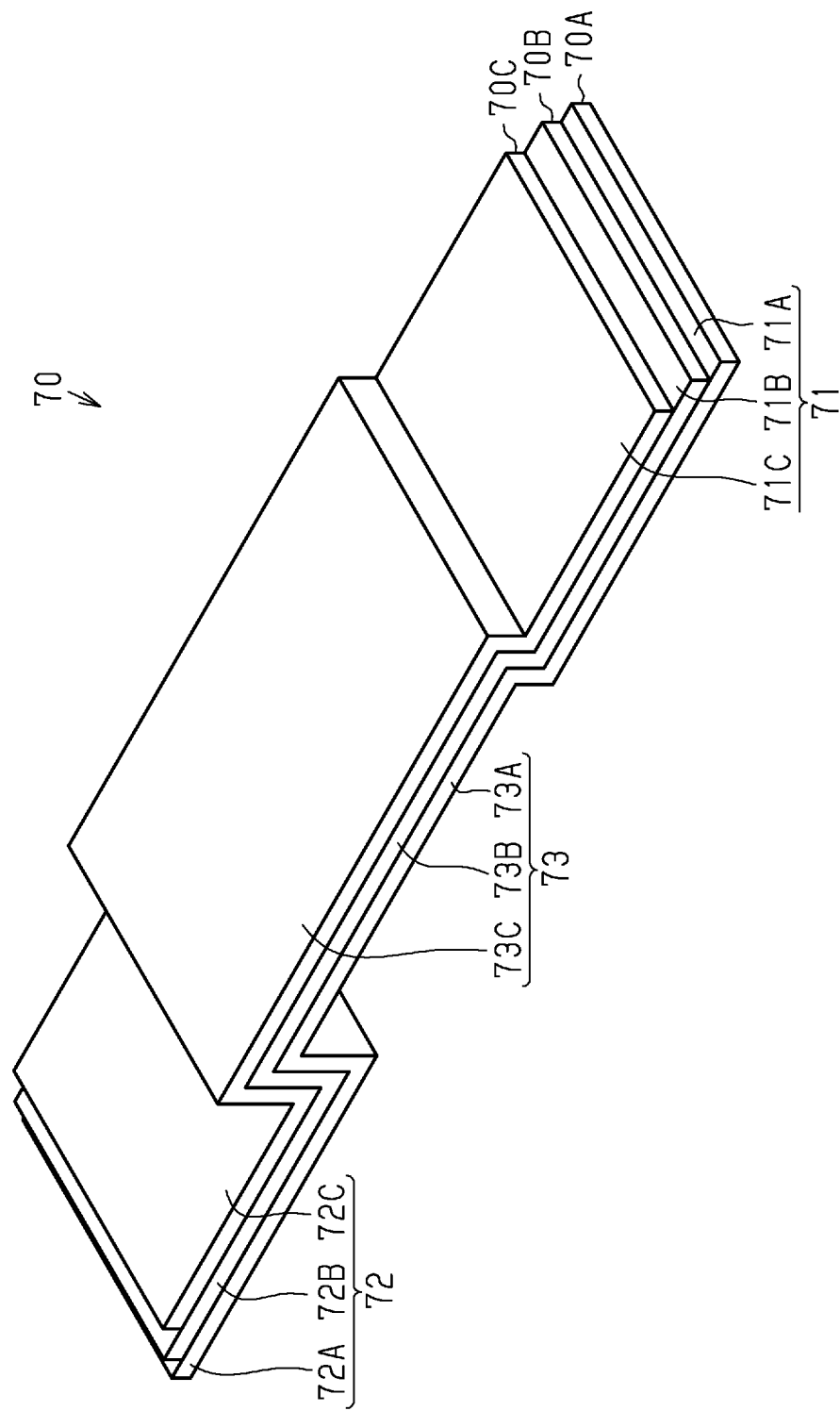
FIG. 18 is a perspective view of second drive leads in the semiconductor device shown in FIG. 1.
Figure 19:
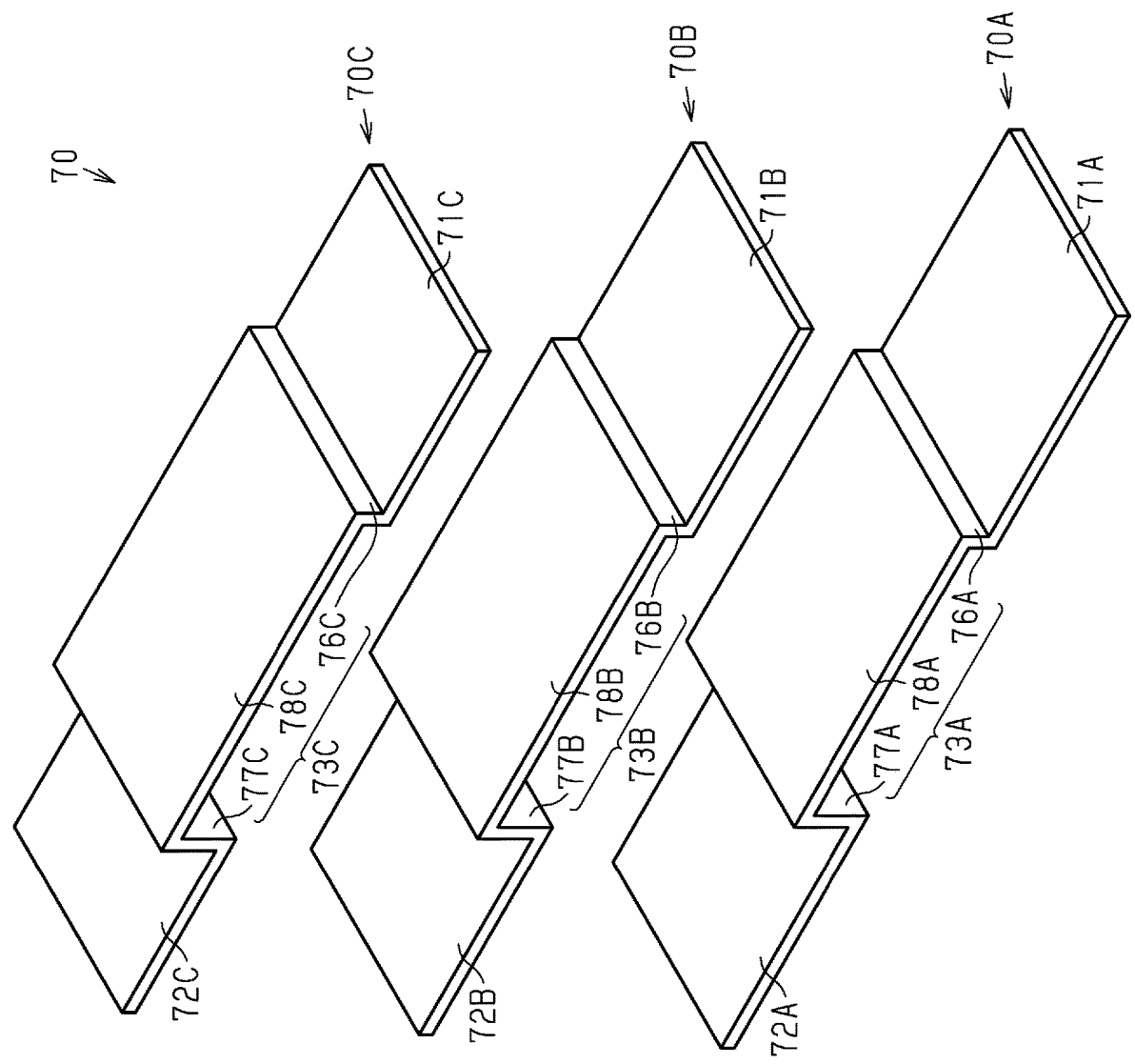
FIG. 19 is an exploded perspective view of the second drive leads shown in FIG. 18.

In plan view, the second drive leads 70 is belt-shaped and extends in the width-wise direction X. The second drive lead 70 has a structure obtained by stacking thin metal plates in the thickness-wise direction Z. In the present embodiment, as shown in FIGS. 18 and 19, the second drive lead 70 is obtained by stacking three thin metal plates, namely, metal plates 70A, 70B, and 70C, in this order in the thickness-wise direction Z. The metal plates 70A, 70B, and 70C are formed from the same metal material. An example of the material forming the metal plates 70A, 70B, and 70C is Cu (copper). The number of metal plates forming the second drive lead 70 may be changed in any manner. In an example, the number of metal plates forming the second drive lead 70 is set in accordance with the allowable current amount of the first semiconductor element 30U. The thickness (dimension in the thickness-wise direction Z) of the metal plates 70A, 70B, and 70C is 0.05 mm to 0.2 mm, which is the same as the metal plates 60A, 60B, and 60C (refer to FIGS. 12 and 13). In the present embodiment, metal plates having the thickness of 0.05 mm are used for the metal plates 70A, 70B, and 70C.

Each second drive lead 70 includes a first connector 71 bonded to the source electrode 33 of the first semiconductor element 30U, a second connector 72 bonded to the conductive member 42B, and a joint 73 joining the first connector 71 to the second connector 72. Since the metal plates 70A to 70C are stacked to form the second drive lead 70, each of the metal plates 70A to 70C includes the first connector 71, the second connector 72, and the joint 73. To distinguish between the metal plates 70A to 70C, the first connector 71, the second connector 72, and the joint 73 are provided with a suffix of respective Roman letters A to C. In the present embodiment, the metal plate 70A is a single member in which the first connector 71A, the second connector 72A, and the joint 73A are integrally formed. The metal plate 70B is a single member in which the first connector 71B, the second connector 72B, and the joint 73B are integrally formed. The metal plate 70C is a single member in which the first connector 71C, the second connector 72C, and the joint 73C are integrally formed. The first connector 71 is formed by stacking the first connector 71A, the first connector 71B, and the first connector 71C in the thickness-wise direction Z. The second connector 72 is formed by stacking the second connector 72A, the second connector 72B, and the second connector 72C in the thickness-wise direction Z.

Figure 20:
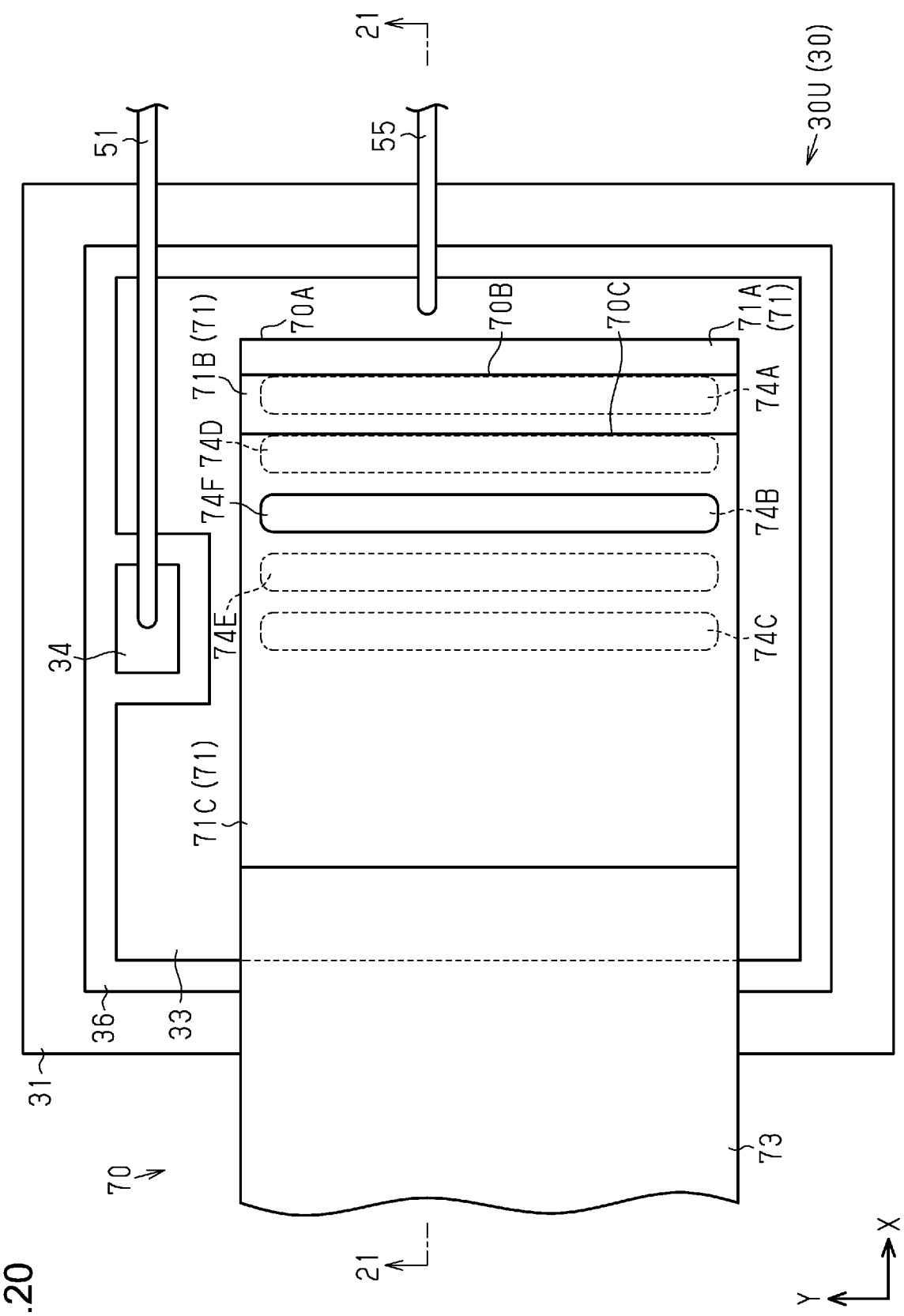
FIG. 20 is a plan view showing a structure that joins the second drive leads to the semiconductor element.
Figure 21:
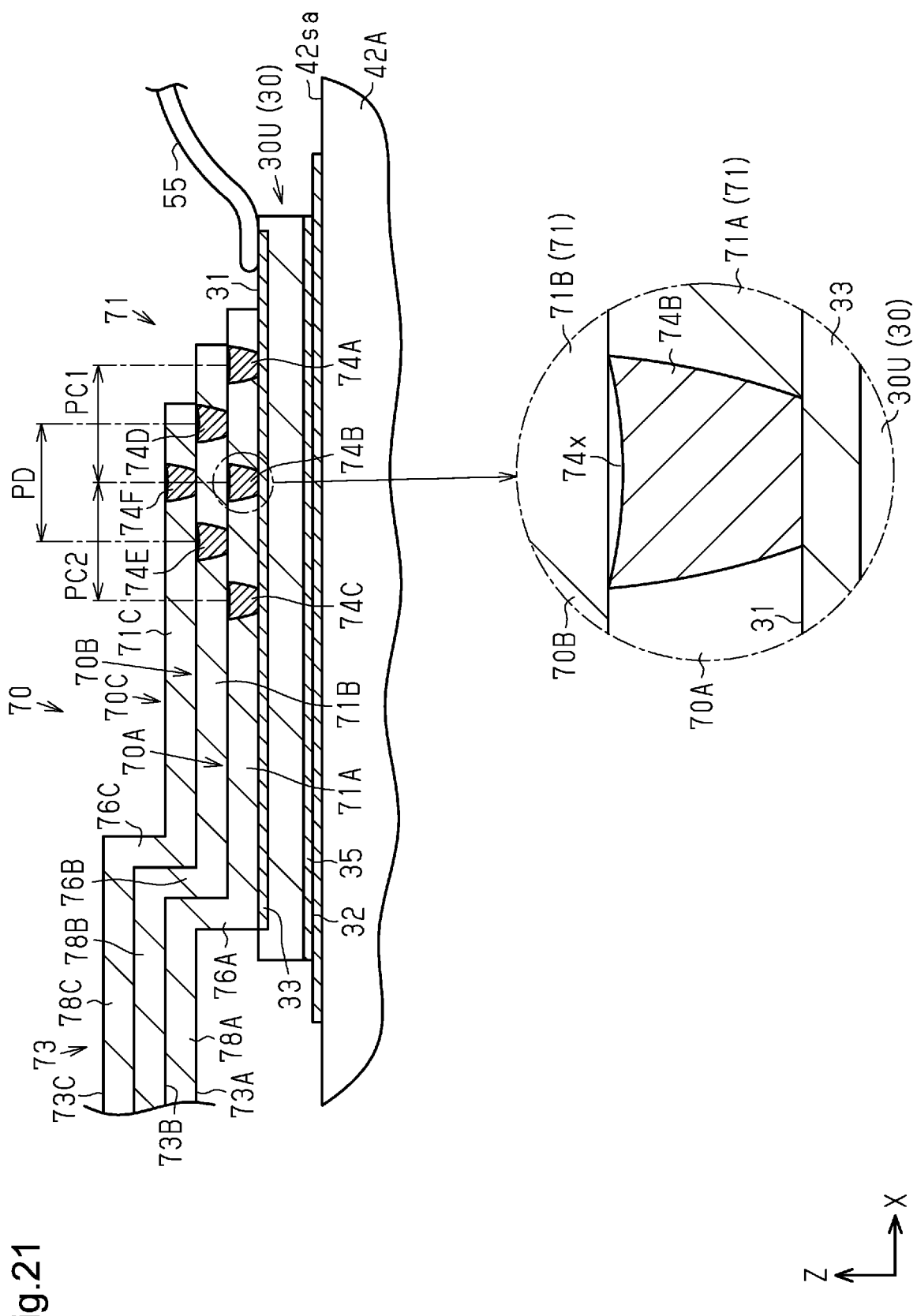
FIG. 21 is a cross-sectional view taken along line 21-21 in FIG. 20.

As shown in FIGS. 20 and 21, the first connector 71 of the second drive lead 70 and the second connector 62 of the first drive lead 60 (refer to FIGS. 16 and 17) have the same structure. More specifically, the first connector 71A of the metal plate 70A and the second connector 62A of the metal plate 60A have the same structure. The first connector 71B of the metal plate 70B and the second connector 62B of the metal plate 60B have the same structure. The first connector 71C of the metal plate 70C and the second connector 62C of the metal plate 60C have the same structure. The stacking manner of the first connectors 71A, 71B, and 71C is the same as the stacking manner of the second connectors 62A, 62B, and 62C.

The first connector 71A is bonded to the source electrode 33 of the first semiconductor element 30U by laser beam welding. The first connector 71B is bonded to the first connector 71A by laser beam welding. The first connector 71C is bonded to the first connector 71B by laser beam welding. In the same manner as the second connector 62A, laser bonding portions 74A, 74B, and 74C are formed in the first connector 71A. The shape, size, and layout mode of the laser bonding portions 74A, 74B, and 74C are the same as the shape, size, and layout mode of the laser bonding portions 65A, 65B, and 65C formed in the second connector 62A. In the same manner as the second connector 62B, laser bonding portions 74D and 74E are formed in the first connector 71B. The shape, size, and layout mode of the laser bonding portions 74D and 74E are the same as the shape, size, and layout mode of the laser bonding portions 65D and 65E formed in the second connector 62B. In the same manner as the second connector 62C, a laser bonding portion 74F is formed in the first connector 71C. The shape, size, and layout mode of the laser bonding portion 74F are the same as the shape, size, and layout mode of the laser bonding portion 65F of the second connector 62C. In the same manner as the recesses 65x (refer to FIG. 17) of the laser bonding portion 65A to 65F, a recess 74x is formed in each of the laser bonding portions 74A to 74F.

Figure 22:
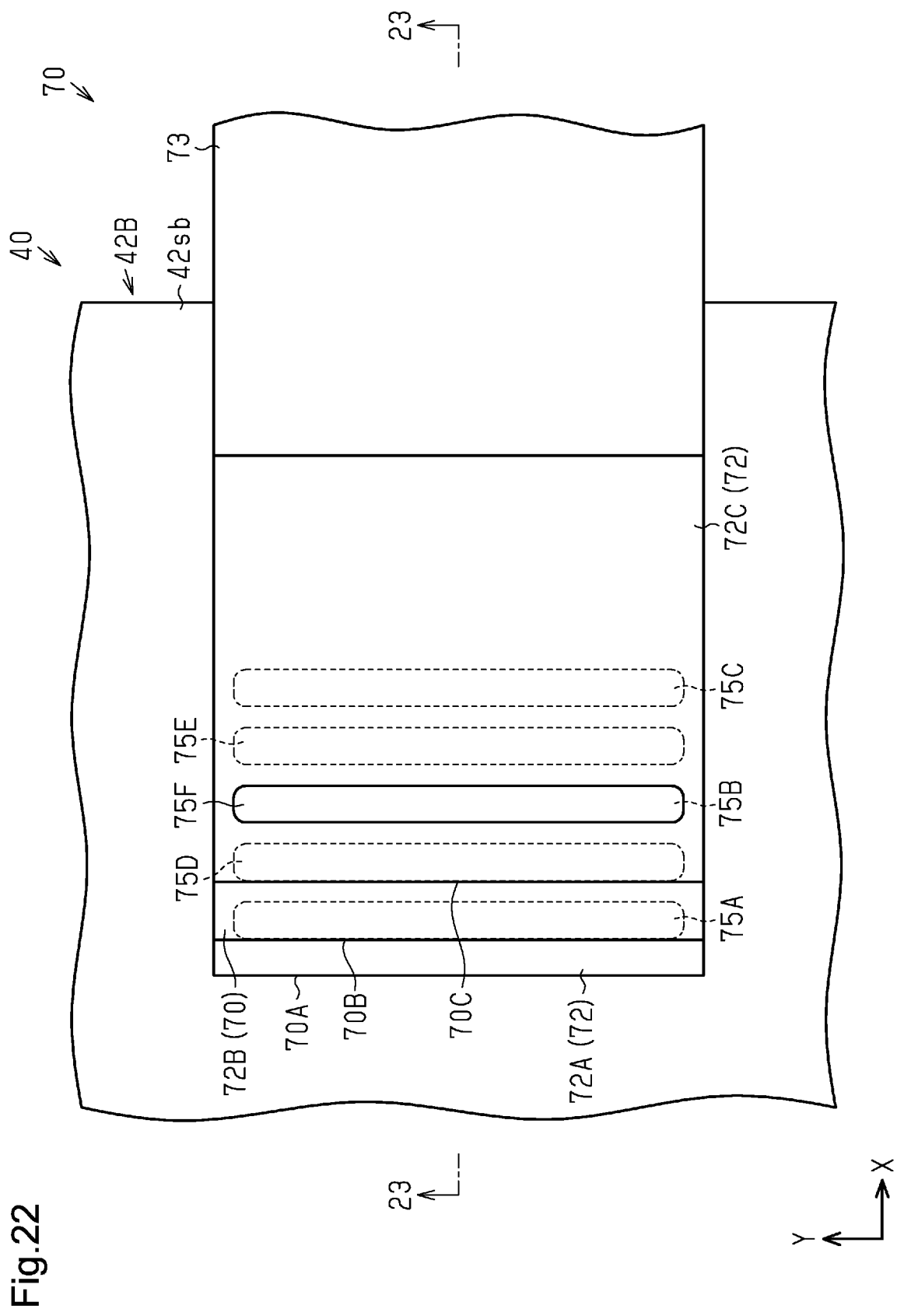
FIG. 22 is a plan view showing a structure that joins the second drive leads to a conductive member.
Figure 23:
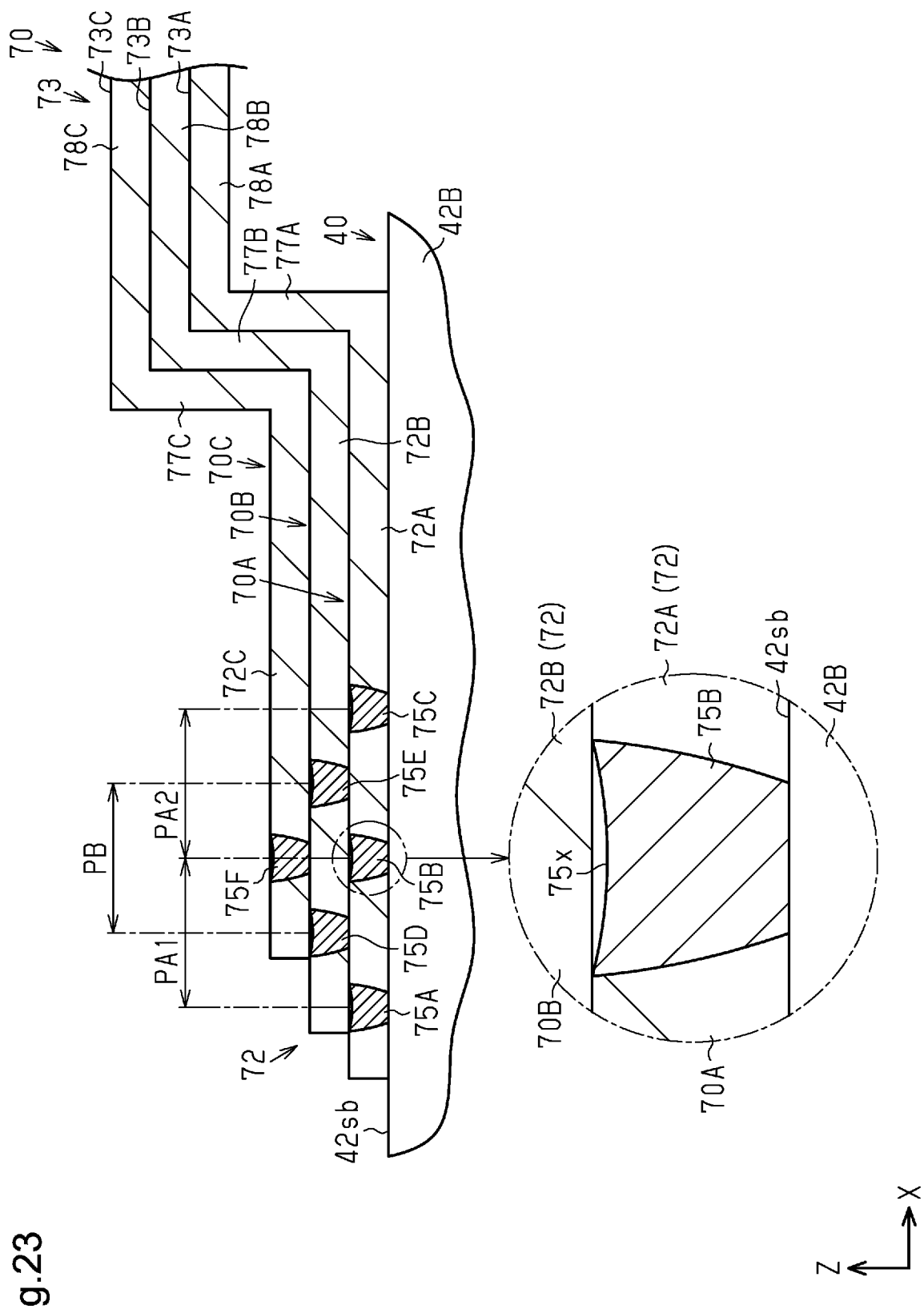
FIG. 23 is a cross-sectional view taken along line 23-23 in FIG. 22.

As shown in FIGS. 22 and 23, the second connector 72 of the second drive lead 70 and the first connector 61 of the first drive lead 60 (refer to FIGS. 14 and 15) have the same structure. More specifically, the second connector 72A of the metal plate 70A and the first connector 61A of the metal plate 60A have the same structure. The second connector 72B of the metal plate 70B and the first connector 61B of the metal plate 60B have the same structure. The second connector 72C of the metal plate 70C and the first connector 61C of the metal plate 60C have the same structure. The stacking manner of the second connectors 72A, 72B, and 72C is the same as the stacking manner of the first connectors 61A, 61B, and 61C.

The second connector 72A is bonded to the main surface 42sb of the conductive member 42B by laser beam welding. The second connector 72B is bonded to the second connector 72A by laser beam welding. The second connector 72C is bonded to the second connector 72B by laser beam welding. In the same manner as the first connector 61A, laser bonding portions 75A, 75B, and 75C are formed in the second connector 72A. The shape, size, and layout mode of the laser bonding portions 75A, 75B, and 75C are the same as the shape, size, and layout mode of the laser bonding portions 64A, 64B, and 64C formed in the first connector 61A. In the same manner as the first connector 61B, laser bonding portions 75D and 75E are formed in the second connector 72B. The shape, size, and layout mode of the laser bonding portions 75D and 75E are the same as the shape, size, and layout mode of the laser bonding portions 64D and 64E formed in the first connector 61B. In the same manner as the first connector 61C, a laser bonding portion 75F is formed in the second connector 72C. The shape, size, and layout mode of the laser bonding portion 75F are the same as the shape, size, and layout mode of the laser bonding portion 64F formed in the first connector 61C. In the same manner as the recesses 64x (refer to FIG. 15) of the laser bonding portions 64A to 64F, a recess 75x is formed in each of the laser bonding portions 75A to 75F.

As shown in FIGS. 18 and 19, the shape of the joint 73 of the second drive lead 70 in a side view of the second drive lead 70 in the length-wise direction Y differs from the shape of the joint 63 of the second drive lead 70 in a side view of the first drive lead 60 in the length-wise direction Y. More specifically, in the side view, the joint 73 has the shape of a rectangular recess that is open toward the support substrate 40 in the same manner as the joint 63. However, the recess of the joint 73 is shallower than the recess of the joint 63 since the distance in the thickness-wise direction Z between the first semiconductor element 30U and the main surface 42sb of the conductive member 42B is less than the distance in the thickness-wise direction Z between the extension 22c of the input lead 22 and the second semiconductor element 30L.

Figure 11A:
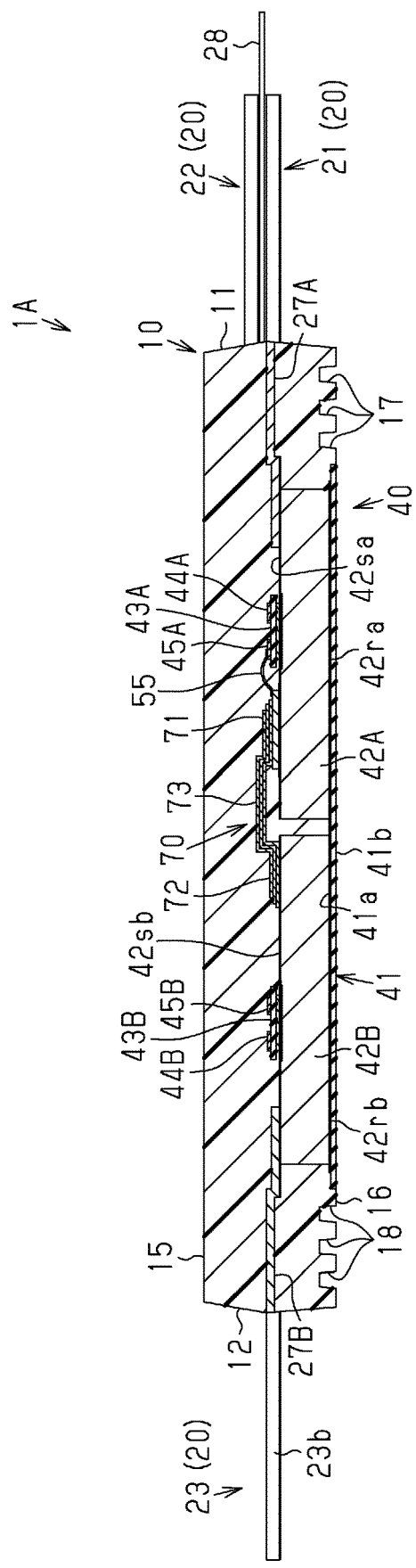
FIG. 11A is a cross-sectional view taken along line 11-11 in FIG. 4.
Figure 11B:
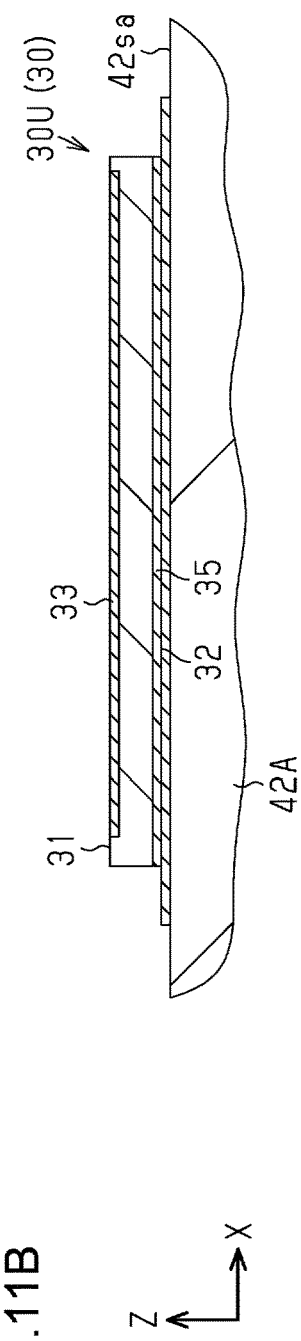
FIG. 11B is an enlarged view of the semiconductor element.

In a side view of the metal plate 70A in the length-wise direction Y, the joint 73A of the metal plate 70A has the shape of a rectangular recess that is open toward the support substrate 40 (refer to FIG. 11A). The joint 63A of the metal plate 70A may be divided into a first vertical part 76A, a second vertical part 77A, and a horizontal part 78A. The first vertical part 76A and the second vertical part 77A are separate in the width-wise direction X. The horizontal part 78A joins the first vertical part 76A and the second vertical part 77A in the width-wise direction X. The first vertical part 76A extends from the basal end of the second connector 72A in the thickness-wise direction Z. The second vertical part 77A extends from the basal end of the first connector 71A in the thickness-wise direction Z. The first vertical part 76A is greater than the second vertical part 77A in the dimension in the thickness-wise direction Z. In the present embodiment, the first vertical part 76A is less than the first vertical part 66A of the metal plate 60A of the first drive lead 60 in the dimension in the thickness-wise direction Z. The second vertical part 77A is equal to the second vertical part 67A of the metal plate 60A in the dimension in the thickness-wise direction Z. The horizontal part 78A joins an end of the first vertical part 76A that is opposite from the second connector 72A in the thickness-wise direction Z to an end of the second vertical part 77A that is opposite from the first connector 71A in the thickness-wise direction Z. The horizontal part 78A is equal to the horizontal part 68A of the metal plate 60A in the length in the width-wise direction X. When a difference in the dimension in the thickness-wise direction Z between the second vertical part 77A and the second vertical part 67A is within, for example, 5% of the dimension of the second vertical part 67A in the thickness-wise direction Z, it is considered that the second vertical part 77A is equal to the second vertical part 67A in the dimension in the thickness-wise direction Z. When a difference in the length in the width-wise direction X between the horizontal part 78A and the horizontal part 68A is within, for example, 5% of the length of the horizontal part 68A in the width-wise direction X, it is considered that the horizontal part 78A is equal to the horizontal part 68A in the length in the width-wise direction X.

The joint 73B of the metal plate 70B is stacked on the joint 73A of the metal plate 70A. More specifically, in a side view of the metal plate 70B in the length-wise direction Y, the joint 73B has the shape of a rectangular recess in the same manner as the joint 73A. The joint 73B may be divided into a first vertical part 76B, a second vertical part 77B, and a horizontal part 78B. The first vertical part 76B is stacked on the first vertical part 76A in the width-wise direction X. The entire surface of the first vertical part 76B is in contact with the first vertical part 76A. The second vertical part 77B is stacked on the second vertical part 77A in the width-wise direction X. The entire surface of the second vertical part 77B is in contact with the second vertical part 77A. The horizontal part 78B is stacked on the horizontal part 78A in the thickness-wise direction Z. The entire surface of the horizontal part 78B is in contact with the horizontal part 78A.

The joint 73C of the metal plate 70C is stacked on the joint 73B of the metal plate 70B. More specifically, in a side view of the metal plate 70C in the length-wise direction Y, the joint 73C has the shape of a rectangular recess in the same manner as the joint 73A. The joint 73C may be divided into a first vertical part 76C, a second vertical part 77C, and a horizontal part 78C. The first vertical part 76C is stacked on the first vertical part 76B in the width-wise direction X. The entire surface of the first vertical part 76C is in contact with the first vertical part 76B. The second vertical part 77C is stacked on the second vertical part 77B in the width-wise direction X. The entire surface of the second vertical part 77C is in contact with the second vertical part 77B. The horizontal part 78C is stacked on the horizontal part 78B in the thickness-wise direction Z. The entire surface of the horizontal part 78C is in contact with the horizontal part 78B.

As described above, the metal plate 70A is an example of a first metal plate connected to the semiconductor element. The first connector 71A is an example of a first element-side connector of the first metal plate. The second connector 72A is an example of a first conductor-side connector of the first metal plate. The joint 73A is an example of a first joint. Each of the laser bonding portions 74A, 74B, and 74C formed in the first connector 71A is an example of a first element bonding portion of the first element-side connector. Each of the laser bonding portions 75A, 75B, and 75C formed in the second connector 72A is an example of a first conductor bonding portion of the first conductor-side connector.

The metal plate 70B is an example of a second metal plate stacked on the first metal plate. The first connector 71B is an example of a second element-side connector connected to the first element-side connector. The second connector 72B is an example of a second conductor-side connector of the second metal plate. The joint 73B is an example of a second joint. Each of the laser bonding portions 74D and 74E formed in the first connector 71B is an example of a second element bonding portion of the second element-side connector. Each of the laser bonding portions 75D and 75E formed in the second connector 72B is an example of a second conductor bonding portion of the second conductor-side connector.

The metal plate 70C is an example of a third metal plate stacked on the second metal plate. The first connector 71C is an example of a third element-side connector of the third metal plate. The second connector 72C is an example of a third conductor-side connector of the third metal plate. The joint 73C is an example of a third joint. The laser bonding portion 74F formed in the first connector 71C is an example of a third element bonding portion of the third element-side connector. The laser bonding portion 75F formed in the second connector 72C is an example of a third conductor bonding portion of the third conductor-side connector.

Manufacturing Method

A method for manufacturing the semiconductor device 1A of the present embodiment will now be described with reference to FIGS. 24 to 27. In the description hereafter, components provided with reference characters of the semiconductor device 1A indicate the components of the semiconductor device 1A shown in FIGS. 1 to 23.

Figure 24:
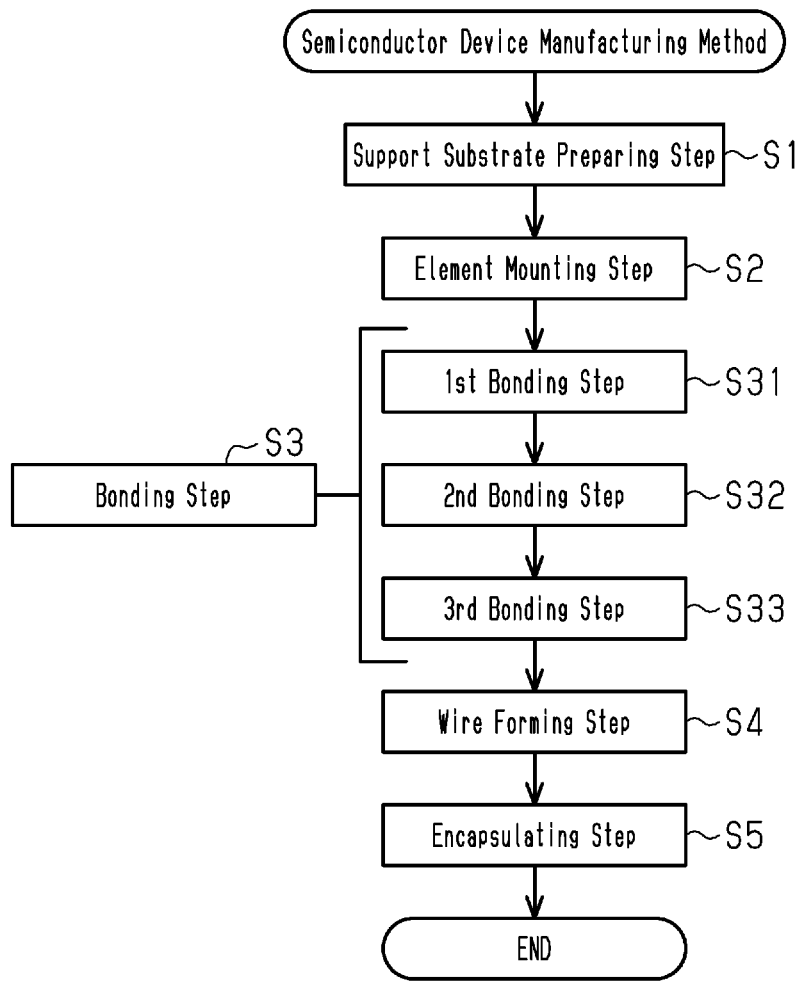
FIG. 24 is a flowchart showing a method for manufacturing the semiconductor device of the first embodiment.

As shown in FIG. 24, the method for manufacturing the semiconductor device 1A includes a support substrate preparing step (step S1), an element mounting step (step S2), a bonding step (step S3), a wire forming step (step S4), and an encapsulating step (step S5). In the present embodiment, the support substrate preparing step, the element mounting step, the bonding step, the wire forming step, and the encapsulating step are sequentially performed to manufacture the semiconductor device 1A.

In the support substrate preparing step, the support substrate 40 (refer to FIG. 2) is prepared. More specifically, the conductive member 42A and the conductive member 42B are separated from each other and bonded to the insulation substrate 41. The two insulation layers 43A and 43B and the support tables 29 are bonded to the conductive members 42A and 42B. The two gate layers 44A and 44B and the two detection layers 45A and 45B are bonded to the two insulation layers 43A and 43B.

In the element mounting step, the first semiconductor elements 30U are mounted on the conductive member 42A, and the second semiconductor elements 30L are mounted on the conductive member 42B. More specifically, silver paste is applied to a mount region of the conductive member 42A for the first semiconductor elements 30U. Also, silver paste is applied to a mount region of the conductive member 42B for the second semiconductor elements 30L. The applying process is, for example, screen printing that uses a mask. The element back surfaces 32 of the first semiconductor elements 30U are bonded to the mount region of the conductive member 42A for the first semiconductor elements 30U. The element back surfaces 32 of the second semiconductor elements 30L are bonded to the mount region of the conductive member 42B for the second semiconductor elements 30L. Instead of silver paste, solder or other conductive bonding materials may be used to mount the first semiconductor elements 30U and the second semiconductor elements 30L.

The bonding step includes a first bonding step (step S31), a second bonding step (step S32), and a third bonding step (step S33).

In the first bonding step, the input leads 21 and 22 and the output lead 23 are bonded to the support substrate 40. In the present embodiment, the input lead 21 is first bonded to the main surface 42sa of the conductive member 42A. This bonding process is performed, for example, using ultrasonic welding or laser beam welding. Next, the insulation member 28 is attached to the input lead 21. Then, the input lead 22 is attached to the insulation member 28. As a result, the insulation member 28 is held between the input lead 21 and the input lead 22 in the thickness-wise direction Z. The extensions 22c of the input lead 22 are mounted on the respective support tables 29. The output lead 23 is bonded to the conductive member 42B. This bonding process is performed, for example, using ultrasonic welding or laser beam welding. The order of the step of bonding the input leads 21 and 22 to the conductive member 42A and the step of bonding the output lead 23 to the conductive member 42B may be changed in any manner.

The second bonding step includes a first step and a second step. In the first step, a lead frame is prepared to form the two control leads 24A and 24B, the two detection leads 25A and 25B, the dummy leads 26, and the two side leads 27A and 27B. In the second step, the side leads 27A and 27B are bonded to the support substrate 40.

In the first step, a lead frame connected to the two control leads 24A and 24B, the two detection leads 25A and 25B, the dummy leads 26, and the two side leads 27A and 27B is prepared. In the lead frame, the terminal parts 24b, 25b, and 26b of the leads 24A, 24B, 25A, 25B, and 26 have not been bent to be L-shaped.

In the second step, the side lead 27A that is connected to the lead frame is bonded to the main surface 42sa of the conductive member 42A, and the side lead 27B that is connected to the lead frame is bonded to the main surface 42sb of the conductive member 42B. This bonding process is performed, for example, using ultrasonic welding or laser beam welding.

In the third bonding step, the first drive leads 60 are bonded to the first semiconductor elements 30U and the extensions 22c of the input lead 22, and the second drive leads 70 are bonded to the second semiconductor elements 30L and the conductive member 42B. The process for bonding the first drive leads 60 to the first semiconductor elements 30U, the process for bonding the first drive leads 60 to the extensions 22c, the process for bonding the second drive leads 70 to the second semiconductor elements 30L, and the process for bonding the second drive leads 70 to the conductive member 42B are the same. Hence, the process for bonding the first drive leads 60 to the first semiconductor elements 30U will be described in detail. The process for bonding the remaining components will not be described in detail.

Figure 25:
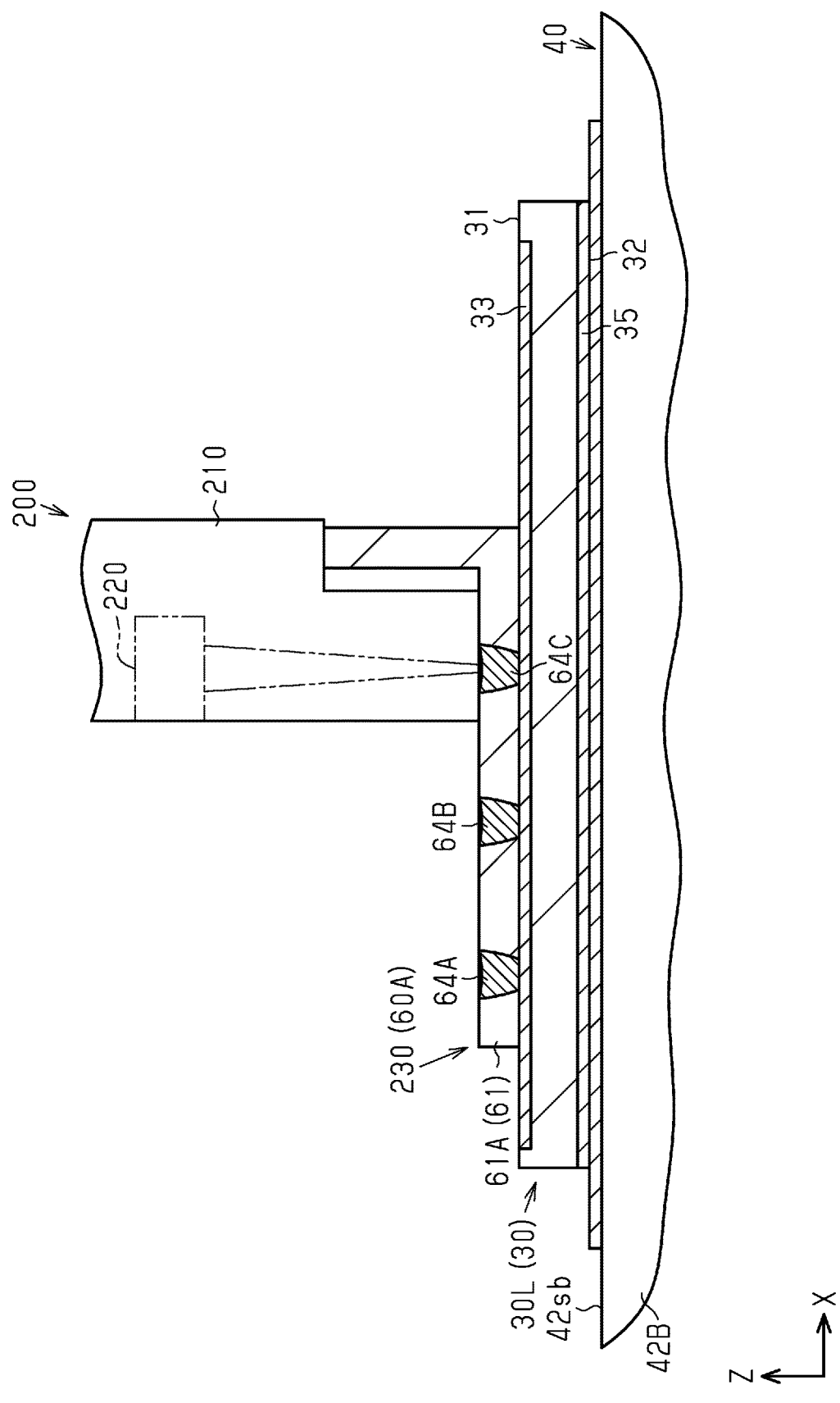
FIG. 25 is a diagram showing an example of a third joining step in the manufacturing method of the semiconductor device.
Figure 26:
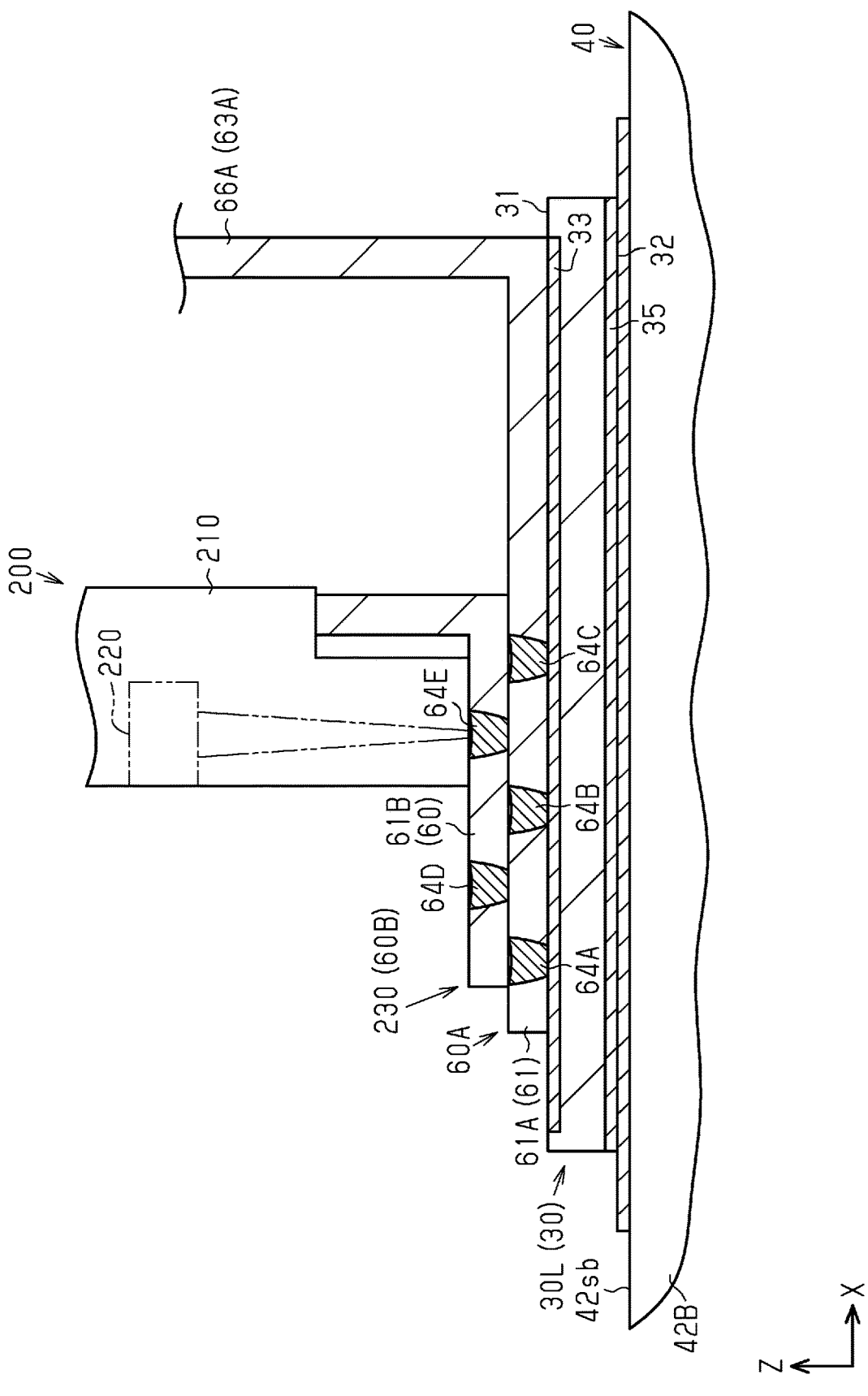
FIG. 26 is a diagram showing an example of a third joining step in the manufacturing method of the semiconductor device.
Figure 27:
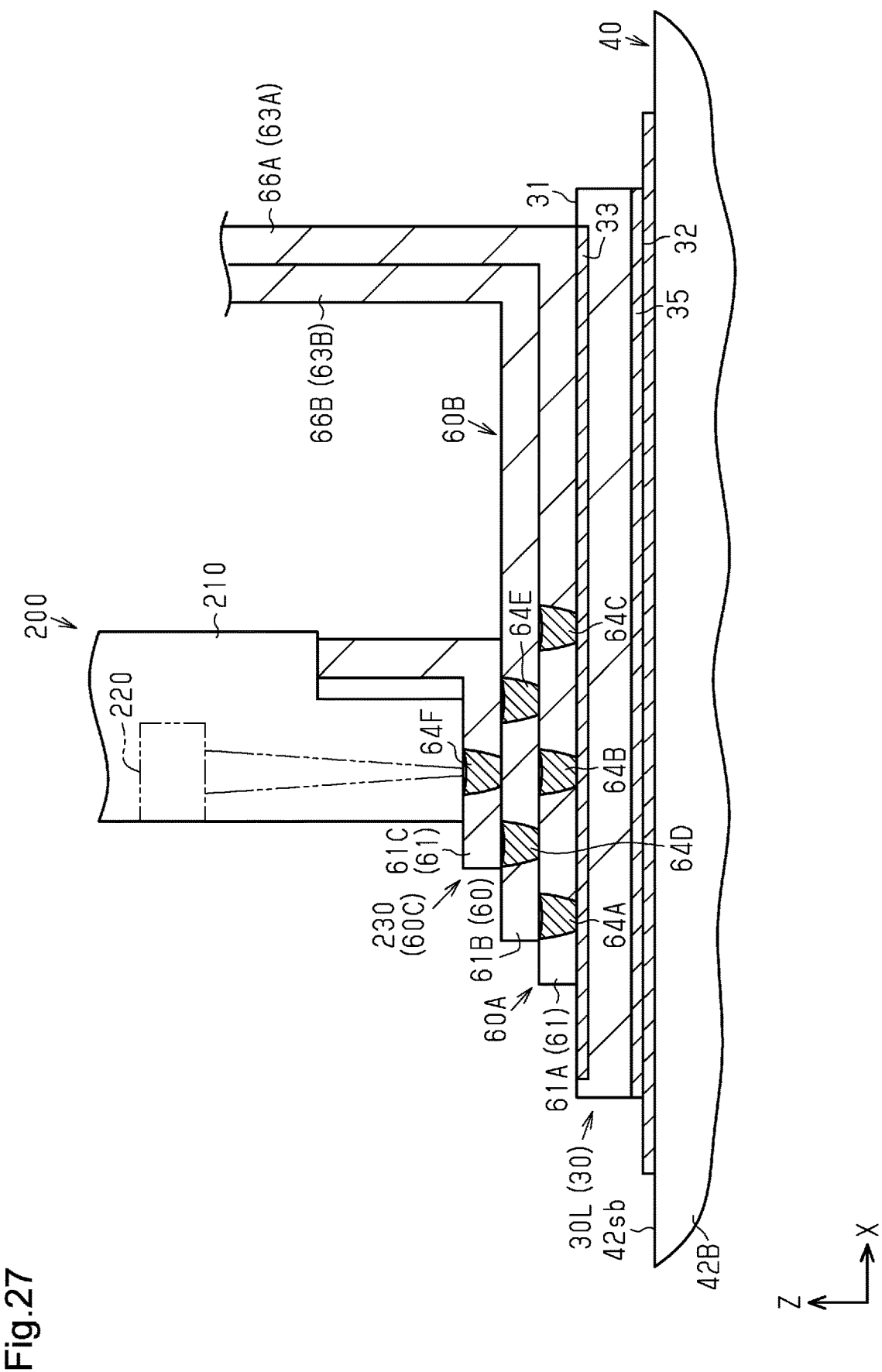
FIG. 27 is a diagram showing an example of a third joining step in the manufacturing method of the semiconductor device.

As shown in FIGS. 25 to 27, a bonding apparatus 200 is used to bond the first drive lead 60 to the source electrode 33 of the first semiconductor element 30U and the first drive lead 60. The bonding apparatus 200 includes a lead feeder 210 configured to supply a metal plate and a laser beam emitter 220 that performs laser beam welding. In the present embodiment, the laser beam emitter 220 is disposed in the lead feeder 210. The lead feeder 210 and the laser beam emitter 220 are configured to separately move in the width-wise direction X, the length-wise direction Y, and the thickness-wise direction Z.

In the third bonding step for the first drive lead 60, a drive electrode connecting step, a first joint forming step, and a conductor connecting step are sequentially performed to form the metal plate 60A.

FIG. 25 shows the drive electrode connecting step. In the drive electrode connecting step, the first connector 61A of the metal plate 60A of the first drive lead 60 is connected to the source electrode 33 of the first semiconductor element 30U.

As shown in FIG. 25, the lead feeder 210 moves in the width-wise direction X while supplying a metal ribbon material 230 to the source electrode 33 of the first semiconductor element 30U. The ribbon material 230 is, for example, Cu (copper). The laser beam emitter 220 emits a laser beam to the ribbon material 230, which is mounted on the source electrode 33, from a side opposite from the source electrode 33 in the thickness-wise direction Z. The laser beam scans the ribbon material 230 in the length-wise direction Y and is emitted to the ribbon material 230 in a straight line. As a result, the laser bonding portions 64A, 64B, and 64C are formed to bond the ribbon material 230 to the source electrode 33. More specifically, the lead feeder 210 moves in the width-wise direction X to mount a ribbon material 230 having a length in the width-wise direction X such that the laser bonding portion 64A is formable on the source electrode 33. After the lead feeder 210 stops moving in the width-wise direction X, the laser beam emitter 220 emits a laser beam to the ribbon material 230 mounted on the source electrode 33. As a result, the laser bonding portion 64A is formed. Then, the lead feeder 210 moves in the width-wise direction X while supplying the ribbon material 230 so that the length of the ribbon material 230 mounted on the source electrode 33 in the width-wise direction X is such that the laser bonding portion 64B is formable. After the lead feeder 210 stops moving in the width-wise direction X, the laser beam emitter 220 emits a laser beam to the ribbon material 230 mounted on the source electrode 33. As a result, the laser bonding portion 64B is formed. Then, the lead feeder 210 moves in the width-wise direction X while supplying the ribbon material 230 so that the length of the ribbon material 230 mounted on the source electrode 33 in the width-wise direction X is such that the laser bonding portion 64C is formable. After the lead feeder 210 stops moving in the width-wise direction X, the laser beam emitter 220 emits a laser beam to the ribbon material 230 mounted on the source electrode 33. As a result, the laser bonding portion 64C is formed. Through the above steps, the first connector 61A of the metal plate 60A is formed on the source electrode 33, and the first connector 61A is bonded to the source electrode 33.

In the first joint forming step, the joint 63A of the metal plate 60A is formed. More specifically, the lead feeder 210 moves away from the first semiconductor element 30U in the thickness-wise direction Z while supplying the ribbon material 230. As a result, the first vertical part 66A of the metal plate 60A is formed. Then, the lead feeder 210 moves in the width-wise direction X away from the first semiconductor element 30U while supplying the ribbon material 230. As a result, the horizontal part 68A of the metal plate 60A is formed. The lead feeder 210 moves toward the extension 22c in the thickness-wise direction Z while supplying the ribbon material 230. As a result, the second vertical part 67A of the metal plate 60A is formed.

In the conductor connecting step, the second connector 62A of the metal plate 60A is connected to the main surface 22cs of the extension 22c, that is, the drive conductor, of the input lead 22. More specifically, the lead feeder 210 moves in the width-wise direction X while supplying the ribbon material 230. As a result, the ribbon material 230 is mounted on the main surface 22cs of the extension 22c. The laser beam emitter 220 emits a laser beam to the ribbon material 230 mounted on the extension 22c. In the same manner as the first connector 61A, the bonding apparatus 200 repeats the supplying of the ribbon material 230 to the extension 22c and the laser beam bonding to form the laser bonding portions 65A, 65B, and 65C in the ribbon material 230. The lead feeder 210 cuts the ribbon material 230. As a result, the second connector 62A of the metal plate 60A is formed. That is, the metal plate 60A is bonded to the source electrode 33 of the second semiconductor element 30L and the main surface 22cs of the extension 22c of the input lead 22.

Next, in the third bonding step for the first drive lead 60, a first element stacking step, a second joint forming step, and a first conductor stacking step are sequentially performed to form the metal plate 60A. That is, the conductor connecting step is performed after the drive electrode connecting step before the first element stacking step.

FIG. 26 shows the first element stacking step. In the first element stacking step, the first connector 61B of the metal plate 60B of the first drive lead 60 is stacked on the first connector 61A of the metal plate 60A and connected to the first connector 61A.

As shown in FIG. 26, the lead feeder 210 moves in the width-wise direction X while supplying the ribbon material 230 to the first connector 61A of the metal plate 60A. The laser beam emitter 220 emits a laser beam to the ribbon material 230, which is mounted on the first connector 61A, from a side opposite from the first connector 61A in the thickness-wise direction Z. The laser beam scans the ribbon material 230 in the length-wise direction Y and is emitted to the ribbon material 230 in a straight line. As a result, the laser bonding portions 64D and 64E are formed to bond the ribbon material 230 to the first connector 61A. More specifically, the lead feeder 210 moves in the width-wise direction X while supplying the ribbon material 230 to a position spaced from the distal edge of the first connector 61A in the width-wise direction X. When the lead feeder 210 has moved to a position where the length of the ribbon material 230 in the width-wise direction X is such that the laser bonding portion 64D is formable in the ribbon material 230, the lead feeder 210 stops moving in the width-wise direction X. The laser beam emitter 220 emits a laser beam to the ribbon material 230 mounted on the first connector 61A. As a result, the laser bonding portion 64D is formed. Then, the lead feeder 210 moves in the width-wise direction X while supplying the ribbon material 230 so that the length of the ribbon material 230 mounted on the first connector 61A in the width-wise direction X is such that the laser bonding portion 64E is formable. After the lead feeder 210 stops moving in the width-wise direction X, the laser beam emitter 220 emits a laser beam to the ribbon material 230 mounted on the first connector 61A. As a result, the laser bonding portion 64E is formed. Through the above steps, the first connector 61B of the metal plate 60B is formed on the first connector 61A, and the first connector 61B is bonded to the first connector 61A.

In the second joint forming step, the joint 63B of the metal plate 60B is formed. More specifically, while the lead feeder 210 supplies the ribbon material 230 so as to contact the first vertical part 66A of the metal plate 60A in the width-wise direction X, the lead feeder 210 moves away from the first semiconductor element 30U in the thickness-wise direction Z. As a result, the first vertical part 66B of the metal plate 60B is formed. Then, while the lead feeder 210 supplies the ribbon material 230 so as to contact the horizontal part 68A of the metal plate 60A in the thickness-wise direction Z, the lead feeder 210 moves in the width-wise direction X away from the first semiconductor element 30U. As a result, the horizontal part 68C of the metal plate 60B is formed. Then, while the lead feeder 210 supplies the ribbon material 230 so as to contact the second vertical part 67A of the metal plate 60A in the width-wise direction X, the lead feeder 210 moves toward the extension 22c in the thickness-wise direction Z. As a result, the second vertical part 67B of the metal plate 60B is formed.

In the first conductor stacking step, the second connector 62B of the metal plate 60B of the first drive lead 60 is stacked on the second connector 62A of the metal plate 60A and connected to the second connector 62A. More specifically, the lead feeder 210 moves in the width-wise direction X while supplying the ribbon material 230. As a result, the ribbon material 230 is mounted on the second connector 62A. The laser beam emitter 220 emits a laser beam to the ribbon material 230 mounted on the second connector 62A. In the same manner as with the second connector 62A, the bonding apparatus 200 repeats the supplying of the ribbon material 230 to the second connector 62A and the laser beam bonding to form the laser bonding portions 65D and 65E in the ribbon material 230. The lead feeder 210 cuts the ribbon material 230. As a result, the second connector 62B of the metal plate 60B is formed. That is, the metal plate 60B is stacked on the metal plate 60A and bonded to the first connector 61A and the second connector 62A of the metal plate 60A.

Next, in the third bonding step for the first drive lead 60, a second element stacking step, a third joint forming step, and a second conductor stacking step are sequentially performed to form the metal plate 60A. That is, the first conductor stacking step is performed after the first element stacking step, before the second element stacking step.

FIG. 27 shows the second element stacking step. In the second element stacking step, the first connector 61C of the metal plate 60C of the first drive lead 60 is stacked on the first connector 61B of the metal plate 60B and connected to the first connector 61B.

As shown in FIG. 27, the lead feeder 210 moves in the width-wise direction X while supplying the ribbon material 230 to the first connector 61B of the metal plate 60B. The laser beam emitter 220 emits a laser beam to the ribbon material 230, which is mounted on the first connector 61B, from a side opposite from the first connector 61B in the thickness-wise direction Z. The laser beam scans the ribbon material 230 in the length-wise direction Y and is emitted to the ribbon material 230 in a straight line. As a result, the laser bonding portion 64F is formed to bond the ribbon material 230 to the first connector 61B. More specifically, the lead feeder 210 moves in the width-wise direction X while supplying the ribbon material 230 to a position spaced from the distal edge of the first connector 61B in the width-wise direction X. When the lead feeder 210 has moved to a position where the length of the ribbon material 230 in the width-wise direction X is such that the laser bonding portion 64F is formable in the ribbon material 230, the lead feeder 210 stops moving in the width-wise direction X. The laser beam emitter 220 emits a laser beam to the ribbon material 230 mounted on the first connector 61B. As a result, the laser bonding portion 64F is formed. Then, the lead feeder 210 moves in the width-wise direction X while supplying the ribbon material 230 until the length of the ribbon material 230 on the first connector 61A in the width-wise direction X equals the length of the first connector 61C in the width-wise direction X. As a result, the first connector 61C of the metal plate 60C is formed.

In the third joint forming step, the joint 63C of the metal plate 60C is formed. More specifically, while the lead feeder 210 supplies the ribbon material 230 so as to contact the first vertical part 66B of the metal plate 60B in the width-wise direction X, the lead feeder 210 moves away from the first semiconductor element 30U in the thickness-wise direction Z. As a result, the first vertical part 66C of the metal plate 60C is formed. Then, while the lead feeder 210 supplies the ribbon material 230 so as to contact the horizontal part 68B of the metal plate 60B in the thickness-wise direction Z, the lead feeder 210 moves in the width-wise direction X away from the first semiconductor element 30U. As a result, the horizontal part 68C of the metal plate 60C is formed. Then, while the lead feeder 210 supplies the ribbon material 230 so as to contact the second vertical part 67B of the metal plate 60B in the width-wise direction X, the lead feeder 210 moves toward the extension 22c in the thickness-wise direction Z. As a result, the second vertical part 67C of the metal plate 60C is formed.

In the second conductor stacking step, the second connector 62C of the metal plate 60C of the first drive lead 60 is stacked on the second connector 62B of the metal plate 60B and connected to the second connector 62B. More specifically, the lead feeder 210 moves in the width-wise direction X while supplying the ribbon material 230. As a result, the ribbon material 230 is mounted on the second connector 62B. The laser beam emitter 220 emits a laser beam to the ribbon material 230 mounted on the second connector 62B. As a result, the laser bonding portion 65F is formed in the ribbon material 230. Then, the lead feeder 210 moves in the width-wise direction X while supplying the ribbon material 230 until the length of the ribbon material 230 on the second connector 62B in the width-wise direction X equals the length of the second connector 62C in the width-wise direction X. Subsequently, the ribbon material 230 is cut. As a result, the second connector 62C of the metal plate 60C is formed. That is, the metal plate 60C is stacked on the metal plate 60B and bonded to the first connector 61B and the second connector 62B of the metal plate 60B. Through the steps, the first drive lead 60 is formed.

In the third bonding step, the second drive lead 70 is formed in the same manner as the first drive lead 60. The step will be briefly described. The bonding apparatus 200 forms the metal plate 70A that bonds the source electrode 33 of the first semiconductor element 30U to the main surface 42sb of the conductive member 42B. Then, the metal plate 70B is stacked on the metal plate 70A and bonded to the first connector 71A and the second connector 72A of the metal plate 70A. Finally, the metal plate 70C is stacked on the metal plate 70B and bonded to the first connector 71B and the second connector 72B of the metal plate 70B.

In the wire forming step, the gate layers 44A and 44B and the detection layers 45A and 45B are respectively connected to the semiconductor elements 30, the control leads 24A and 24B, and the detection leads 25A and 25B by the wires 51 to 58. In other words, the connecting steps are steps of forming the wires 51 to 58. The wires 51 to 58 are formed through wire bonding.

In the wire forming step, the first control wires 51 are formed to connect the gate electrodes 34 of the first semiconductor elements 30U to the gate layer 44A, and the second control wires 52 are formed to connect the gate electrodes 34 of the second semiconductor elements 30L to the gate layer 44B. The first detection wires 55 are formed to connect the source electrodes 33 of the first semiconductor elements 30U to the detection layer 45A, and the second detection wires 56 are formed to connect the source electrodes 33 of the second semiconductor elements 30L to the detection layer 45B. The first connection wire 53 is formed to connect the gate layer 44A to the control lead 24A, and the second connection wire 57 is formed to connect the gate layer 44A to the control lead 24B. The first connection wire 54 is formed to connect the detection layer 45A to the detection lead 25A, and the second connection wire 58 is formed to connect the detection layer 45B to the detection lead 25B. The order forming the wires 51 to 58 is not limited to that described above and may be changed in any manner.

In the encapsulating step, the encapsulation resin 10 is formed, for example, from a black epoxy resin through transfer molding. In the present embodiment, the encapsulation resin 10 is formed to cover part of the input leads 21 and 22, part of the output lead 23, part of the two control leads 24A and 24B, part of the two detection leads 25A and 25B, part of the dummy leads 26, the semiconductor elements 30, part of the support substrate 40 that excludes the substrate back surface 41b of the insulation substrate 41, the wires 51 to 58, the first drive leads 60, and the second drive leads 70. The formed encapsulation resin 10 exposes the terminal parts 21b and 22b of the input leads 21 and 22, the terminal part 23b of the output lead 23, the terminal parts 24b of the control leads 24A and 24B, the terminal parts 25b of the detection leads 25A and 25B, the terminal parts 26b of the dummy leads 26, and the substrate back surface 41b of the insulation substrate 41.

Subsequently, unwanted portions of the leads 20 are cut from the lead frame. The control leads 24A and 24B, the detection leads 25A and 25B, and the dummy leads 26 are bent. As a result, the semiconductor device 1A is manufactured. The manufacturing method described above is an example of a method for manufacturing a semiconductor device and is not restrictive. The order may be switched where appropriate.

Operation

The operation of the semiconductor device 1A of the present embodiment will now be described.

Recent development in a semiconductor element capable of supplying a large current has been promoted by, for example, SiC.

However, the entire semiconductor device, that is, components of the semiconductor device other than the semiconductor element, may not have been configured for a large current in the same manner as the semiconductor element. In particular, there is room for improvement in connection lines extending from the semiconductor element to terminals for a large current.

Figure 28:
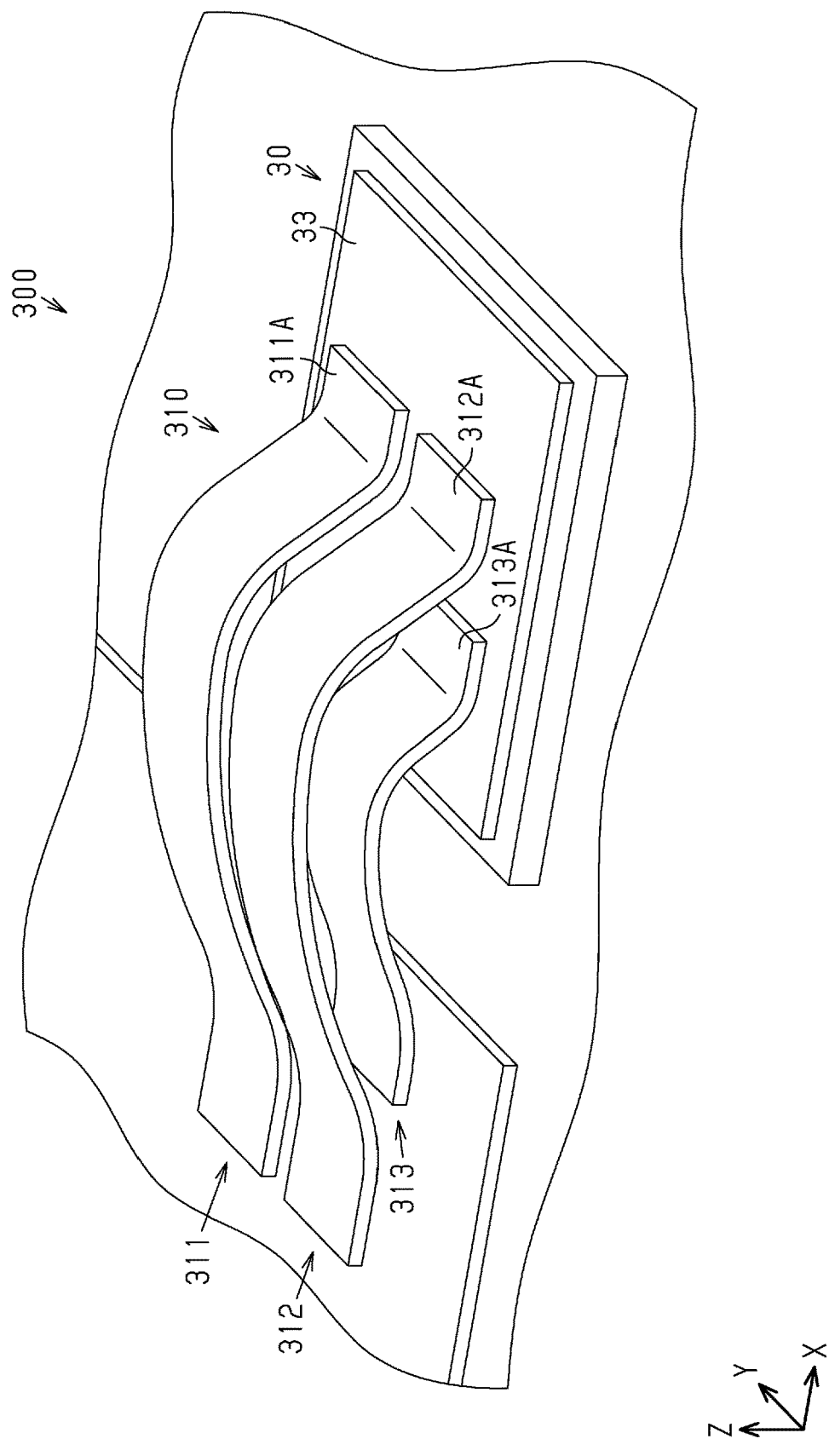
FIG. 28 is a perspective view showing a structure that joins a semiconductor element to drive leads in a first comparative example of a semiconductor device.
Figure 29:
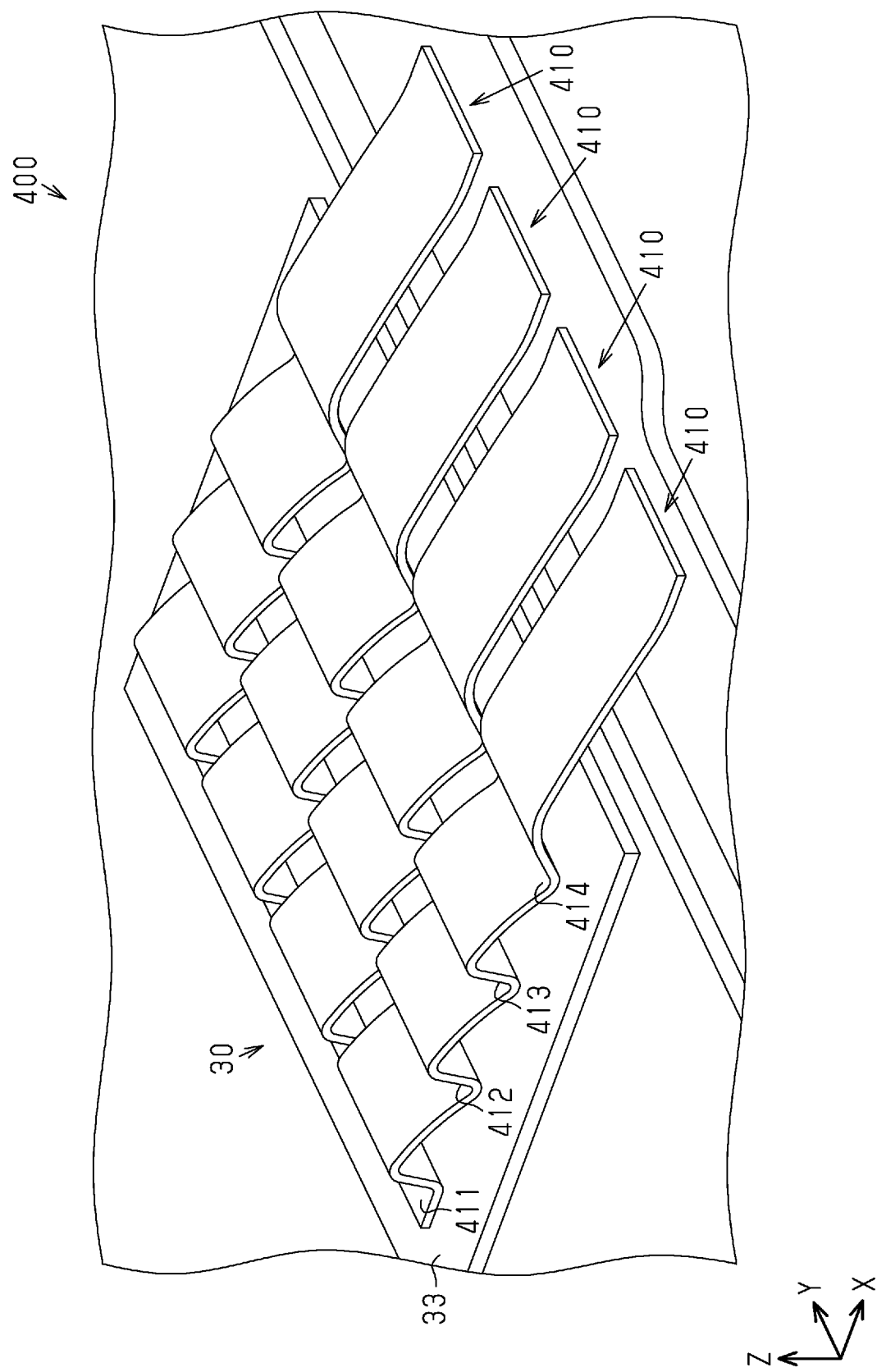
FIG. 29 is a perspective view showing a structure that joins a semiconductor element to drive leads in a second comparative example of a semiconductor device.

FIGS. 28 and 29 show comparative examples of a semiconductor device having room for improvement in its configuration for a large current. FIG. 28 shows a structure for bonding three drive leads 310 to the semiconductor element 30 in a first comparative example of a semiconductor device 300. FIG. 29 shows a structure for bonding four drive leads 410 to the semiconductor element 30 in a second comparative example of a semiconductor device 400.

As shown in FIG. 28, in the semiconductor device 300, the drive leads 310 are bonded to the source electrode 33 of the semiconductor element 30. The drive leads 310 include two first drive leads 311 and 312 and a second drive lead 313. The first drive leads 311 and 312 and the second drive lead 313 are each formed of a single metal plate. In plan view, the first drive leads 311 and 312 and the second drive lead 313 are belt-shaped and extend in the width-wise direction X. The first drive leads 311 and 312 are disposed adjacent to each other in the length-wise direction Y. The second drive lead 313 is disposed to overlap the first drive lead 312 as viewed in the thickness-wise direction Z. The second drive lead 313 is disposed closer to the semiconductor element 30 than the first drive lead 312 in the thickness-wise direction Z.

The first drive leads 311 and 312 and the second drive lead 313 are bonded to the source electrode 33 by ultrasonic welding. The first drive lead 311 has an element-side connector 311A bonded to the source electrode 33. The first drive lead 312 has an element-side connector 312A bonded to the source electrode 33. The second drive lead 313 has an element-side connector 313A bonded to the source electrode 33. Each of the element-side connectors 311A, 312A, and 313A is less than the first connector 61 of the first drive lead 60 in the present embodiment in the dimension in the width-wise direction X. Thus, in plan view, the element-side connectors 311A, 312A, and 313A of the first drive leads 311 and 312 and the second drive lead 313 occupy a small portion of the area of the source electrode 33.

To solve this problem, as shown in FIG. 29, in the semiconductor device 400, each drive lead 410 is bonded to the source electrode 33 of the semiconductor element 30 at multiple locations. As shown in FIG. 29, each drive lead 410 includes four element-side connectors 411, 412, 413, and 414 separated from each other in the width-wise direction X. In the drive lead 410, the part between the four element-side connector 411 and the four element-side connector 412 in the width-wise direction X, the part between the four element-side connector 412 and the four element-side connector 413 in the width-wise direction X, and the part between the four element-side connector 413 and the four element-side connector 414 in the width-wise direction X are separated from the source electrode 33 in the thickness-wise direction Z. The parts separated from the source electrode 33 in the thickness-wise direction Z need to be formed so that the metal plate forming the drive lead 410 vibrates in the width-wise direction X when ultrasonic welding is performed. Thus, in plan view, the ratio of the area occupied by the four element-side connectors 411 to 414 to the area of the source electrode 33 is increased from the ratio of the area occupied by the element-side connectors 311A, 312A, 313A of the first drive leads 311 and 312 and the second drive lead 313 to the area of the source electrode 33. However, there is still room for improvement.

In addition, when the drive leads 310 and 410 are bonded to the source electrode 33 by ultrasonic welding, the load applied to the source electrode 33 is increased. The element-side connectors 311A to 313A and 411 to 414 bonded to the source electrode 33 by ultrasonic welding each have irregularities in a side view of the drive leads 310 and 410 in the length-wise direction Y. This is because when ultrasonic welding is performed, vibration is applied to the metal plate while the metal plate is pressed against the source electrode 33 until composition deformation occurs in the metal plate. As a result, it is difficult to stack metal plates in the thickness-wise direction Z to form the element-side connectors 311A to 313A and 411 to 414. Even if the element-side connector 311A to 313A and 411 to 414 were formed by stacking metal plates in the thickness-wise direction Z, the element-side connectors 311A to 313A and 411 to 414 would have a small area of contact between metal plates that are adjacent in the thickness-wise direction Z.

In this regard, in the present embodiment, the first drive lead 60 is bonded to the source electrode 33 of the first semiconductor element 30U by laser beam welding, and the second drive lead 70 is bonded to the source electrode 33 of the second semiconductor element 30L by laser beam welding. Thus, the almost entire surface of the first connector 61 of the first drive lead 60 is in contact with the source electrode 33 and bonded to the source electrode 33. This increases the area of the first connector 61 (61A) in the area of the source electrode 33. In addition, a mechanical load on the source electrode 33 is smaller when laser beam welding is performed than when ultrasonic welding is performed. This reduces the adverse effects on the source electrode 33 caused by a mechanical load on the source electrode 33

Advantages

The semiconductor device 1A of the present embodiment has the following advantages.

(1-1) The first drive lead 60 includes the metal plate 60A connected to the second semiconductor element 30L and the metal plate 60B stacked on the metal plate 60A. The metal plate 60A includes the first connector 61A connected to the source electrode 33 of the second semiconductor element 30L. The metal plate 60B includes the first connector 61B connected to the first connector 61A. The first connector 61A and the first connector 61B are stacked in the thickness-wise direction Z. This structure increases the area of the first connector 61 of the first drive lead 60 bonded to the source electrode 33 and also increases the area of a cross section obtained by cutting the first connector 61 of the first drive lead 60 along a plane extending in the thickness-wise direction Z and the length-wise direction Y. Thus, the upper limit value of current that is allowed to flow (allowable current amount) from the source electrode 33 of the second semiconductor element 30L to the first drive lead 60 is increased.

The second drive lead 70 includes the metal plate 70A connected to the first semiconductor element 30U and the metal plate 70B stacked on the metal plate 70A. The metal plate 70A includes the first connector 71A connected to the source electrode 33 of the first semiconductor element 30U. The metal plate 70B includes the first connector 71B connected to the first connector 71A. The first connector 71A and the first connector 71B are stacked in the thickness-wise direction Z. This structure increases the area of a cross section of the first connector 71 of the second drive lead 70. The area of a cross section obtained by cutting the first connector 71 of the second drive lead 70 along a plane extending in the thickness-wise direction Z and the length-wise direction Y is increased. Thus, the upper limit value of current that is allowed to flow (allowable current amount) from the source electrode 33 of the first semiconductor element 30U to the second drive lead 70 is increased.

(1-2) The first drive lead 60 includes the metal plate 60C stacked on the metal plate 60B. The metal plate 60C includes the first connector 61C connected to the first connector 61B of the metal plate 60B. The first connector 61B and the first connector 61C are stacked in the thickness-wise direction Z. This structure further increases the area of a cross section obtained by cutting the first connector 61 of the first drive lead 60 along a plane extending in the thickness-wise direction Z and the length-wise direction Y. Thus, the tolerance amount of current flowing from the source electrode 33 of the second semiconductor element 30L to the first drive lead 60 is further increased.

The second drive lead 70 includes the metal plate 70C stacked on the metal plate 70B. The metal plate 70C includes the first connector 71C connected to the first connector 71B of the metal plate 70B. The first connector 71B and the first connector 71C are stacked in the thickness-wise direction Z. This structure further increases the area of a cross section obtained by cutting the first connector 71 of the second drive lead 70 along a plane extending in the thickness-wise direction Z and the length-wise direction Y. Thus, the tolerance amount of current flowing from the source electrode 33 of the first semiconductor element 30U to the second drive lead 70 is further increased.

(1-3) In the first drive lead 60, the laser bonding portions 64A, 64B, and 64C formed in the first connector 61A are disposed so as not to overlap the laser bonding portions 64D and 64E formed in the first connector 61B as viewed in the thickness-wise direction Z. In this structure, the first connectors 61A and 61B of the metal plates 60A and 60B, which are adjacent to each other in the thickness-wise direction Z, are formed to be flat except the laser bonding portions 64A to 64E. Thus, the area of contact of the first connector 61A with the first connector 61B is increased. This allows current to smoothly flow from the metal plate 60A to the metal plate 60B.

In the second drive lead 70, the laser bonding portions 74A, 74B, and 74C formed in the first connector 71A are disposed so as not to overlap the laser bonding portions 74D and 74E formed in the first connector 71B as viewed in the thickness-wise direction Z. In this structure, the first connectors 71A and 71B of the metal plates 70A and 70B, which are adjacent to each other in the thickness-wise direction Z, are formed to be flat except the laser bonding portions 74A to 74E. Thus, the area of contact of the first connector 71A with the first connector 71B is increased. This allows current to smoothly flow from the metal plate 70A to the metal plate 70B.

(1-4) In the first drive lead 60, the laser bonding portion 64F formed in the first connector 61C is disposed so as not to overlap the laser bonding portions 64D and 64E formed in the first connector 61B as viewed in the thickness-wise direction Z. In this structure, the first connector 61B of the metal plate 60B is formed to be flat except the laser bonding portions 64D and 64E. Thus, when the flat surface of the first connector 61B of the metal plate 60B is in contact with the first connector 61C of the metal plate 60C, the first connectors 61B and 61C are bonded by the laser bonding portion 64F. The first connector 61B is readily bonded to the first connector 61C.

In the second drive lead 70, the laser bonding portion 74F formed in the first connector 71C is disposed so as not to overlap the laser bonding portions 74D and 74E formed in the first connector 71B as viewed in the thickness-wise direction Z. In this structure, the first connector 71B of the metal plate 70B is formed to be flat except the laser bonding portions 74D and 74E. Thus, when the flat surface of the first connector 71B of the metal plate 70B is in contact with the first connector 71C of the metal plate 70C, the first connectors 71B and 71C are bonded by the laser bonding portion 74F. The first connector 71B is readily bonded to the first connector 71C.

(1-5) As viewed in the thickness-wise direction Z, the laser bonding portion 64F in the first connector 61C of the first drive lead 60 overlaps the laser bonding portion 64B of the first connector 61A. In this structure, as viewed in the thickness-wise direction Z, the laser bonding portion 64B is disposed so as not to overlap the laser bonding portions 64D and 64E in the first connector 61B. The laser bonding portion 64F is aligned with the laser bonding portion 64B, so that overlapping of the laser bonding portion 64F with the laser bonding portions 64D and 64E is avoided.

As viewed in the thickness-wise direction Z, the laser bonding portion 74F in the first connector 71C of the second drive lead 70 overlaps the laser bonding portion 74B in the first connector 71A. In this structure, the laser bonding portion 74B is disposed so as not to overlap the laser bonding portions 74D and 74E in the first connector 71B as viewed in the thickness-wise direction Z. The laser bonding portion 74F is aligned with the laser bonding portion 74B, so that overlapping of the laser bonding portion 74F with the laser bonding portions 74D and 74E is avoided.

(1-6) The laser bonding portions 64D and 64E in the first connector 61B of the metal plate 60B are less in number than the laser bonding portions 64A, 64B, and 64C in the first connector 61A of the metal plate 60A. The laser bonding portion 64F in the first connector 61C of the metal plate 60C is less in number than the laser bonding portions 64D and 64E in the first connector 61B. In this structure, the number of laser bonding portions is reduced so that the amount of work for forming the laser bonding portions is reduced. Thus, the amount of work in the third bonding step is reduced.

The laser bonding portions 74D and 74E in the first connector 71B of the metal plate 70B are less in number than the laser bonding portions 74A, 74B, and 74C in the first connector 71A of the metal plate 70A. The laser bonding portion 74F in the first connector 71C of the metal plate 70C is less in number than the laser bonding portions 74D and 74E of the first connector 71B. In this structure, the number of laser bonding portions is reduced so that the amount of work for forming the laser bonding portions is reduced. Thus, the amount of work in the third bonding step is reduced.

(1-7) In the first drive lead 60, the metal plate 60A includes the second connector 62A connected to the main surface 22cs of the extension 22c of the input lead 22, and the metal plate 60B includes the second connector 62B connected to the second connector 62A. The second connector 62A and the second connector 62B are stacked in the thickness-wise direction Z. This structure increases the area of the second connector 62 of the first drive lead 60 bonded to the main surface 22cs of the extension 22c and also increases the area of a cross section obtained by cutting the second connector 62 of the first drive lead 60 along a plane extending in the thickness-wise direction Z and the length-wise direction Y. Thus, the upper limit value of current that is allowed to flow (allowable current amount) from the first drive lead 60 to the extension 22c is increased.

In the second drive lead 70, the metal plate 70A includes the second connector 72A connected to the main surface 42sb of the conductive member 42B, and the metal plate 70B includes the second connector 72B connected to the second connector 72A. The second connector 72A and the second connector 72B are stacked in the thickness-wise direction Z. This structure increases the area of a cross section of the second connector 72 of the second drive lead 70. The area of a cross section obtained by cutting the second connector 72 along a plane extending in the thickness-wise direction Z and the length-wise direction Y is increased. Thus, the upper limit value of current that is allowed to flow (allowable current amount) from the second drive lead 70 to the conductive member 42B is increased.

(1-8) The metal plate 60C of the first drive lead 60 includes the second connector 62C connected to the second connector 62B of the metal plate 60B. The second connector 62B and the second connector 62C are stacked in the thickness-wise direction Z. This structure further increases the area of a cross section obtained by cutting the second connector 62 of the first drive lead 60 along a plane extending in the thickness-wise direction Z and the length-wise direction Y. Thus, the tolerance amount of current flowing from the first drive lead 60 to the extension 22c is further increased.

The metal plate 70C of the second drive lead 70 includes the second connector 72C connected to the second connector 72B of the metal plate 70B. The second connector 72B and the second connector 72C are stacked in the thickness-wise direction Z. This structure further increases the area of a cross section obtained by cutting the second connector 72 of the second drive lead 70 along a plane extending in the thickness-wise direction Z and the length-wise direction Y. Thus, the tolerance amount of current flowing from the second drive lead 70 to the conductive member 42B is further increased.

(1-9) In the first drive lead 60, the laser bonding portions 65A, 65B, and 65C formed in the second connector 62A are disposed so as not to overlap the laser bonding portions 65D and 65E formed in the second connector 62B as viewed in the thickness-wise direction Z. In this structure, the second connectors 62A and 62B of the metal plates 60A and 60B, which are adjacent to each other in the thickness-wise direction Z, are formed to be flat except the laser bonding portions 65A to 65E. Thus, the area of contact of the second connector 62A with the second connector 62B is increased. This allows current to smoothly flow from the metal plate 60A to the metal plate 60B.

In the second drive lead 70, the laser bonding portions 75A, 75B, and 75C formed in the second connector 72A are disposed so as not to overlap the laser bonding portions 75D and 75E formed in the second connector 72B as viewed in the thickness-wise direction Z. In this structure, the second connectors 72A and 72B of the metal plates 70A and 70B, which are adjacent to each other in the thickness-wise direction Z, are formed to be flat except the laser bonding portions 75A to 75E. Thus, the area of contact of the second connector 72A with the second connector 72B is increased. This allows current to smoothly flow from the metal plate 70A to the metal plate 70B.

(1-10) In the first drive lead 60, the laser bonding portion 64F formed in the second connector 62C is disposed so as not to overlap the laser bonding portions 65D and 65E formed in the second connector 62B as viewed in the thickness-wise direction Z. In this structure, the second connector 62B of the metal plate 60B is formed to be flat except the laser bonding portions 65D and 65E. Thus, when the flat surface of the second connector 62B of the metal plate 60B is in contact with the second connector 62C of the metal plate 60C, the second connectors 62B and 62C are bonded by the laser bonding portion 65F. The second connector 62B is readily bonded to the second connector 62C.

In the second drive lead 70, the laser bonding portion 75F formed in the second connector 72C is disposed so as not to overlap the laser bonding portions 75D and 75E formed in the second connector 72B as viewed in the thickness-wise direction Z. In this structure, the second connector 72B of the metal plate 70B is formed to be flat except the laser bonding portions 75D and 75E. Thus, when the flat surface of the second connector 72B of the metal plate 70B is in contact with the second connector 72C of the metal plate 70C, the second connectors 72B and 72C are bonded by the laser bonding portion 75F. The second connector 72B is readily bonded to the second connector 72C.

(1-11) As viewed in the thickness-wise direction Z, the laser bonding portion 65F in the second connector 62C of the first drive lead 60 overlaps the laser bonding portion 65B in the second connector 62A. In this structure, as viewed in the thickness-wise direction Z, the laser bonding portion 65B is disposed so as not to overlap the laser bonding portions 65D and 65E in the second connector 62B. The laser bonding portion 65F is aligned with the laser bonding portion 65B, so that overlapping of the laser bonding portion 65F with the laser bonding portions 65D and 65E is avoided.

As viewed in the thickness-wise direction Z, the laser bonding portion 75F in the second connector 72C of the second drive lead 70 overlaps the laser bonding portion 75B in the second connector 72A. In this structure, as viewed in the thickness-wise direction Z, the laser bonding portion 75B is disposed so as not to overlap the laser bonding portions 75D and 75E in the second connector 72B. The laser bonding portion 75F is aligned with the laser bonding portion 75B, so that overlapping of the laser bonding portion 75F with the laser bonding portions 75D and 75E is avoided.

(1-12) The laser bonding portions 65D and 65E in the second connector 62B of the metal plate 60B are less in number than the laser bonding portions 65A, 65B, and 65C in the second connector 62A of the metal plate 60A. The laser bonding portion 65F in the second connector 62C of the metal plate 60C is less in number than the laser bonding portions 65D and 65E in the second connector 62B. In this structure, the number of laser bonding portions is reduced so that the amount of work for forming the laser bonding portions is reduced. Thus, the amount of work in the third bonding step is reduced.

The laser bonding portions 75D and 75E in the second connector 72B of the metal plate 70B are less in number than the laser bonding portions 75A, 75B, and 75C in the second connector 72A of the metal plate 70A. The laser bonding portion 75F in the second connector 72C of the metal plate 70C is less in number than the laser bonding portions 75D and 75E in the second connector 72B. In this structure, the number of laser bonding portions is reduced so that the amount of work for forming the laser bonding portions is reduced. Thus, the amount of work in the third bonding step is reduced.

(1-13) The joint 63A of the metal plate 60A and the joint 63B of the metal plate 60B are stacked. Since the joint 63A is in contact with the joint 63B, for example, encroachment of a portion of the encapsulation resin 10 between the joint 63A and the joint 63B is restricted in the encapsulating step. This limits deformation and separation of the metal plate 60A and the metal plate 60B caused by the difference in thermal expansion coefficient between the encapsulation resin 10 and the metal plates 60A and 60B. Thus, decreases in the reliability of the first drive lead 60 are limited.

The joint 63B of the metal plate 60B and the joint 63C of the metal plate 60C are also stacked. Since the joint 63B is in contact with the joint 63C, for example, encroachment of a portion of the encapsulation resin 10 between the joint 63B and the joint 63C is restricted in the encapsulating step. This limits deformation and separation of the metal plate 60B and the metal plate 60C caused by the difference in thermal expansion coefficient between the encapsulation resin 10 and the metal plates 60B and 60C. Thus, decreases in the reliability of the first drive lead 60 are limited.

The joint 73A of the metal plate 70A and the joint 73B of the metal plate 70B are stacked. Since the joint 73A is in contact with the joint 73B, for example, encroachment of a portion of the encapsulation resin 10 between the joint 73A and the joint 73B is restricted in the encapsulating step. This limits deformation and separation of the metal plate 70A and the metal plate 70B caused by the difference in thermal expansion coefficient between the encapsulation resin 10 and the metal plates 70A and 70B. Thus, decreases in the reliability of the second drive leads 70 are limited.

The joint 73B of the metal plate 70B and the joint 73C of the metal plate 70C are also stacked. Since the joint 73B is in contact with the joint 73C, for example, encroachment of a portion of the encapsulation resin 10 between the joint 73B and the joint 73C is restricted in the encapsulating step. This limits deformation and separation of the metal plate 70B and the metal plate 70C caused by the difference in thermal expansion coefficient between the encapsulation resin 10 and the metal plates 70B and 70C. Thus, decreases in the reliability of the second drive leads 70 are limited.

(1-14) The first connector 61A of the metal plate 60A is bonded to the source electrode 33 of the second semiconductor element 30L by laser beam processing (laser beam welding). With this configuration, the load applied to the source electrode 33 during the bonding of the first connector 61A to the source electrode 33 is smaller than with a configuration in which the first connector 61A is bonded to the source electrode 33 by, for example, ultrasonic welding. Thus, the decreases in the reliability of the second semiconductor element 30L are limited.

In addition, the area of contact of the source electrode 33 of the second semiconductor element 30L with the first connector 61A is increased as compared to, for example, when the first connector 61A is bonded to the source electrode 33 by ultrasonic welding. Thus, the tolerance amount of current flowing from the source electrode 33 of the second semiconductor element 30L to the first drive lead 60 is increased.

The first connector 71A of the metal plate 70A is bonded to the source electrode 33 of the first semiconductor element 30U by laser beam processing (laser beam welding). With this configuration, the load applied to the source electrode 33 during the bonding of the first connector 71A to the source electrode 33 is smaller than with a configuration in which the first connector 71A is bonded to the source electrode 33 by, for example, ultrasonic welding. Thus, the decreases in the reliability of the first semiconductor element 30U are limited.

In addition, the area of contact of the source electrode 33 of the first semiconductor element 30U with the first connector 71A is increased as compared to, for example, when the first connector 71A is bonded to the source electrode 33 by ultrasonic welding. Thus, the tolerance amount of current flowing from the source electrode 33 of the first semiconductor element 30U to the second drive lead 70 is increased.

(1-15) The first connector 61B of the metal plate 60B is bonded to the first connector 61A by laser beam processing (laser beam welding). With this configuration, when the first connector 61B is bonded to the first connector 61A, the load applied to the source electrode 33 of the second semiconductor element 30L via the first connector 61A is small. Thus, the decreases in the reliability of the second semiconductor element 30L are limited.

In addition, the area of contact of the first connector 61A with the first connector 61B is increased as compared to, for example, when the first connector 61B is bonded to the first connector 61A by ultrasonic welding. This allows current to smoothly flow from the first connector 61A to the first connector 61B.

The first connector 71B of the metal plate 70B is bonded to the first connector 71A by laser beam processing (laser beam welding). With this configuration, when the first connector 71B is bonded to the first connector 71A, the load applied to the source electrode 33 of the first semiconductor element 30U via the first connector 71A is small. Thus, the decreases in the reliability of the first semiconductor element 30U are limited.

In addition, the area of contact of the first connector 71A with the first connector 71B is increased as compared to, for example, when the first connector 71B is bonded to the first connector 71A by ultrasonic welding. This allows current to smoothly flow from the first connector 71A to the first connector 71B.

(1-16) The first connector 61C of the metal plate 60C is bonded to the first connector 61B by laser beam processing (laser beam welding). With this configuration, when the first connector 61C is bonded to the first connector 61B, the load applied to the source electrode 33 of the second semiconductor element 30L via the first connectors 61A and 61B is small. Thus, the decreases in the reliability of the second semiconductor element 30L are limited.

In addition, the area of contact of the first connector 61B with the first connector 61C is increased as compared to, for example, when the first connector 61C is bonded to the first connector 61B by ultrasonic welding. This allows current to smoothly flow from the first connector 61B to the first connector 61C.

The first connector 71C of the metal plate 70B is bonded to the first connector 71B by laser beam processing (laser beam welding). With this configuration, when the first connector 71C is bonded to the first connector 71B, the load applied to the source electrode 33 of the first semiconductor element 30U via the first connectors 71A and 71B is small. Thus, the decreases in the reliability of the first semiconductor element 30U are limited.

In addition, the area of contact of the first connector 71B with the first connector 71C is increased as compared to, for example, when the first connector 71C is bonded to the first connector 71B by ultrasonic welding. This allows current to smoothly flow from the first connector 71B to the first connector 71C.

(1-17) The second connector 62A of the metal plate 60A is bonded to the main surface 22cs of the extension 22c of the input lead 22 by laser beam processing (laser beam welding). With this configuration, the area of contact of the main surface 22cs of the extension 22c with the second connector 62A is increased as compared to, for example, when the second connector 62A is bonded to the main surface 22cs of the extension 22c by ultrasonic welding. Thus, the tolerance amount of current flowing from the first drive lead 60 to the input lead 22 is increased.

The second connector 72A of the metal plate 70A is bonded to the main surface 42sb of the conductive member 42B by laser beam processing (laser beam welding). With this configuration, the area of contact of the main surface 42sb of the conductive member 42B with the second connector 72A is increased as compared to, for example, the second connector 72A is bonded to the main surface 42sb of the conductive member 42B by ultrasonic welding. Thus, the tolerance amount of current flowing from the second drive lead 70 to the conductive member 42B is increased.

(1-18) The second connector 62B of the metal plate 60B is bonded to the second connector 62A by laser beam processing (laser beam welding). With this configuration, the area of contact of the second connector 62A with the second connector 62B is increased as compared to, for example, when the second connector 62B is bonded to the second connector 62A by ultrasonic welding. This allows current to smoothly flow from the second connector 62B to the second connector 62A.

The second connector 72B of the metal plate 70B is bonded to the second connector 72A by laser beam processing (laser beam welding). With this configuration, the area of contact of the second connector 72A with the second connector 72B is increased as compared to, for example, when the second connector 72B is bonded to the second connector 72A by ultrasonic welding. This allows current to smoothly flow from the second connector 72B to the second connector 72A.

(1-19) The second connector 62C of the metal plate 60C is bonded to the second connector 62B by laser beam processing (laser beam welding). With this configuration, the area of contact of the second connector 62B with the second connector 62C is increased as compared to, for example, when the second connector 62C is bonded to the second connector 62B by ultrasonic welding. This allows current to smoothly flow from the second connector 62C to the second connector 62B.

The second connector 72C of the metal plate 70B is bonded to the second connector 72B by laser beam processing (laser beam welding). With this configuration, the area of contact of the second connector 72B with the second connector 72C is increased as compared to, for example, when the second connector 72C is bonded to the second connector 72B by ultrasonic welding. This allows current to smoothly flow from the second connector 72C to the second connector 72B.

(1-20) The detection layers 45A and 45B are disposed closer to the semiconductor elements 30 than the gate layers 44A and 44B in the width-wise direction X. This structure decreases the distance between the source electrode 33 of the semiconductor element 30 and the detection layers 45A and 45B, thereby shortening the first detection wires 55 and the second detection wires 56. Accordingly, inductance caused by the first detection wires 55 and the second detection wires 56 is decreased.

Second Embodiment

A second embodiment of a semiconductor device 1B will now be described with reference to FIGS. 30 to 32. The present embodiment differs from the semiconductor device 1A of the first embodiment in the structure of the input lead 22 and in that the first drive leads 60 are omitted. In the description below, the same reference characters are given to those components that are the same as the corresponding components of the semiconductor device 1A of the first embodiment. Such components will not be described in detail.

Figure 30:
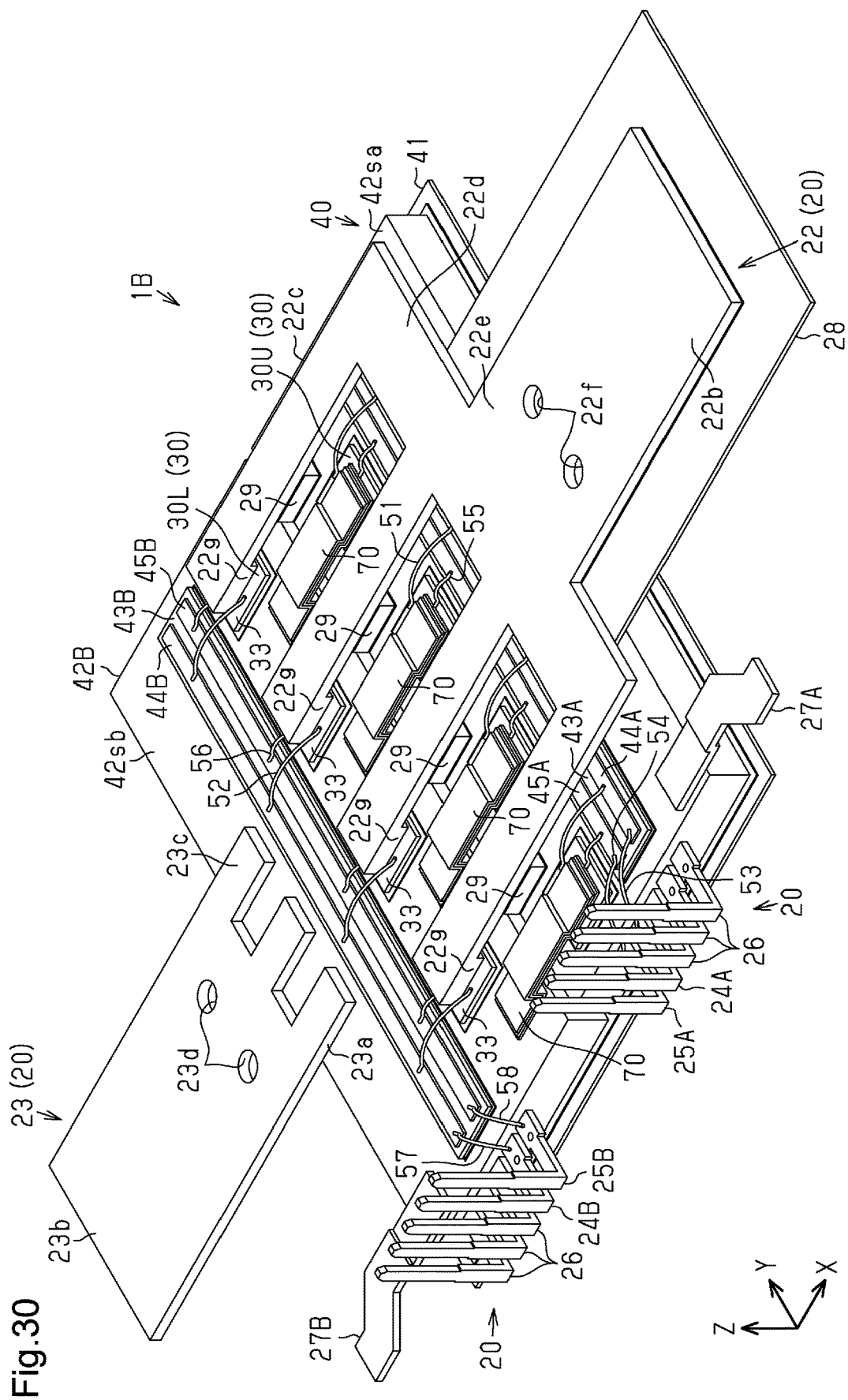
FIG. 30 is a perspective view showing a second embodiment of a semiconductor device with the encapsulation resin removed.
Figure 31:
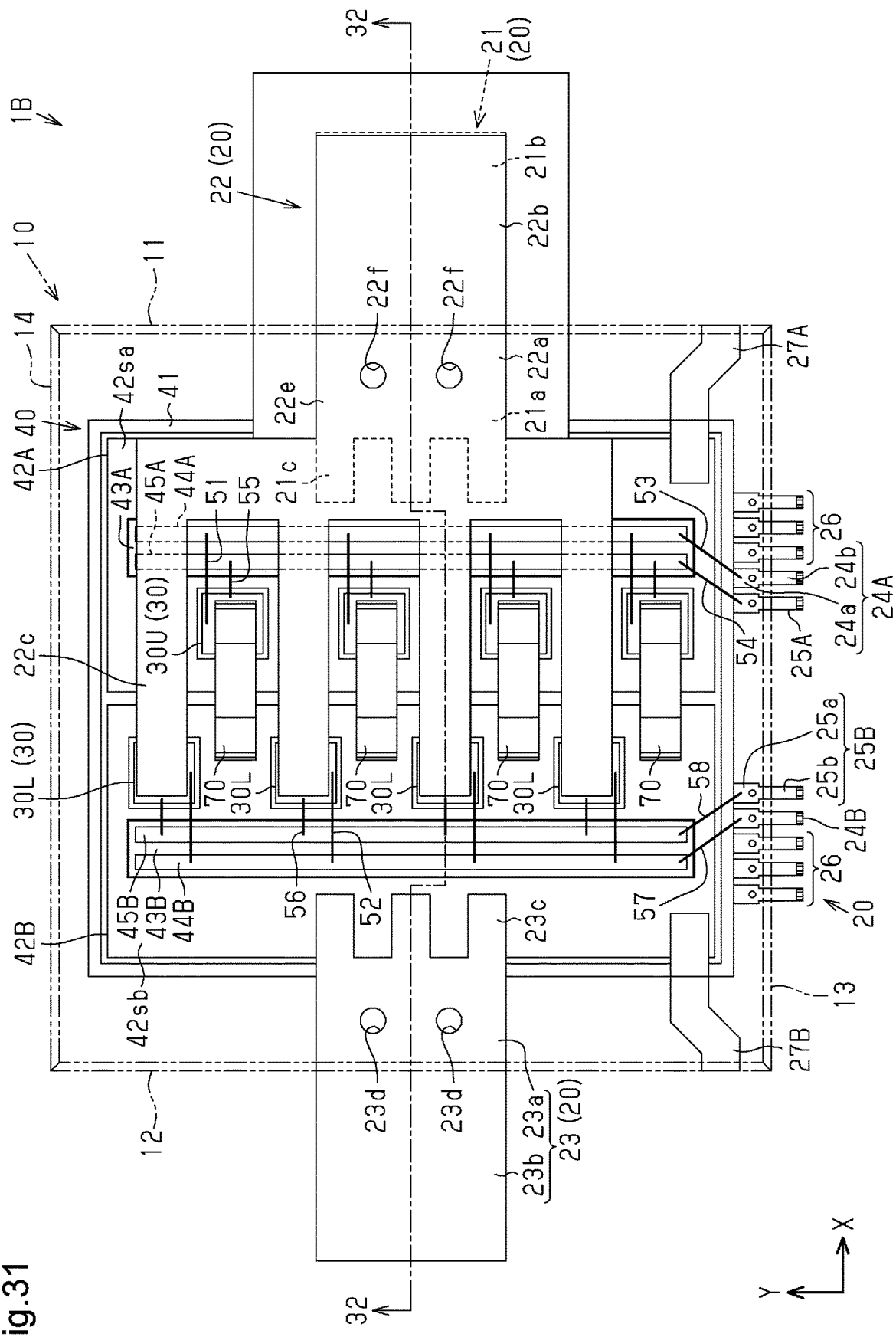
FIG. 31 is a plan view showing the semiconductor device of the second embodiment with the encapsulation resin indicated by double-dashed lines.

As shown in FIGS. 30 and 31, as in the first embodiment, the input lead 22 includes the pad part 22a, the terminal part 22b, the extensions 22c, the joint portion 22d, and the intermediate portion 22e. The input lead 22 of the present embodiment differs from the input lead 22 of the first embodiment in the shape of the extensions 22c.

Figure 32A:
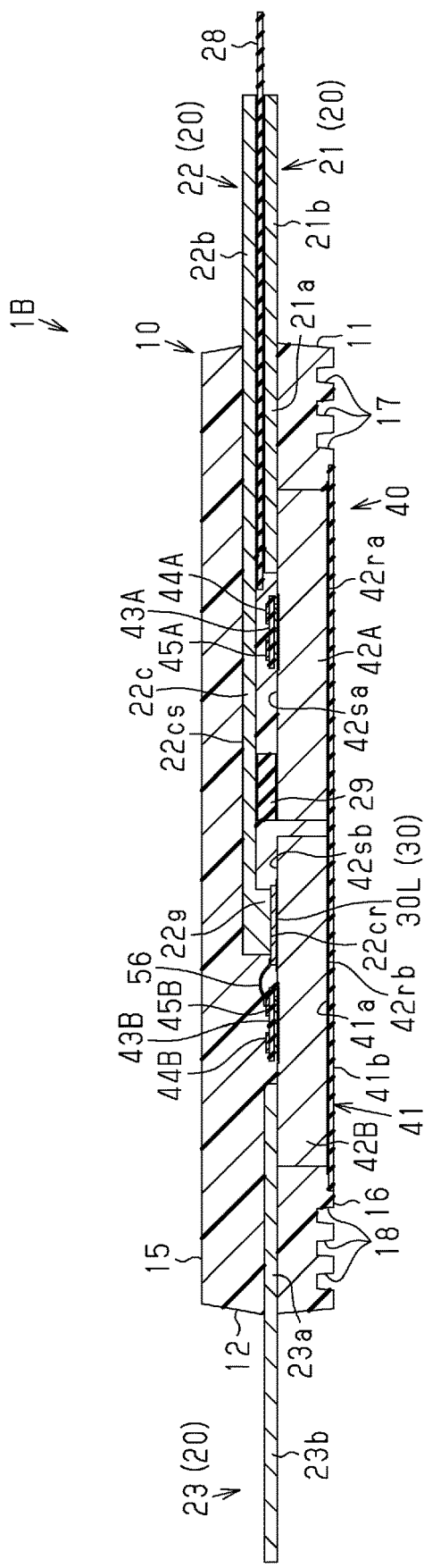
FIG. 32A is a cross-sectional view taken along line 32-32 in FIG. 31.
Figure 32B:
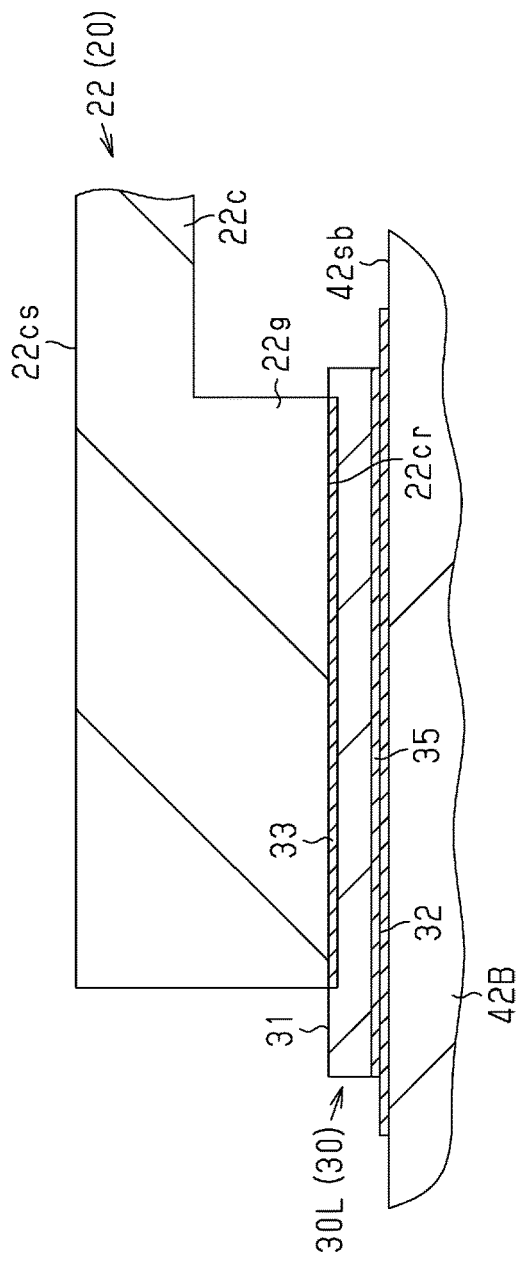
FIG. 32B is an enlarged view of the semiconductor element and its surroundings.

As shown in FIG. 32A, the extension 22c extends toward the second semiconductor elements 30L beyond the support table 29 in the width-wise direction X. As viewed in the thickness-wise direction Z, each extension 22c is formed to overlap the source electrode 33 of the second semiconductor element 30L. As shown in FIG. 32B, the distal portion of the extension 22c is opposed to the second semiconductor element 30L in the thickness-wise direction Z and includes a connector 22g extending in the thickness-wise direction Z. The connector 22g is formed integrally with the extension 22c. Each connector 22g cancels out the difference in height between the extension 22c and the second semiconductor element 30L in the thickness-wise direction Z. The connector 22g is bonded to the source electrodes 33 of the second semiconductor elements 30L. Since the input lead 22 is directly connected to the second semiconductor element 30L, the first drive leads 60 are not necessary. The connector 22g may be formed separately from the extensions 22c.

The method for manufacturing the semiconductor device 1B in the present embodiment differs from the method for manufacturing the semiconductor device 1A in the first embodiment in the bonding process of the input lead 22 in the first bonding step and in that the step of bonding the source electrode 33 of the second semiconductor element 30L to the extension 22c with the first drive lead 60 is omitted from the third bonding step.

In the first bonding step, the input lead 21 is first bonded to the main surface 42sa of the conductive member 42A. This bonding process is performed, for example, using ultrasonic welding or laser beam welding. Next, the insulation member 28 is attached to the input lead 21. Then, the input lead 22 is attached to the insulation member 28. As a result, the insulation member 28 is held between the input lead 21 and the input lead 22 in the thickness-wise direction Z. The extensions 22c of the input lead 22 are mounted on the respective support tables 29. Also, the connector 22g, disposed on the distal portion of each extension 22c, is mounted on the source electrode 33 of the second semiconductor element 30L. The connector 22g is bonded to the source electrode 33 by, for example, ultrasonic welding. When the connector 22g is formed separately from the extension 22c, for example, the connector 22g is bonded to the source electrode 33 of the second semiconductor element 30L and then bonded to the extension 22c. The bonding order may be changed in any manner. For instance, after the connector 22g is bonded to the extension 22c, then the connector 22g may be bonded to the source electrode 33.

The semiconductor device 1B of the present embodiment has the following advantages in addition to the advantages of the first embodiment.

(2-1) The extensions 22c of the input lead 22 are directly bonded to the source electrodes 33 of the second semiconductor elements 30L. That is, the first drive leads 60 are omitted. This reduces the number of components in the semiconductor device 1B. In addition, the amount of work for bonding the extensions 22c to the source electrodes 33 of the second semiconductor elements 30L is less than the amount of work for bonding the first drive leads 60 to the source electrodes 33 of the second semiconductor elements 30L. Thus, the amount of work in the third bonding step is reduced.

Third Embodiment

A third embodiment of a semiconductor device 1C will now be described with reference to FIG. 33. The semiconductor device 1C of the present embodiment differs from the semiconductor device 1A of the first embodiment in the shape of the encapsulation resin 10. In the description below, the same reference characters are given to those components that are the same as the corresponding components of the semiconductor device 1A. Such elements will not be described in detail.

Figure 33:
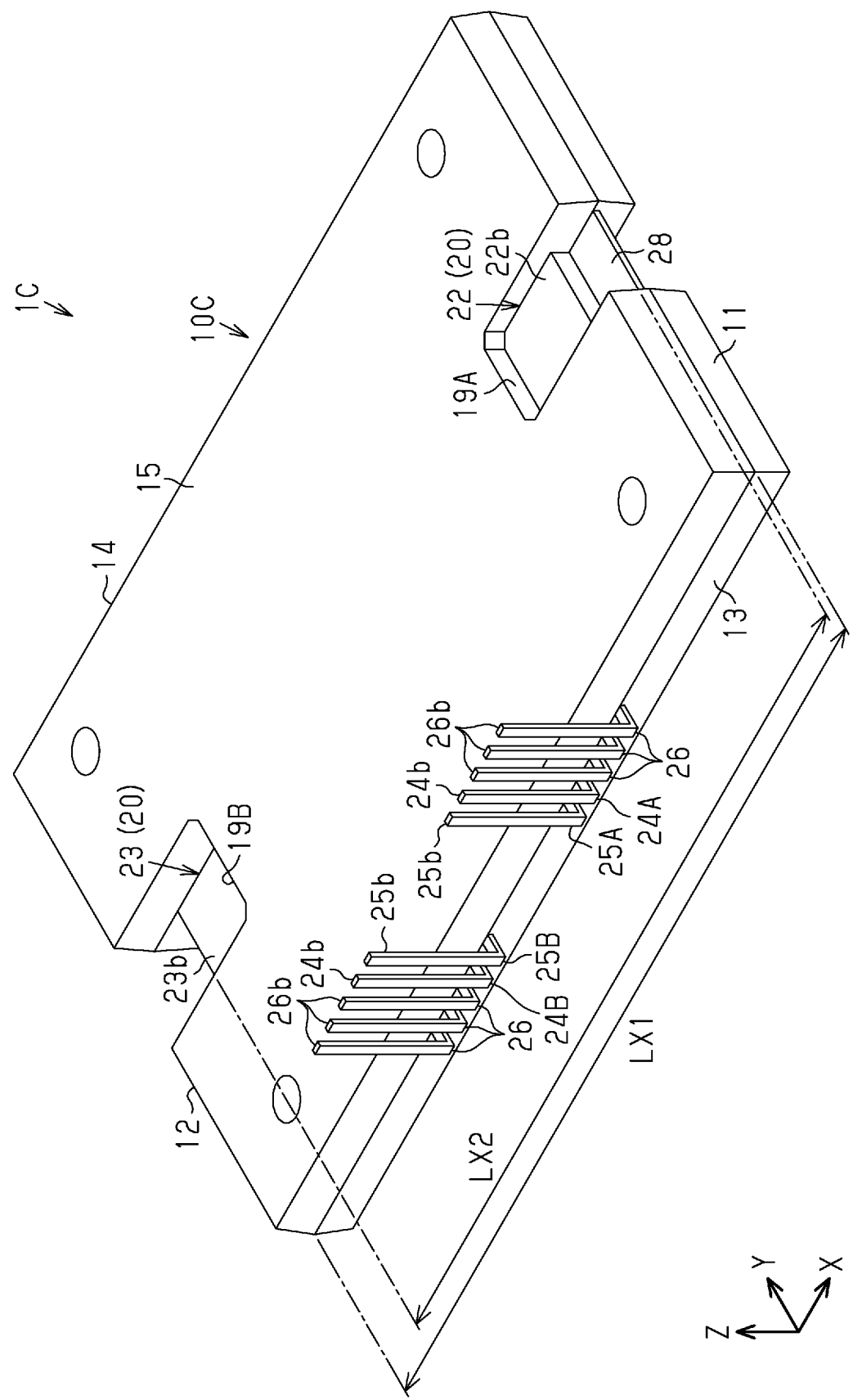
FIG. 33 is a perspective view showing a third embodiment of a semiconductor device.

As shown in FIG. 33, in the present embodiment, opposite ends of the encapsulation resin 10C in the length-wise direction Y extend in the width-wise direction X as compared to the encapsulation resin 10 of the first embodiment. The length LX1 of the encapsulation resin 10C in the width-wise direction X is greater than the length LX2 between the distal portion of the insulation member 28 and the distal portion of the output lead 23 in the width-wise direction X. Thus, the encapsulation resin 10C covers part of the terminal part 21b (not shown in FIG. 33) of the input lead 21, part of the terminal part 22b of the input lead 22, and part of the insulation member 28.

The encapsulation resin 10C includes a first recess 19A, which exposes part of the input leads 21 and 22 and part of the insulation member 28, and a second recess 19B, which exposes part of the output lead 23. The first recess 19A and the second recess 19B extend through the encapsulation resin 10C in the thickness-wise direction Z. The first recess 19A is disposed in a portion of the encapsulation resin 10C located close to the first resin side surface 11 and is recessed from the first resin side surface 11 toward the second resin side surface 12 in the width-wise direction X. The second recess 19B is disposed in a portion of the encapsulation resin 10C located close to the second resin side surface 12 and is recessed from the second resin side surface 12 toward the first resin side surface 11 in the width-wise direction X.

The present embodiment has the following advantages in addition to the advantages of the first embodiment.

(3-1) The encapsulation resin 10C covers part of the terminal part 21b of the input lead 21, part of the terminal part 22b of the input lead 22, and part of the insulation member 28, so that the terminal parts 21b and 22b and the insulation member 28 projecting from the encapsulation resin 10 of the semiconductor device 1A are protected.

Fourth Embodiment

A fourth embodiment of a semiconductor device 1D will now be described with reference to FIGS. 34 and 35. The semiconductor device 1D of the present embodiment differs from the semiconductor device 1A of the first embodiment in the structure of the support substrate. In the description below, the same reference characters are given to those components that are the same as the corresponding components of the semiconductor device 1A. Such elements will not be described in detail.

In the present embodiment, a support substrate 40D is, for example, a structural body that is referred to as a direct bonded copper (DBC) substrate. Alternatively, a structural body that is referred to as a direct bonded aluminum (DBA) substrate may be used instead of a DBC substrate. At least part of the support substrate 40D is covered by the encapsulation resin 10, which is not shown in the drawings. The support substrate 40D includes an insulation substrate 46, a main surface metal layer 47, and a back surface metal layer 48.

The insulation substrate 46 is electrically insulative. The material forming the insulation substrate 46 is a ceramic in the same manner as the insulation substrate 41. Alternatively, an insulation resin sheet may be used as the insulation substrate 46. The insulation substrate 46 is covered by the encapsulation resin 10, which is not shown in the drawings. The insulation substrate 46 includes a substrate main surface 46a and a substrate back surface 46b facing in opposite directions in the thickness-wise direction Z.

The main surface metal layer 47 covers part of the substrate main surface 46a. The material forming the main surface metal layer 47 is copper. When the support substrate 40D is a DBA substrate, the material forming the main surface metal layer 47 is aluminum. The main surface metal layer 47 is covered by the encapsulation resin 10, which is not shown in the drawings. The main surface metal layer 47 is, for example, etched to be patterned to include pattern electrodes 47A to 47E that are spaced apart from each other.

In plan view, the pattern electrode 47A is L-shaped. The first semiconductor elements 30U are electrically connected and bonded to the pattern electrode 47A by, for example, silver paste. The pattern electrode 47A is electrically connected to the drain electrode 35, that is, a back surface electrode, of each first semiconductor element 30U. Although not shown, a P terminal (corresponding to the input lead 21) is connected to the pattern electrode 47A. The P terminal is partially exposed from the encapsulation resin 10, which is not shown in the drawings.

In plan view, the pattern electrode 47B is L-shaped. The pattern electrode 47B and the pattern electrode 47A are disposed adjacent to each other in the length-wise direction Y. The pattern electrode 47B and the pattern electrode 47A are L-shaped in an inversion orientation. The second semiconductor elements 30L are electrically connected and bonded to the pattern electrode 47B by, for example, silver paste. The pattern electrode 47B is electrically connected to the drain electrode 35, that is, a back surface electrode, of each second semiconductor element 30L. Although not shown, an output terminal (corresponding to the output lead 23) is connected to the pattern electrode 47B. The output terminal is partially exposed from the encapsulation resin 10, which is not shown in the drawings.

In plan view, the pattern electrode 47C is generally T-shaped. The pattern electrode 47C and the pattern electrode 47A are disposed at opposite sides of the pattern electrode 47B in the length-wise direction Y. The pattern electrode 47C is disposed adjacent to the pattern electrode 47B. Although not shown, an N terminal (corresponding to the input lead 22) is connected to the pattern electrode 47C. The N terminal is partially exposed from the encapsulation resin 10, which is not shown in the drawings.

The two pattern electrodes 47D are disposed at opposite ends of the support substrate 40D in the length-wise direction Y. In plan view, each pattern electrode 47D is linear and extends in the width-wise direction X. One of the pattern electrodes 47D is disposed adjacent to the pattern electrode 47A. The pattern electrode 47D and the pattern electrode 47B are disposed at opposite sides of the pattern electrode 47A in the length-wise direction Y. The other pattern electrode 47D is disposed adjacent to the pattern electrode 47C. The pattern electrode 47D and the pattern electrode 47B are located at opposite sides of the pattern electrode 47C in the length-wise direction Y. One of the pattern electrodes 47D is electrically connected to the gate electrode 34 of each first semiconductor element 30U by a first control wire, which is not shown in the drawings. The other pattern electrode 47D is electrically connected to the gate electrode 34 of each second semiconductor element 30L by a second control wire, which is not shown in the drawings. Although not shown, gate terminals (corresponding to the control leads 24A and 24B) are respectively connected to the two pattern electrodes 47D. The gate terminals are partially exposed from the encapsulation resin 10, which is not shown in the drawings.

The two pattern electrodes 47E are disposed at opposite ends of the support substrate 40D in the length-wise direction Y. In plan view, each pattern electrode 47E is linear and extends in the width-wise direction X. One of the pattern electrodes 47E is disposed adjacent to one of the pattern electrodes 47D. The pattern electrode 47E and the pattern electrode 47A are disposed at opposite sides of the pattern electrode 47D in the length-wise direction Y. The other pattern electrode 47E is disposed adjacent to the other pattern electrode 47D. The pattern electrode 47E and the pattern electrode 47C are located at opposite sides of the pattern electrode 47D in the length-wise direction Y. One of the pattern electrodes 47E is electrically connected to the source electrode 33 of each first semiconductor element 30U by a first detection wire, which is not shown in the drawings. The other pattern electrode 47E is electrically connected to the source electrode 33 of each second semiconductor element 30L by a second detection wire, which is not shown in the drawings. Although not shown, detection terminals (corresponding to the detection leads 25A and 25B) are respectively connected to the two pattern electrodes 47E. The detection terminals are partially exposed from the encapsulation resin 10, which is not shown in the drawings.

The back surface metal layer 48 covers at least part of the substrate back surface 46b of the insulation substrate 46. The material forming the back surface metal layer 48 is copper. When the support substrate 40D is a DBA substrate, the material forming the back surface metal layer 48 is aluminum. The back surface metal layer 48 may be covered by the encapsulation resin 10, which is not shown in the drawings. Alternatively, a surface of the back surface metal layer 48 facing in the thickness-wise direction Z may be exposed from the encapsulation resin 10.

The semiconductor device 1D includes first drive leads 80 and second drive leads 90. The first drive leads 80 connect the source electrodes 33 of the first semiconductor elements 30U to the pattern electrode 47B. The pattern electrode 47B is an example of a drive conductor. The number of first drive leads 80 is specified in correspondence with the number of first semiconductor elements 30U. The second drive leads 90 connect the source electrodes 33 of the second semiconductor elements 30L to the pattern electrode 47C. The pattern electrode 47C is an example of a drive conductor. The number of second drive leads 90 is specified in correspondence with the number of second semiconductor elements 30L.

Figure 34:
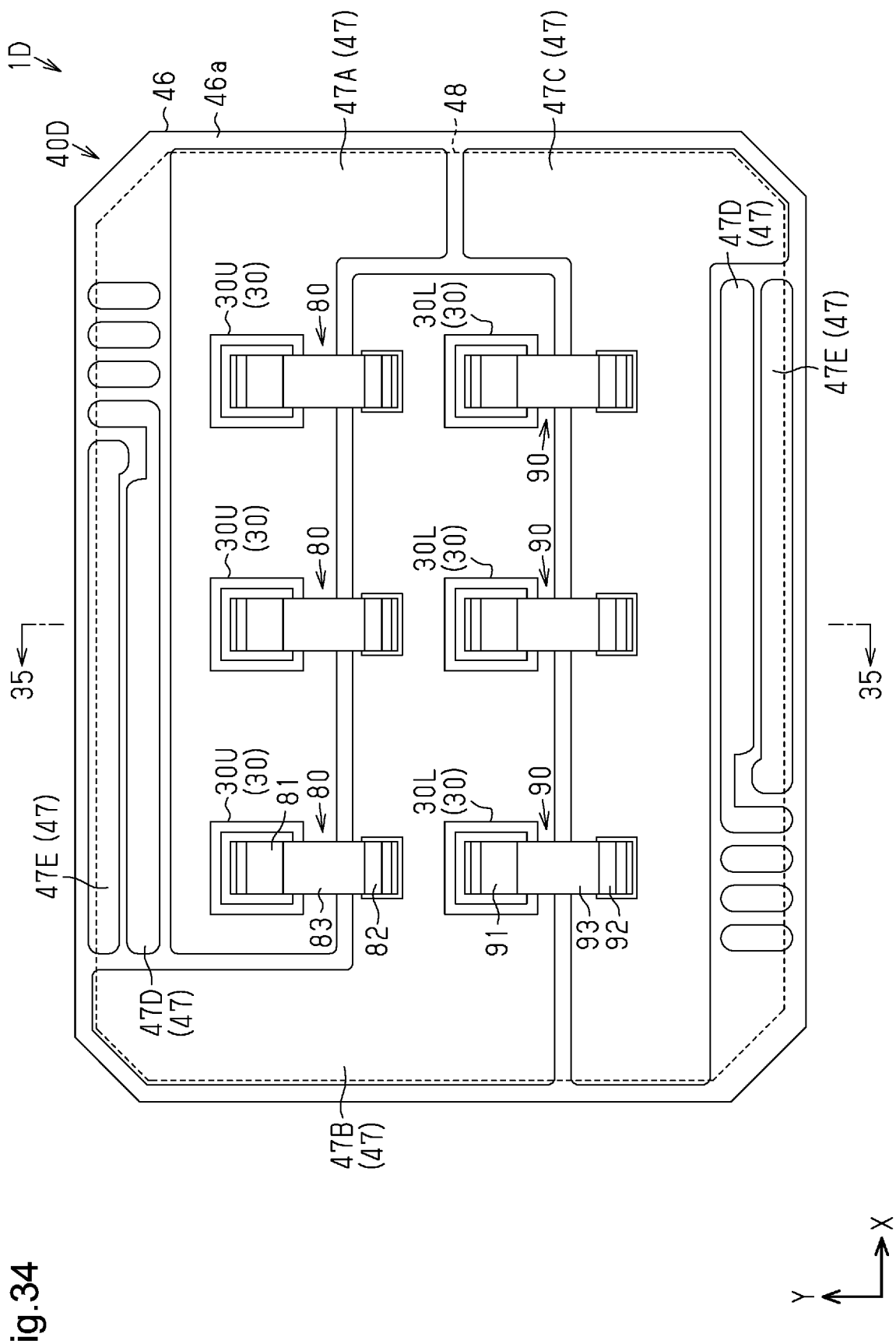
FIG. 34 is a perspective view showing a fourth embodiment of a semiconductor device with the encapsulation resin, the input lead, the output lead, and the detection lead removed.
Figure 35:
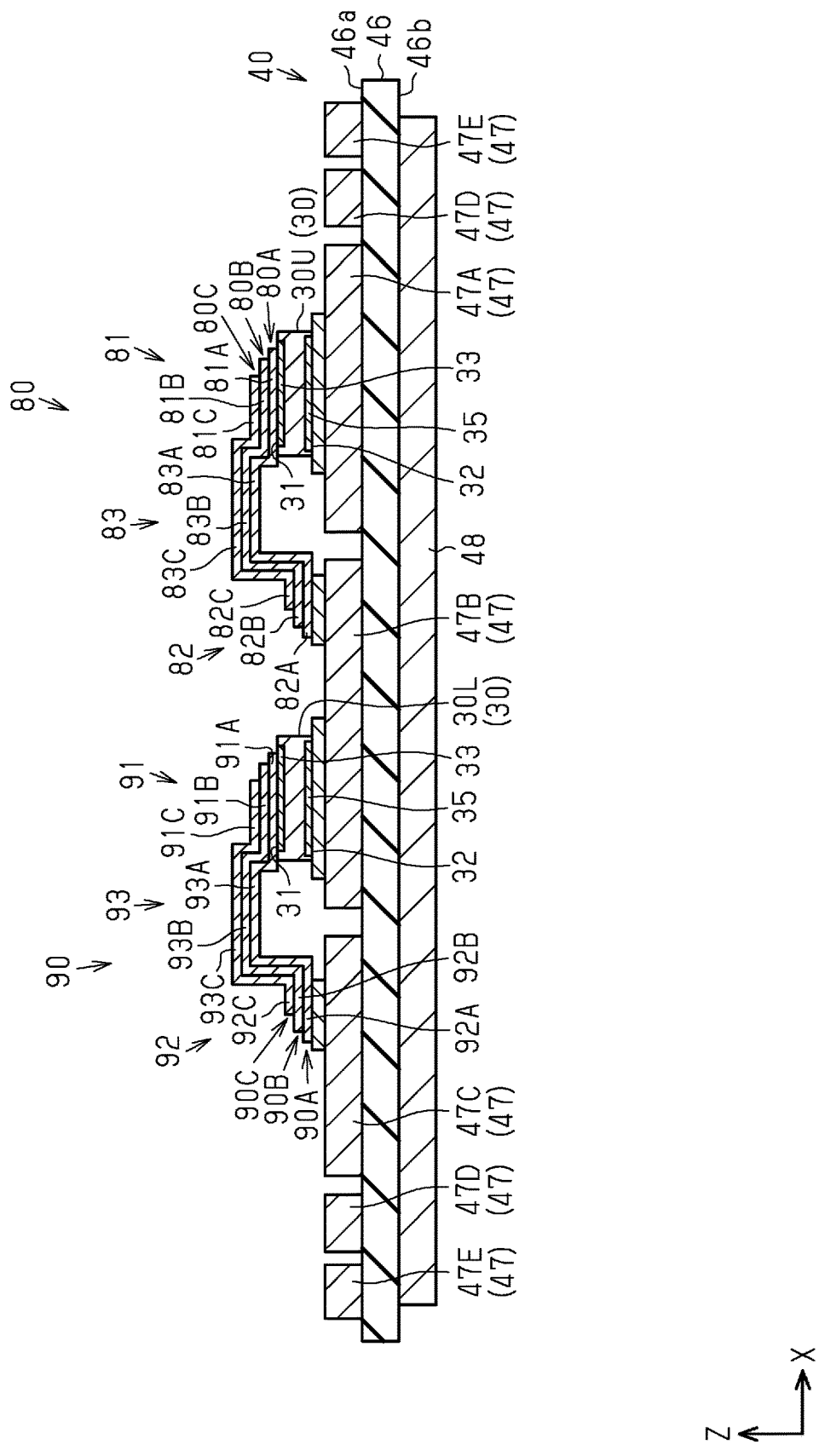
FIG. 35 is a cross-sectional view taken along line 35-35 in FIG. 34.

As shown in FIGS. 34 and 35, the first drive leads 80 and the second drive leads 90 have the same structure as the first drive leads 60 and the second drive leads 70 of the first embodiment. More specifically, each first drive lead 80 is formed by stacking metal plates 80A, 80B, and 80C in the thickness-wise direction Z and includes a first connector 81, a second connector 82, and a joint 83. Each second drive lead 90 is formed by stacking metal plates 90A, 90B, and 90C in the thickness-wise direction Z and includes a first connector 91, a second connector 92, and a joint 93. In the present embodiment, in a side view taken in the width-wise direction X, the first drive lead 80 and the second drive lead 90 are identical in shape. The shapes of the first drive lead 80 and the second drive lead 90 in a side view may be changed in any manner. For example, in a side view, the shape of the first drive lead 80 may differ from the shape of the second drive lead 90.

The first connector 81 of the first drive lead 80 is bonded to the source electrode 33 of the first semiconductor element 30U by laser beam welding. The bonding structure of the first connector 81 to the source electrode 33 of the first semiconductor element 30U is the same as the bonding structure of the first connector 71 of the second drive lead 70 to the source electrode 33 of the second semiconductor element 30L. Also, the bonding structure of the metal plate 80A to the metal plate 80B through laser beam welding and the bonding structure of the metal plate 80B to the metal plate 80C through laser beam welding in the first connector 81 are the same as the bonding structure of the metal plate 70A to the metal plate 70B through laser beam welding and the bonding structure of the metal plate 70B to the metal plate 70C in the first connector 71.

The second connector 82 of the first drive lead 80 is bonded to the pattern electrode 47B by laser beam welding. The bonding structure of the second connector 82 to the pattern electrode 47B is the same as the bonding structure of the second connector 72 of the second drive lead 70 to the conductive member 42B. Also, the bonding structure of the metal plate 80A to the metal plate 80B through laser beam welding and the bonding structure of the metal plate 80B to the metal plate 80C through laser beam welding in the second connector 82 are the same as the bonding structure of the metal plate 70A to the metal plate 70B through laser beam welding and the bonding structure of the metal plate 70B to the metal plate 70C through laser beam welding in the second connector 72.

The shape of the joint 83 of the first drive lead 80 in a side view of the first drive lead 80 in the width-wise direction X is the same as the shape of the joint 73 of the second drive lead 70 in a side view of the second drive lead 70 in the length-wise direction Y.

The first connector 91 of the second drive lead 90 is bonded to the source electrode 33 of the second semiconductor element 30L by laser beam welding. The bonding structure of the first connector 91 to the source electrode 33 of the second semiconductor element 30L is the same as the bonding structure of the first connector 81 of the first drive lead 80 to the source electrode 33 of the first semiconductor element 30U. Also, the bonding structure of the metal plate 90A to the metal plate 90B through laser beam welding and the bonding structure of the metal plate 90B to the metal plate 90C through laser beam welding in the first connector 91 are the same as the bonding structure of the metal plate 80A to the metal plate 80B through laser beam welding and the bonding structure of the metal plate 80B to the metal plate 80C through laser beam welding in the first connector 81.

The second connector 92 of the second drive lead 90 is bonded to the pattern electrode 47C by laser beam welding. The bonding structure of the second connector 92 to the pattern electrode 47C is the same as the bonding structure of the second connector 82 of the first drive lead 80 to the pattern electrode 47B. Also, the bonding structure of the metal plate 90A to the metal plate 90B through laser beam welding and the bonding structure of the metal plate 90B to the metal plate 90C through laser beam welding in the second connector 92 are the same as the bonding structure of the metal plate 80A to the metal plate 80B through laser beam welding and the bonding structure of the metal plate 80B to the metal plate 80C through laser beam welding in the second connector 82.

The shape of the joint 93 of the second drive lead 90 in a side view of the second drive lead 90 in the width-wise direction X is the same as the shape of the joint 83 in a side view of the first drive lead 80 in the width-wise direction X. The semiconductor device 1D of the present embodiment has the same advantages as the first embodiment.

Each of the metal plates 80A and 90A is an example of a first metal plate connected to a semiconductor element. Each of the first connectors 81A and 91A is an example of a first element-side connector of the first metal plate. Each of the second connectors 82A and 92A is an example of a first conductor-side connector of the first metal plate. Each of the joints 83A and 93A is an example of a first joint. Each laser bonding portion formed in the first connectors 81A and 91A is an example of a first element bonding portion of the first element-side connector. Each laser bonding portion formed in the second connectors 82A and 92A is an example of a first conductor bonding portion of the first conductor-side connector.

Each of the metal plates 80B and 90B is an example of a second metal plate stacked on the first metal plate. Each of the first connectors 81B and 91B is an example of a second element-side connector connected to the first element-side connector. Each of the second connectors 82B and 92B is an example of a second conductor-side connector of the second metal plate. Each of the joints 83B and 93B is an example of a second joint. Each laser bonding portion formed in the first connectors 81B and 91B is an example of a second element bonding portion of the second element-side connector. Each laser bonding portion formed in the second connectors 82B and 92B is an example of a second conductor bonding portion of the second conductor-side connector.

Each of the metal plates 80C and 90C is an example of a third metal plate stacked on the second metal plate. Each of the first connectors 81C and 91C is an example of a third element-side connector of the third metal plate. Each of the second connectors 82C and 92C is an example of a third conductor-side connector of the third metal plate. Each of the joints 83C and 93C is an example of a third joint. Each laser bonding portion formed in the first connectors 81C and 91C is an example of a third element bonding portion of the third element-side connector. Each laser bonding portion formed in the second connectors 82C and 92C is an example of a third conductor bonding portion of the third conductor-side connector.

The method for manufacturing the semiconductor device 1D of the present embodiment includes a third bonding step that differs from the third bonding step for the semiconductor device 1A of the first embodiment. In the third bonding step in the method for manufacturing the semiconductor device 1D, after the metal plate 80A is bonded to the source electrode 33 of the first semiconductor element 30U and the pattern electrode 47B, the metal plate 90A is bonded to the source electrode 33 of the second semiconductor element 30L and the pattern electrode 47C. Then, after the metal plate 80B is bonded to the metal plate 80A, the metal plate 90B is bonded to the metal plate 90A. Finally, after the metal plate 80C is bonded to the metal plate 80B, the metal plate 90C is bonded to the metal plate 90B. In the present embodiment, the above steps are repeated three times, so that three first drive leads 80 and three the second drive leads 90 are formed. The third bonding step in the method for manufacturing the semiconductor device 1D of the present embodiment may be the same as the third bonding step in the method for manufacturing the semiconductor device 1A of the first embodiment.

Fifth Embodiment

Figure 36:
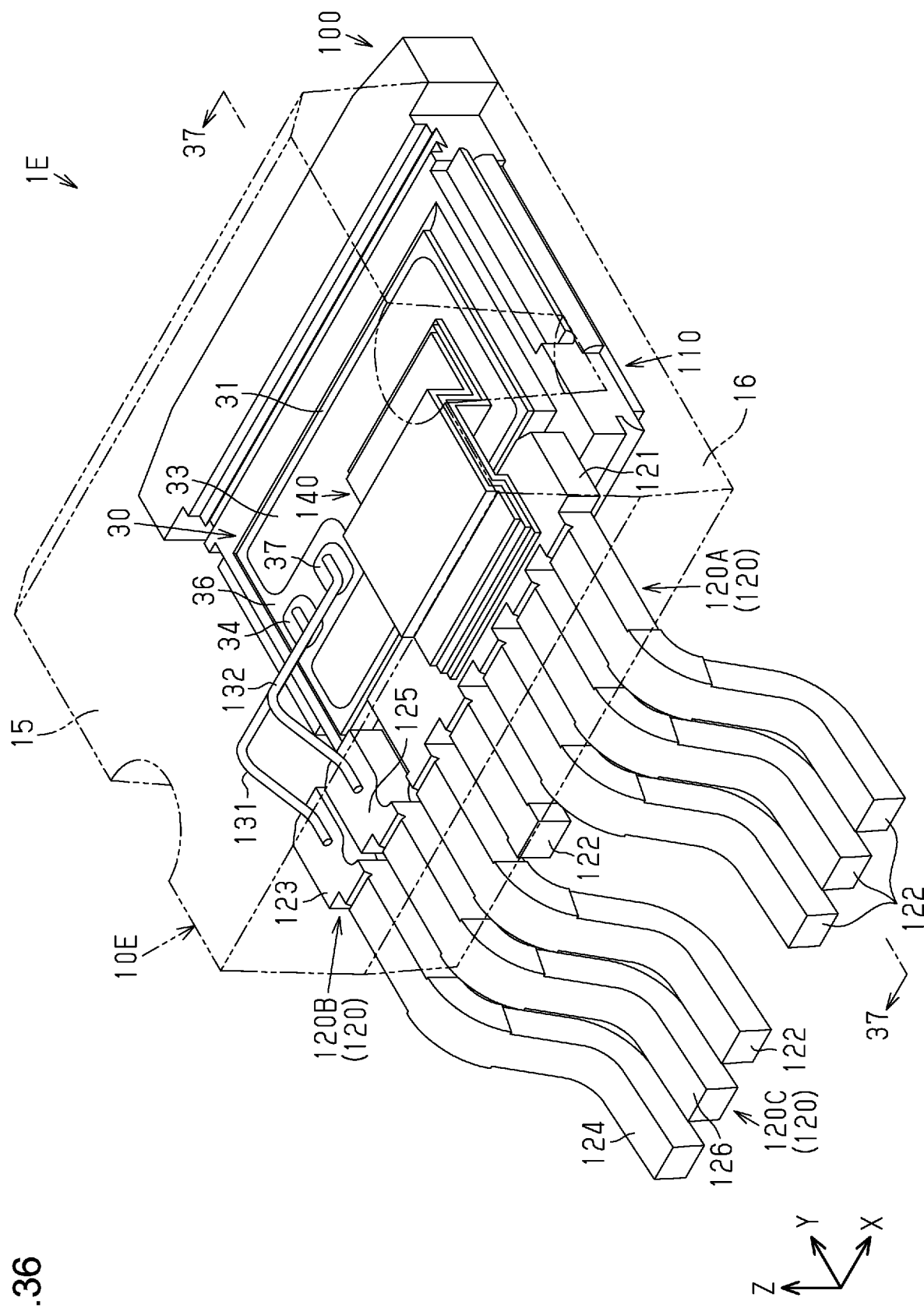
FIG. 36 is a perspective view of a fifth embodiment of a semiconductor device with the encapsulation resin indicated by double-dashed lines.

A fifth embodiment of a semiconductor device 1E will now be described with reference to FIGS. 36 and 37. The semiconductor device 1E of the present embodiment differs from the semiconductor device 1A of the first embodiment in that the semiconductor device 1E is a discrete semiconductor including one semiconductor element 30. In the present embodiment, the semiconductor element 30 is not limited to a switching element such as a MOSFET and may be various types of semiconductor element, such as a diode. In the description below, the same reference characters are given to those components that are the same as the corresponding components of the semiconductor device 1A. Such elements will not be described in detail. In FIG. 36, an encapsulation resin 10E is indicated by double-dashed lines for the sake of convenience.

The semiconductor device 1E of the present embodiment includes a lead frame 100 and thus has a lead frame structure. The material forming the lead frame 100 is not particularly limited and is, for example, copper or a copper alloy. The lead frame 100 includes a die pad portion 110 and terminal portions 120.

Figure 37:
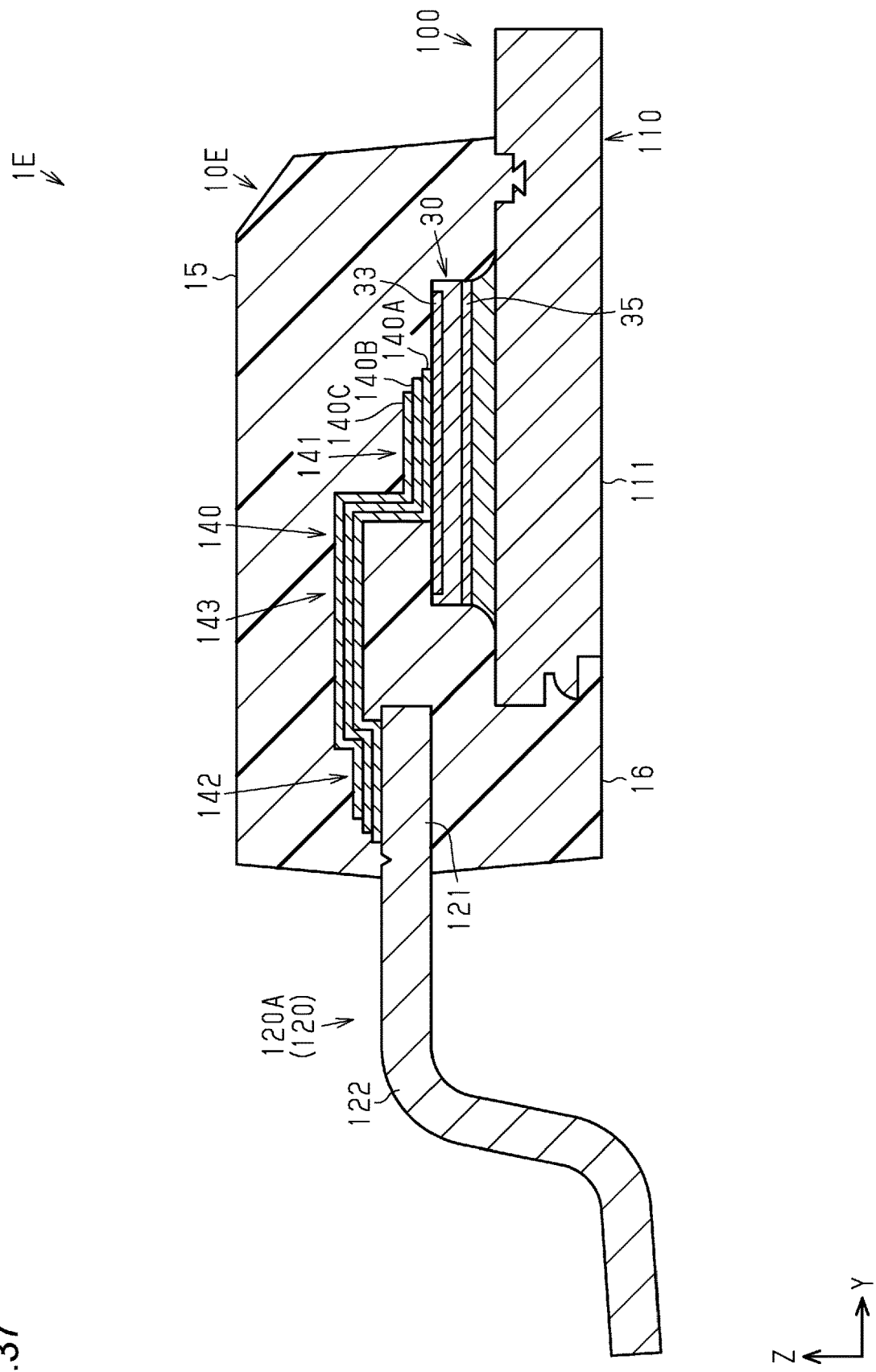
FIG. 37 is a cross-sectional view taken along line 37-37 in FIG. 36.

As shown in FIGS. 36 and 37, the semiconductor element 30 is mounted on the die pad portion 110. In the present embodiment, one semiconductor element 30 is mounted on the die pad portion 110. The semiconductor element 30 is bonded to the die pad portion 110 by, for example, silver paste. The drain electrode 35, that is, the back surface electrode, of the semiconductor element 30 is electrically connected to the die pad portion 110. In the present embodiment, the semiconductor element 30 further includes a detection electrode 37 formed on the element main surface 31. In an example, the detection electrode 37 is formed in a region surrounded by the gate electrode 34 and the source electrode 33.

The terminal portions 120 include a drive terminal portion 120A, a control terminal portion 120B, and a detection terminal portion 120C. The drive terminal portion 120A is a terminal through which source current of the semiconductor element 30 flows. The control terminal portion 120B is a terminal for applying gate voltage to the gate electrode 34 of the semiconductor element 30. The detection terminal portion 120C is a terminal for detecting, for example, the temperature of the semiconductor element 30.

The drive terminal portion 120A includes a pad part 121 and terminal parts 122. In the present embodiment, the drive terminal portion 120A is a single member in which the pad part 121 and the terminal parts 122 are integrally formed. In plan view, the pad part 121 is rectangular such that the long sides extend in the width-wise direction X and the short sides extend in the length-wise direction Y. In the thickness-wise direction Z, the pad part 121 is disposed closer to the resin top surface 15 of the encapsulation resin 10 than the die pad portion 110. In addition, the pad part 121 is disposed closer to the resin top surface 15 of the encapsulation resin 10 than the source electrode 33 of the semiconductor element 30. The terminal parts 122 are arranged at the same pitch in the width-wise direction X.

The control terminal portion 120B includes a pad part 123 and a terminal part 124. In the present embodiment, the control terminal portion 120B is a single member in which the pad part 123 and the terminal part 124 are integrally formed. The pad part 123 and the pad part 121 of the drive terminal portion 120A are aligned in the thickness-wise direction Z and are spaced apart in the width-wise direction X. The control terminal portion 120B and the gate electrode 34 are connected by a control wire 131. The control wire 131 is bonded to the pad part 123 of the control terminal portion 120B and the gate electrode 34 by, for example, wire bonding.

The detection terminal portion 120C includes a pad part 125 and a terminal part 126. In the present embodiment, the detection terminal portion 120C is a single member in which the pad part 125 and the terminal part 126 are integrally formed. The pad part 125 and the pad part 123 of the control terminal portion 120B are aligned in the thickness-wise direction Z and are spaced apart in the width-wise direction X. In the present embodiment, the detection terminal portion 120C and the control terminal portion 120B are identical in shape. The detection terminal portion 120C and the detection electrode 37 are connected by a detection wire 132. The detection wire 132 is bonded to the pad part 125 of the detection terminal portion 120C and the detection electrode 37 by, for example, wire bonding.

The encapsulation resin 10E encapsulates part of the die pad portion 110, the semiconductor element 30, part of each terminal portion 120, the control wire 131, and the detection wire 132. The encapsulation resin 10E is formed from the same material as the material forming the encapsulation resin 10 of the first embodiment. In an example, the material forming the encapsulation resin 10E is a black epoxy resin.

As shown in FIG. 37, the die pad portion 110 has a back surface 111 exposed from the encapsulation resin 10E. The terminal parts 122 of the drive terminal portion 120A, the terminal part 124 of the control terminal portion 120B, and the terminal part 126 of the detection terminal portion 120C project from the encapsulation resin 10E in the length-wise direction Y The semiconductor device 1E includes a drive lead 140. The drive lead 140 connects the drive terminal portion 120A and the source electrode 33. The drive terminal portion 120A is an example of a drive conductor. The drive lead 140 is encapsulated by the encapsulation resin 10E.

As shown in FIG. 37, the structure of the drive lead 140 is the same as the structure of the second drive lead 70 in the first embodiment. More specifically, the drive lead 140 is formed by stacking metal plates 140A, 140B, and 140C in the thickness-wise direction Z and includes a first connector 141, a second connector 142, and a joint 143.

The first connector 141 of the drive lead 140 is bonded to the source electrode 33 of the semiconductor element 30 by laser beam welding. The bonding structure of the first connector 141 to the source electrode 33 of the semiconductor element 30 is the same as the bonding structure of the first connector 71 of the second drive lead 70 to the source electrode 33 of the second semiconductor element 30L. Also, the bonding structure of the metal plate 140A to the metal plate 140B through laser beam welding and the bonding structure of the metal plate 140B to the metal plate 140C through laser beam welding in the first connector 141 are the same as the bonding structure of the metal plate 70A to the metal plate 70B through laser beam welding and the bonding structure of the metal plate 70B to the metal plate 70C through laser beam welding in the first connector 71.

The second connector 142 of the drive lead 140 is bonded to the pad part 121 of the drive terminal portion 120A by laser beam welding. The bonding structure of the second connector 142 to the pad part 121 is the same as the bonding structure of the second connector 72 of the second drive lead 70 to the conductive member 42B. Also, the bonding structure of the metal plate 140A to the metal plate 140B through laser beam welding and the bonding structure of the metal plate 140B to the metal plate 140C through laser beam welding in the second connector 142 are the same as the bonding structure of the metal plate 70A to the metal plate 70B through laser beam welding and the bonding structure of the metal plate 70B to the metal plate 70C through laser beam welding in the second connector 72.

The shape of the joint 143 of the drive lead 140 in a side view of the drive lead 140 in the width-wise direction X is generally the same as the shape of the joint 73 of the second drive lead 70 in a side view of the second drive lead 70 in the length-wise direction Y. The semiconductor device 1E of the present embodiment has the same advantages as the semiconductor device 1A of the first embodiment.

The metal plate 140A is an example of a first metal plate connected to a semiconductor element. The first connector 141 of the metal plate 140A is an example of a first element-side connector of the first metal plate. The second connector 142 of the metal plate 140A is an example of a first conductor-side connector of the first metal plate. The joint 143 of the metal plate 140A is an example of a first joint. Each laser bonding portion formed in the first connector 141 of the metal plate 140A is an example of a first element bonding portion of the first element-side connector. Each laser bonding portion formed in the second connector 142 of the metal plate 140A is an example of a first conductor bonding portion of the first conductor-side connector.

The metal plate 140B is an example of a second metal plate stacked on the first metal plate. The first connector 141 of the metal plate 140B is an example of a second element-side connector of the first element-side connector. The second connector 142 of the metal plate 140B is an example of a second conductor-side connector of the second metal plate. The joint 143 of the metal plate 140B is an example of a second joint. Each laser bonding portion formed in the first connector 141 of the metal plate 140B is an example of a second element bonding portion of the second element-side connector. Each laser bonding portion formed in the second connector 142 of the metal plate 140B is an example of a second conductor bonding portion of the second conductor-side connector.

The metal plate 140C is an example of a third metal plate stacked on the second metal plate. The first connector 141 of the metal plate 140C is an example of a third element-side connector of the third metal plate. The second connector 142 of the metal plate 140C is an example of a third conductor-side connector of the third metal plate. The joint 143 of the metal plate 140C is an example of a third joint. Each laser bonding portion formed in the first connector 141 of the metal plate 140C is an example of a third element bonding portion of the third element-side connector. Each laser bonding portion formed in the second connector 142 of the metal plate 140C is an example of a third conductor bonding portion of the third conductor-side connector.

Common Modified Examples of Embodiments

The above-described embodiments exemplify, without any intention to limit, applicable forms of a semiconductor device and a method for manufacturing a semiconductor device according to the present disclosure. The semiconductor device and the method for manufacturing a semiconductor device according to the present disclosure may be applicable to forms differing from the above embodiments. In an example of such a form, the configuration of the embodiments is partially replaced, changed, or omitted, or a further configuration is added to the embodiments. In the following modified examples, the same reference characters are given to those parts that are the same as the corresponding parts of the embodiments. Such parts will not be described in detail.

Figure 38:
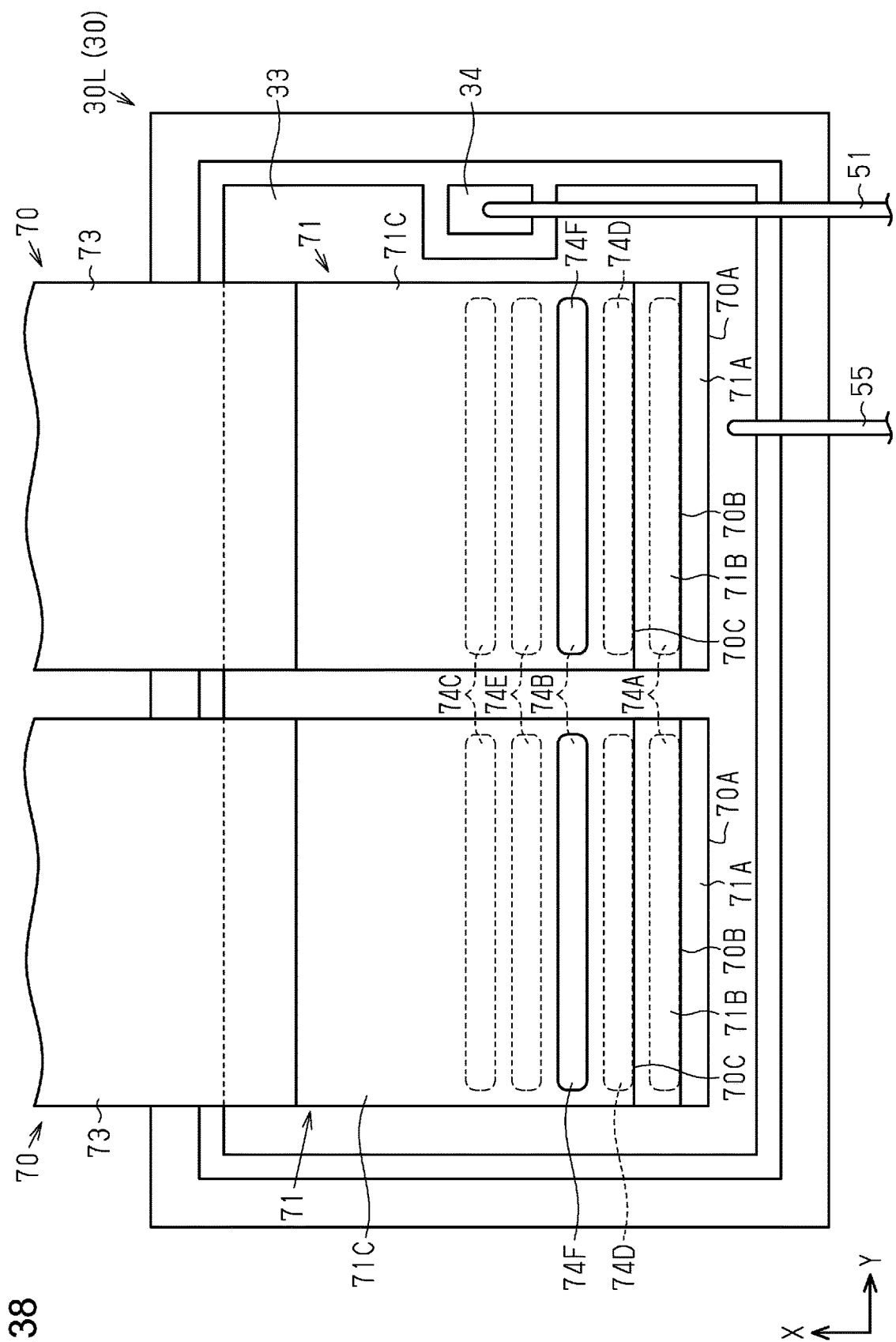
FIG. 38 is a plan view showing a structure that joins second drive leads to a semiconductor element in a modified example of a semiconductor device.

In each of the embodiments, the number of drive leads (first drive leads 60 and 80, second drive leads 70 and 90, and drive leads 140) that are bonded to the source electrodes 33 of the semiconductor elements 30 may be changed in any manner. For example, when a drive lead is formed from a ribbon material 230 having the same size as the ribbon material 230 of the first embodiment and is bonded to a semiconductor element 30 that is greater in size than the semiconductor element 30 of the first embodiment, multiple drive leads (multiple drive connection members) may be connected to the source electrode 33 of the semiconductor element 30. In this case, the drive leads (drive connection members) are arranged in the length-wise direction Y. FIG. 38 shows an example in which two second drive leads 70 are bonded to the source electrode 33 of the second semiconductor element 30L.

As shown in FIG. 38, the first connectors 71 of the two second drive leads 70 are bonded to the source electrode 33 by laser beam welding. The bonding structure of each first connector 71 to the source electrode 33 is the same as the bonding structure of the first connector 71 of the second drive lead 70 to the source electrode 33 in the first embodiment. Also, the bonding structure of the metal plate 70A to the metal plate 70B through laser beam welding and the bonding structure of the metal plate 70B to the metal plate 70C through laser beam welding in the first connector 71 shown in FIG. 38 are the same as the bonding structure of the metal plate 70A to the metal plate 70B through laser beam welding and the bonding structure of the metal plate 70B to the metal plate 70C through laser beam welding in the first connector 71 of the second drive lead 70 in the first embodiment. In this configuration, the two second drive leads 70 are formed from the same ribbon material 230. This simplifies the third bonding step as compared to a configuration in which the two second drive leads 70 are formed from a separate ribbon material.

In each of the embodiments, in the first connector and the second connector of the drive lead (first drive leads 60 and 80, second drive leads 70 and 90, and drive lead 140), the dimension of each laser bonding portion in the length-wise direction Y may be changed in any manner.

In each of the embodiments, the metal plates forming the first connectors of the drive leads (first drive leads 60 and 80, second drive leads 70 and 90, and drive lead 140) may have distal edges that are aligned with each other as viewed in the thickness-wise direction Z. Also, the metal plates forming the second connectors of the drive leads (first drive leads 60 and 80, second drive leads 70 and 90, and drive lead 140) may have distal edges that are aligned with each other as viewed in the thickness-wise direction Z.

In each of the embodiments, the lead feeder 210 and the laser beam emitter 220 may be separately provided. In this case, the lead feeder 210 and the laser beam emitter 220 are separately movable. This increases the degree of freedom for the shape of a laser bonding portion formed by the laser beam emitter 220 in plan view.

In each of the embodiments, in plan view, the shapes of the laser bonding portions in the drive leads (first drive leads 60 and 80, second drive leads 70 and 90, and drive lead 140) may be changed in any manner. In an example, the second connector 62 of the first drive lead 60 will be used to describe the shapes of the laser bonding portions.

Figure 39A:
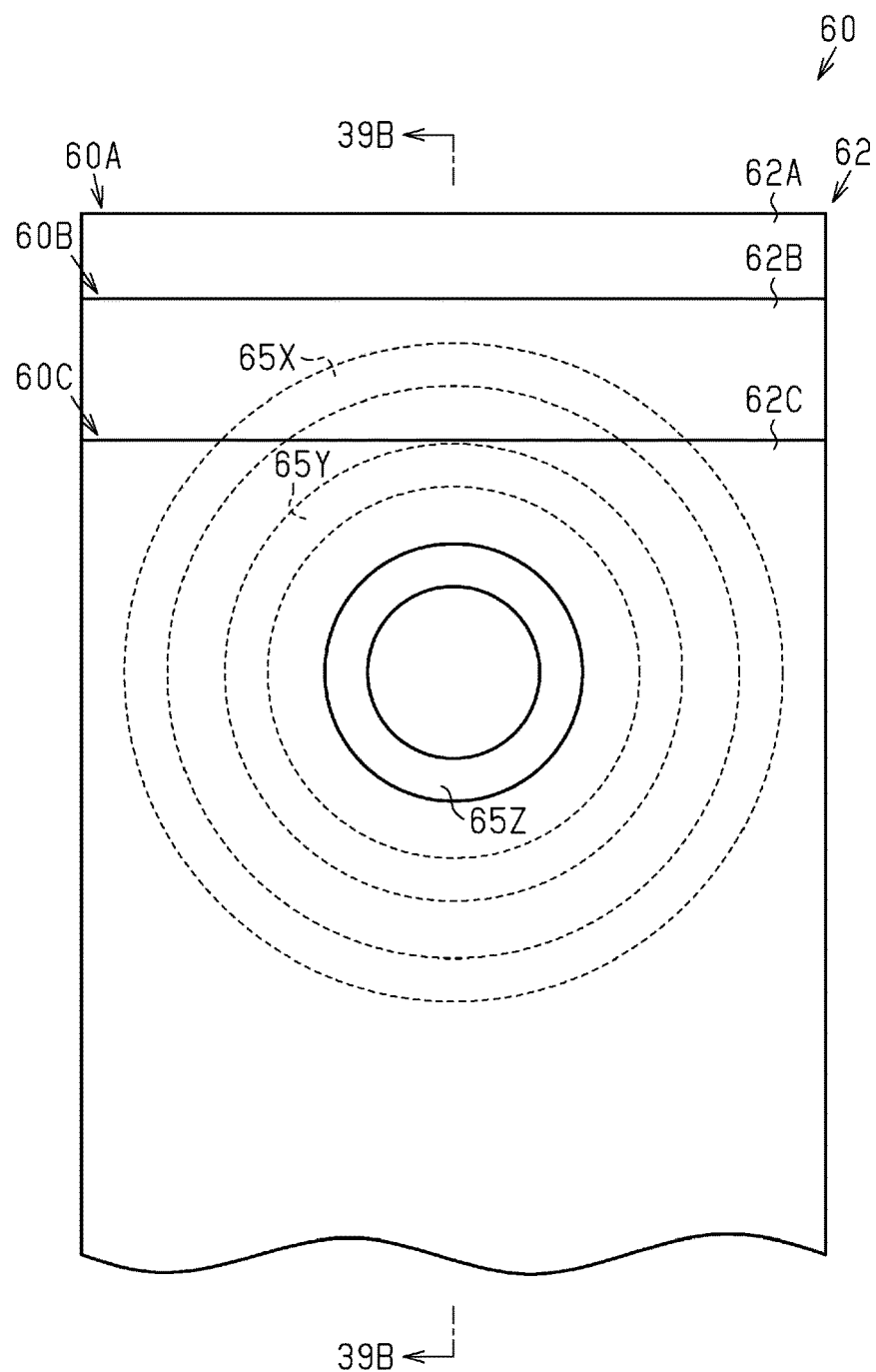
FIG. 39A is a plan view showing second connectors of first drive leads in a modified example of a semiconductor device.

(A) As shown in FIG. 39A, a laser bonding portion 65X, a laser bonding portion 65Y, and a laser bonding portion 65Z are formed by laser beam welding to be concentric with each other in the second connector 62A of the metal plate 60A, the second connector 62B of the metal plate 60B, and the second connector 62C of the metal plate 60C, respectively. The diameter of the laser bonding portion 65X is greater than the diameter of the laser bonding portion 65Y and the diameter of the laser bonding portion 65Z. The diameter of the laser bonding portion 65Y is greater than the diameter of the laser bonding portion 65Z.

Figure 39B:
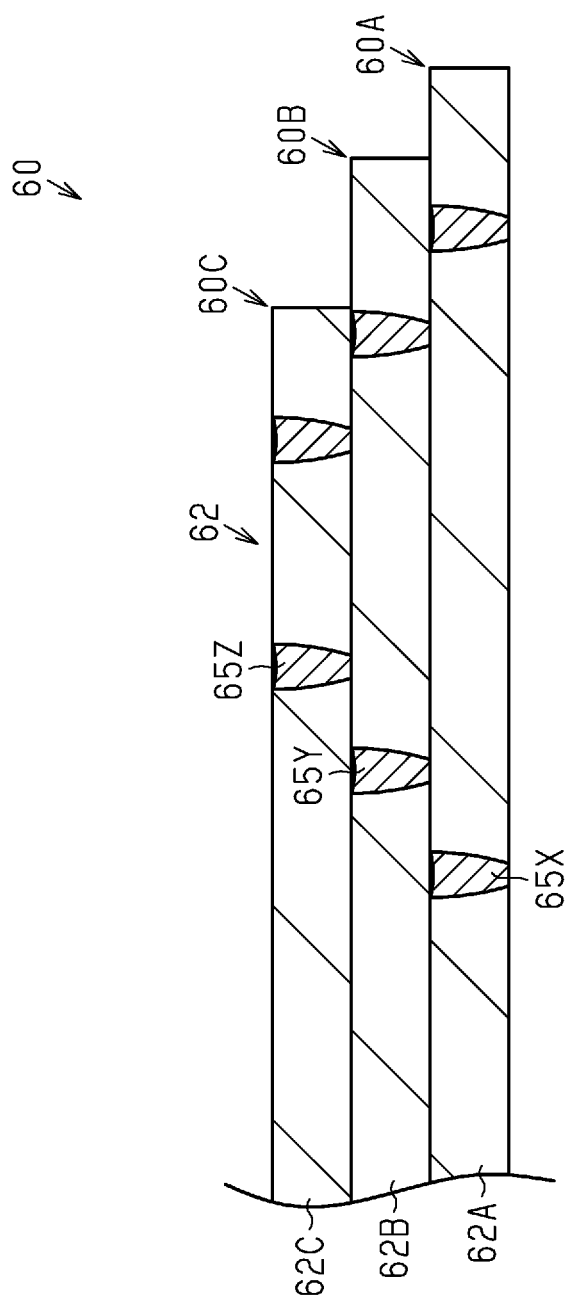
FIG. 39B is a cross-sectional view taken along line 39B-39B in FIG. 39A.

As shown in FIG. 39B, the laser bonding portion 65X in the second connector 62A of the metal plate 60A is disposed so as not to overlap the laser bonding portion 65Y in the second connector 62B of the metal plate 60B as viewed in the thickness-wise direction Z. The laser bonding portion 65Y is disposed so as not to overlap the laser bonding portion 65Z in the second connector 62C of the metal plate 60C as viewed in the thickness-wise direction Z.

The diameter of each of the laser bonding portion 65X, the laser bonding portion 65Y, and the laser bonding portion 65Z may be changed in any manner. In an example, the diameter of the laser bonding portion 65Z may be greater than the diameter of the laser bonding portion 65Y.

The number of laser bonding portions formed in the second connector 62A may be changed in any manner. In an example, the second connector 62A may further include a laser bonding portion that is concentric with the laser bonding portion 65X and has the same diameter as the laser bonding portion 65Z. Alternatively, in the second connector 62A, the diameter of the laser bonding portion 65X may be changed to be the same as the diameter of the laser bonding portion 65Z. In these cases, as viewed in the thickness-wise direction Z, the laser bonding portion 65X overlaps the laser bonding portion 65Z.

Figure 40A:
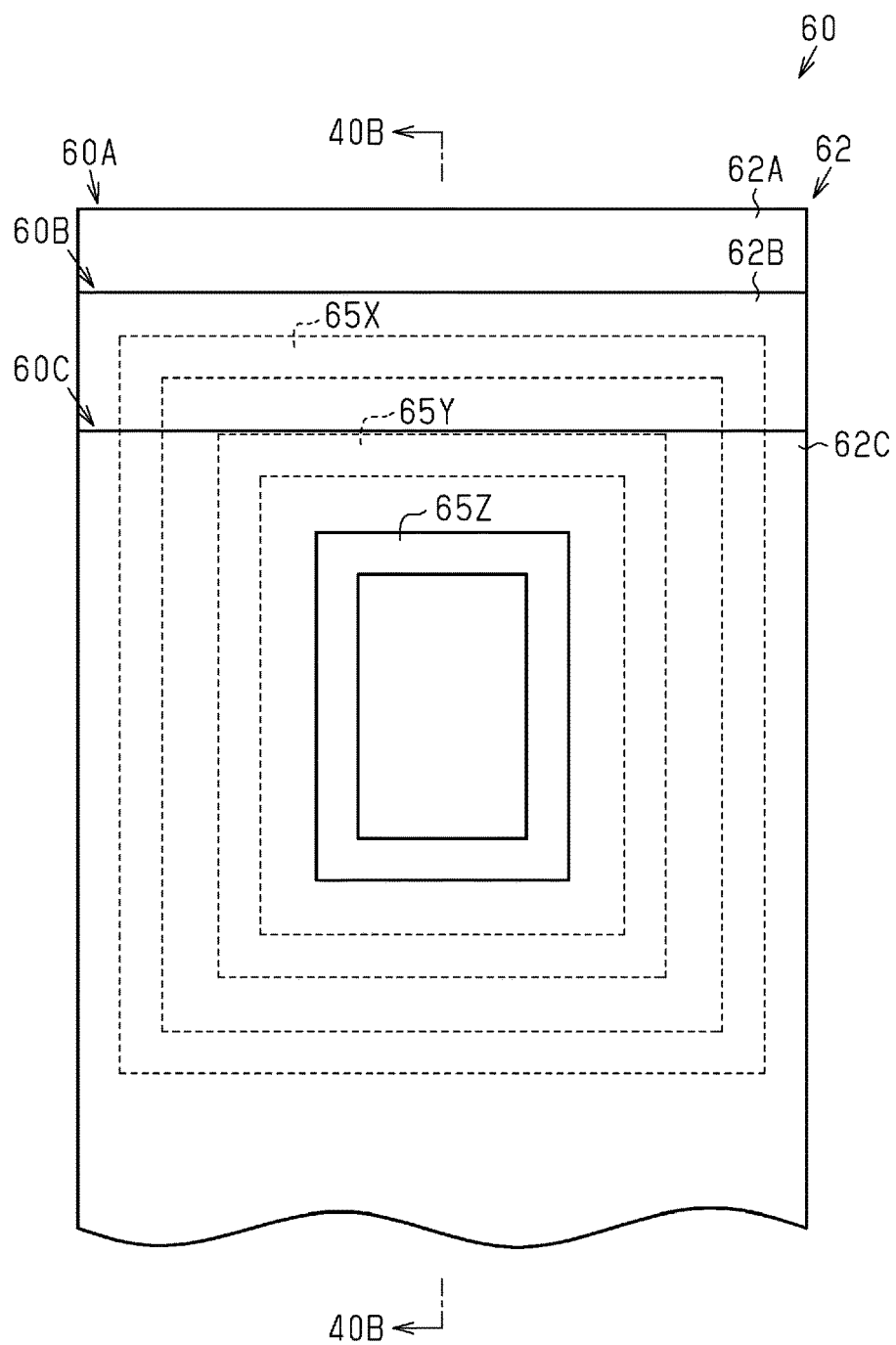
FIG. 40A is a plan view showing second connectors of first drive leads in a modified example of a semiconductor device.

(A) As shown in FIG. 40A, a laser bonding portion 65X, a laser bonding portion 65Y, and a laser bonding portion 65Z are formed by laser beam welding to be rectangular-frame-shaped and mathematically similar to each other in the second connector 62A of the metal plate 60A, the second connector 62B of the metal plate 60B, and the second connector 62C of the metal plate 60C, respectively. The laser bonding portion 65X is greater than the laser bonding portion 65Y and the laser bonding portion 65Z in the dimensions in the width-wise direction X and the length-wise direction Y. The laser bonding portion 65Y is greater than the laser bonding portion 65Z in the dimensions in the width-wise direction X and the length-wise direction Y. Thus, in plan view, the laser bonding portion 65X encompasses the laser bonding portion 65Y and the laser bonding portion 65Z. In plan view, the laser bonding portion 65Y encompasses the laser bonding portion 65Z.

Figure 40B:
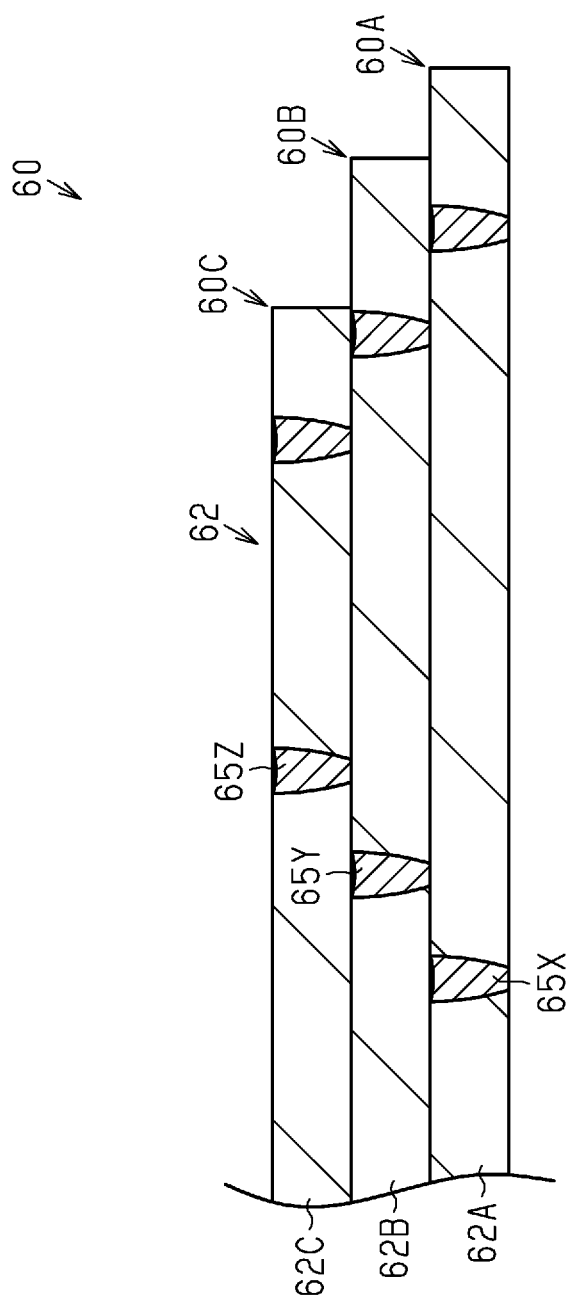
FIG. 40B is a cross-sectional view taken along line 40B-40B in FIG. 40A.

As shown in FIG. 40B, the laser bonding portion 65X in the second connector 62A of the metal plate 60A is disposed so as not to overlap the laser bonding portion 65Y in the second connector 62B of the metal plate 60B as viewed in the thickness-wise direction Z. The laser bonding portion 65Y is disposed so as not to overlap the laser bonding portion 65Z in the second connector 62C of the metal plate 60C as viewed in the thickness-wise direction Z.

The dimensions of the laser bonding portion 65X in the width-wise direction X and the length-wise direction Y may be changed in any manner. The dimensions of the laser bonding portion 65Y in the width-wise direction X and the length-wise direction Y may be changed in any manner. The dimensions of the laser bonding portion 65Z in the width-wise direction X and the length-wise direction Y may be changed in any manner. In an example, the laser bonding portion 65Z may be greater than the laser bonding portion 65Y in the dimensions in the width-wise direction X and the length-wise direction Y. In this case, in plan view, the laser bonding portion 65Z encompasses the laser bonding portion 65Y.

The number of laser bonding portions formed in the second connector 62A may be changed in any manner. In an example, the second connector 62A may further include a laser bonding portion having the same dimensions in the width-wise direction X and the length-wise direction Y as the laser bonding portion 65Z. The laser bonding portion overlaps the laser bonding portion 65Z as viewed in the thickness-wise direction Z. Alternatively, the laser bonding portion 65X of the second connector 62A may have the same dimensions in the width-wise direction X and the length-wise direction Y as the laser bonding portion 65Z. In these cases, as viewed in the thickness-wise direction Z, the laser bonding portion 65X overlaps the laser bonding portion 65Z.

Figure 41A:
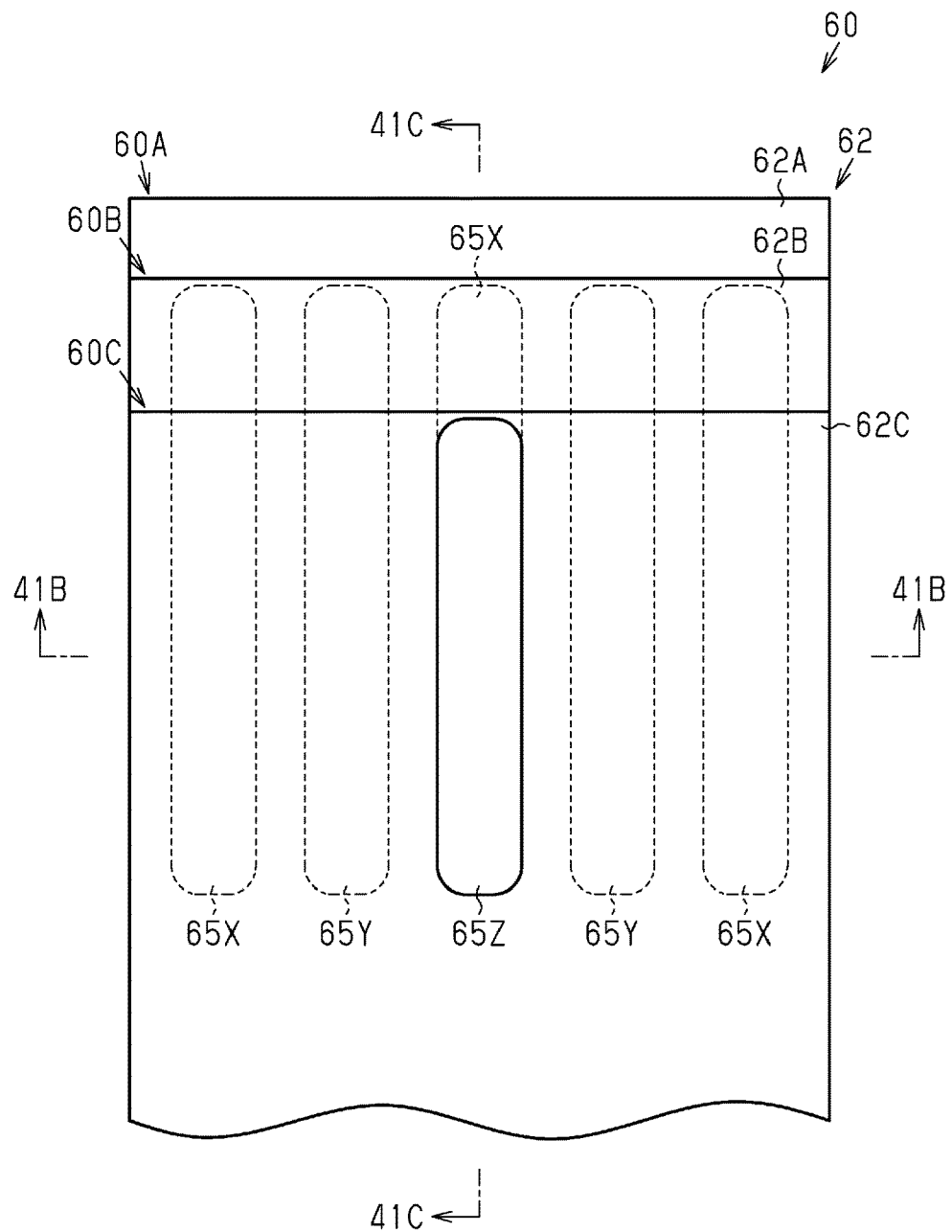
FIG. 41A is a plan view showing second connectors of first drive leads in a modified example of a semiconductor device.

(A) As shown in FIG. 41A, laser bonding portions 65X, laser bonding portions 65Y, and a laser bonding portion 65Z are formed by laser beam welding in the second connector 62A of the metal plate 60A, the second connector 62B of the metal plate 60B, and the second connector 62C of the metal plate 60C, respectively, and extend in the width-wise direction X.

Figure 41B:
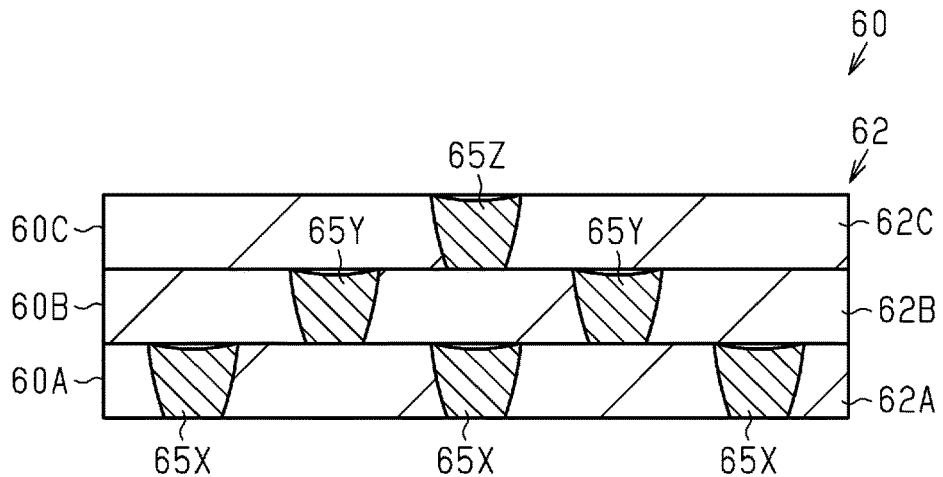
FIG. 41B is a cross-sectional view taken along line 41B-41B in FIG. 41A.

As shown in FIG. 41B, three laser bonding portions 65X are formed in the second connector 62A. Two laser bonding portions 65Y are formed in the second connector 62B. One laser bonding portion 65Z is formed in the second connector 62C. The three laser bonding portions 65X are disposed so as not to overlap the two laser bonding portions 65Y as viewed in the thickness-wise direction Z. The two laser bonding portions 65Y are disposed so as not to overlap the one laser bonding portion 65Z as viewed in the thickness-wise direction Z. As viewed in the thickness-wise direction Z, the one laser bonding portion 65Z overlaps one of the three laser bonding portions 65X that is located in the center in the length-wise direction Y.

Figure 41C:
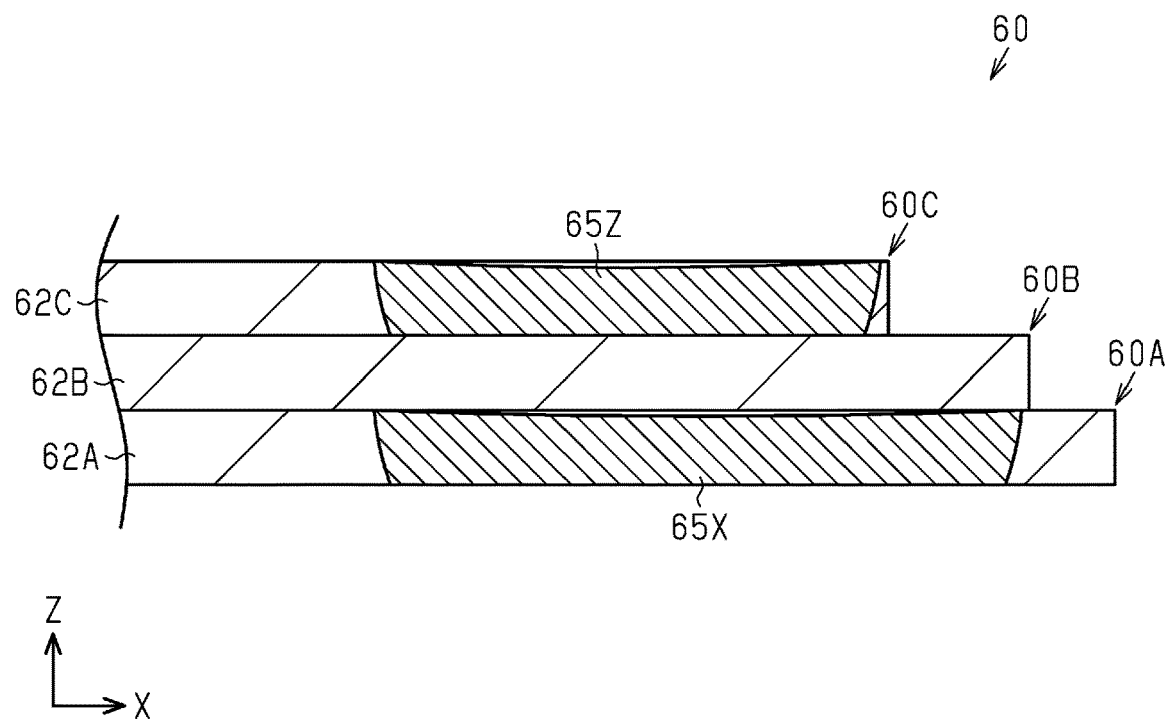
FIG. 41C is a cross-sectional view taken along line 41C-41C in FIG. 41A.

As shown in FIGS. 41A and 41C, the laser bonding portion 65Z is less than the laser bonding portion 65X in the dimension in the width-wise direction X. Also, the laser bonding portion 65Z is less than the laser bonding portion 65Y in the dimension in the width-wise direction X. The laser bonding portion 65Y is equal to the laser bonding portion 65X in the dimension in the width-wise direction X. When the difference in the dimension in the width-wise direction X between the laser bonding portion 65Y and the laser bonding portion 65X is within, for example, 5% of the dimension of the laser bonding portion 65X in the width-wise direction X, it is considered that the laser bonding portion 65Y is equal to the laser bonding portion 65X in the dimension in the width-wise direction X.

The dimension of the three laser bonding portions 65X in the width-wise direction X may be changed in any manner. The dimension of the two laser bonding portions 65Y in the width-wise direction X may be changed in any manner. The dimension of the laser bonding portion 65Z in the width-wise direction X may be changed in any manner. In an example, the laser bonding portion 65Z may be greater than the laser bonding portion 65Y in the dimension in the width-wise direction X. The laser bonding portion 65Y may be greater than the laser bonding portion 65X in the dimension in the width-wise direction X. The two laser bonding portions 65Y may differ from each other in the dimension in the width-wise direction X. The three laser bonding portions 65X may differ from each other in the dimension in the width-wise direction X.

The number of each of laser bonding portions 65X, 65Y, and 65Z may be changed in any manner. In an example, the center laser bonding portion 65X in the width-wise direction X may be omitted from the three laser bonding portions 65X. In an example, the number of laser bonding portions 65Z may be the same as the number of laser bonding portions 65X. In this case, for example, as viewed in the thickness-wise direction Z, the laser bonding portions 65Z overlap the laser bonding portions 65X. Thus, each laser bonding portion 65Z is disposed so as not to overlap the two laser bonding portions 65Y as viewed in the thickness-wise direction Z.

Figure 42:
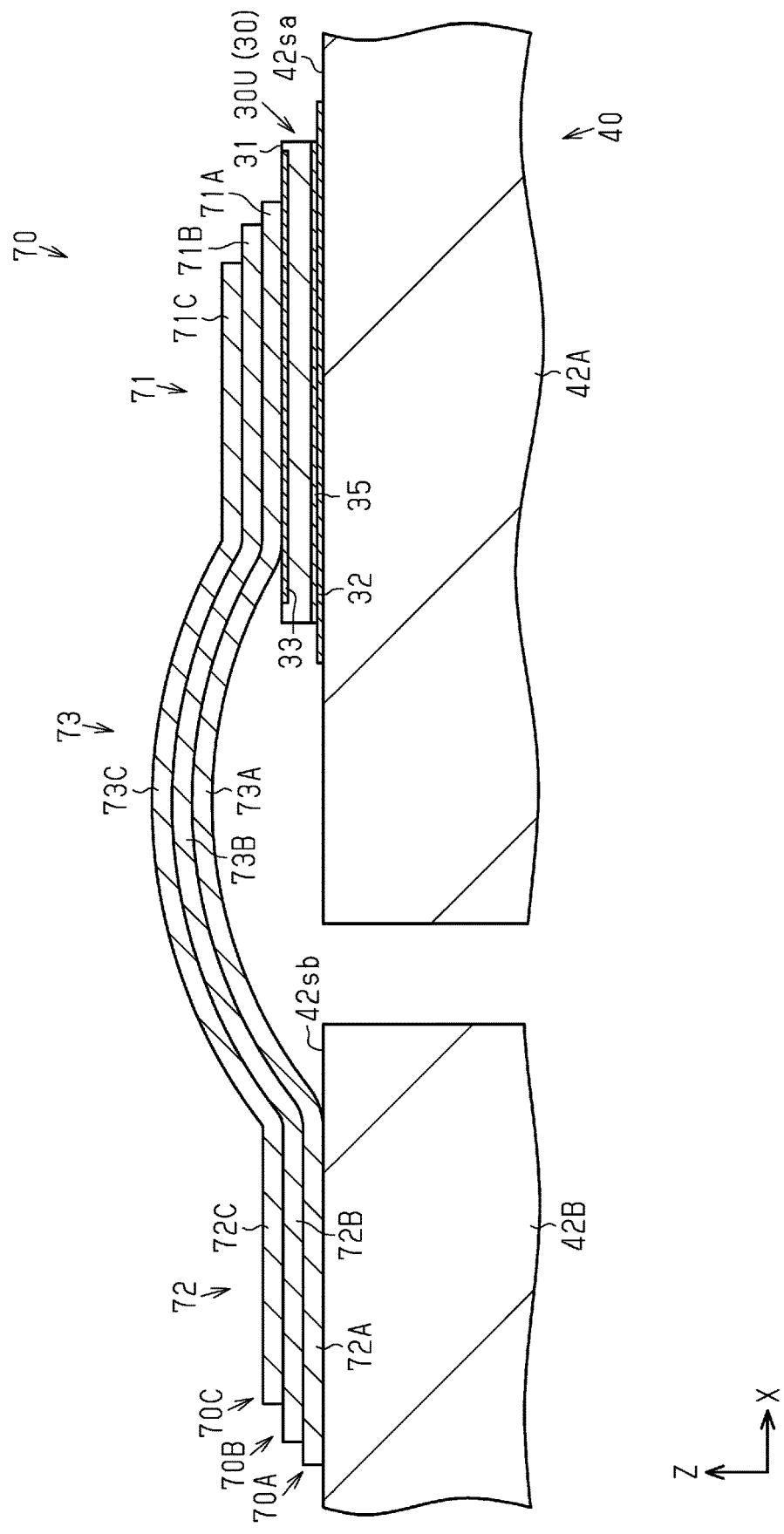
FIG. 42 is a cross-sectional view showing a structure that joins second drive leads to a semiconductor element and a conductive member in a modified example of a semiconductor device.

In each of the embodiments, the shapes of the joints in the drive leads (first drive leads 60 and 80, second drive leads 70 and 90, and drive lead 140) may be changed in any manner. In an example, in a side view of the drive lead, the joint may be curved. FIG. 42 shows a modified example of the second drive lead 70. The joint 73 of the second drive lead 70 is curved so that the center of the joint 73 in the width-wise direction X is located farthest from the support substrate 40 in the thickness-wise direction Z. The joint 73 is gradually separated from the support substrate 40 in the thickness-wise direction Z toward the center in the width-wise direction X.

Figure 43:
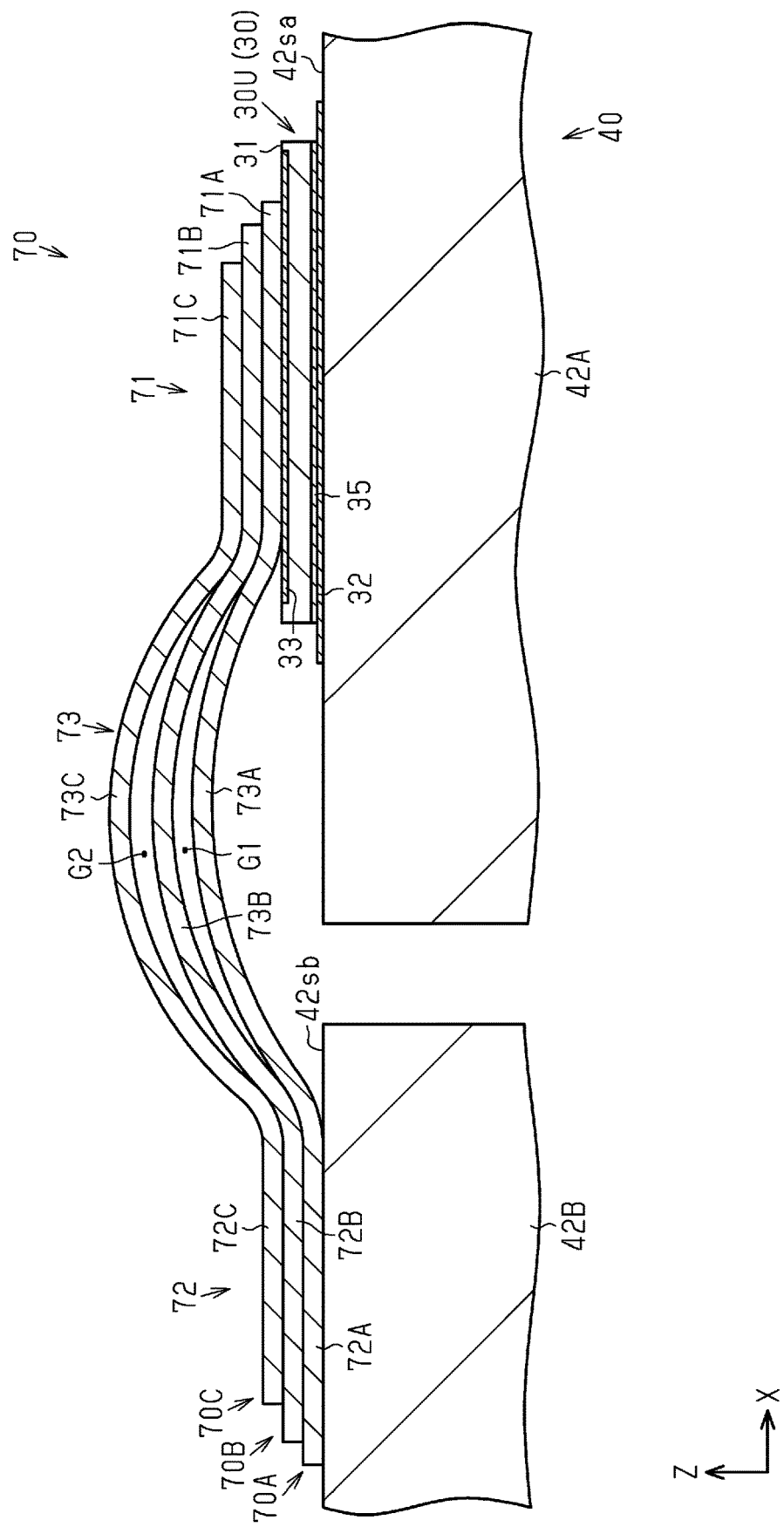
FIG. 43 is a cross-sectional view showing a structure that joins second drive leads to a semiconductor element and a conductive member in a modified example of a semiconductor device.

In each of the embodiments, in the metal plates forming the drive leads (first drive leads 60 and 80, second drive leads 70 and 90, and drive lead 140), the joints of the metal plates adjacent to each other may be spaced apart from each other by a gap. FIG. 43 shows a modified example of the joint 73 of the second drive lead 70 shown in FIG. 42. The joint 73A of the metal plate 70A is spaced apart from the joint 73B of the metal plate 70B by a gap G1. The joint 73B of the metal plate 70B is spaced apart from the joint 73C of the metal plate 70C by a gap G2. In FIG. 43, the gap G1 gradually becomes larger toward the center of the joints 73A and 73B in the width-wise direction X. The gap G2 gradually becomes larger toward the center of the joints 73B and 73C in the width-wise direction X.

The joints of the drive leads in FIG. 43 are formed so that the joints of metal plates adjacent to each other are not in contact with each other. However, there is no limitation to such a configuration. For example, in the drive leads (first drive leads 60 and 80, second drive leads 70 and 90, and drive lead 140), the joints of metals adjacent to each other may be partially in contact with each other.

In each of the embodiments, the pitch between adjacent laser bonding portions in the width-wise direction X in the first connector 61 of the first drive lead 60, the pitch between adjacent laser bonding portions in the width-wise direction X in the second connector 62, the pitch between adjacent laser bonding portions in the width-wise direction X in the first connector 71 of the second drive lead 70, and the pitch between adjacent laser bonding portions in the width-wise direction X in the second connector 72 may be changed.

Figure 44:
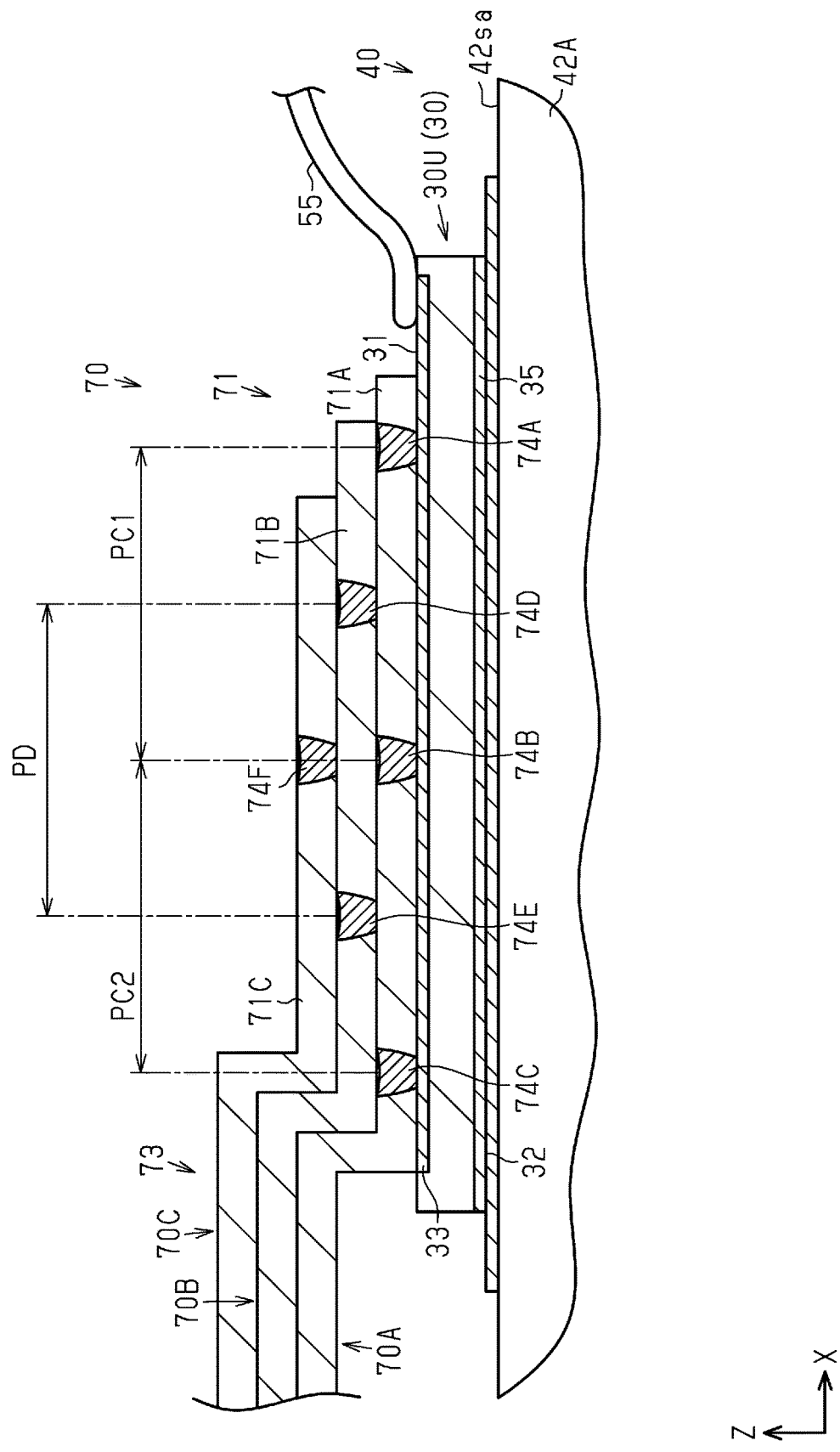
FIG. 44 is a cross-sectional view showing a structure that joins second drive leads to a semiconductor element in a modified example of a semiconductor device.

In an example, as shown in FIG. 44, in the first connector 71A of the second drive lead 70, the pitch PC1 between the laser bonding portion 74A and the laser bonding portion 74B and the pitch PC2 between the laser bonding portion 74B and the laser bonding portion 74C are each larger than the pitches PC1 and PC2 of the second drive lead 70 in the first embodiment (refer to FIG. 21). More specifically, the laser bonding portion 64A is formed in the distal portion of the first connector 71A in the width-wise direction X, the laser bonding portion 64B is formed in the central portion of the first connector 71A in the width-wise direction X, and the laser bonding portion 64C is formed in the basal portion of the first connector 71A in the width-wise direction X. Also, in the first connector 71B, the pitch PD between the laser bonding portion 74D and the laser bonding portion 74E is larger than the pitch PD of the second drive lead 70 in the first embodiment (refer to FIG. 21). The laser bonding portion 74F is formed in the central of the first connector 71C in the width-wise direction X.

In each of the embodiments, in the first drive lead 60, the number of laser bonding portions in the first connector 61 and the number of laser bonding portions in the second connector 62 may be changed in any manner. In the second drive lead 70, the number of laser bonding portions in the first connector 71 and the number of laser bonding portions in the second connector 72 may be changed in any manner.

Figure 45:
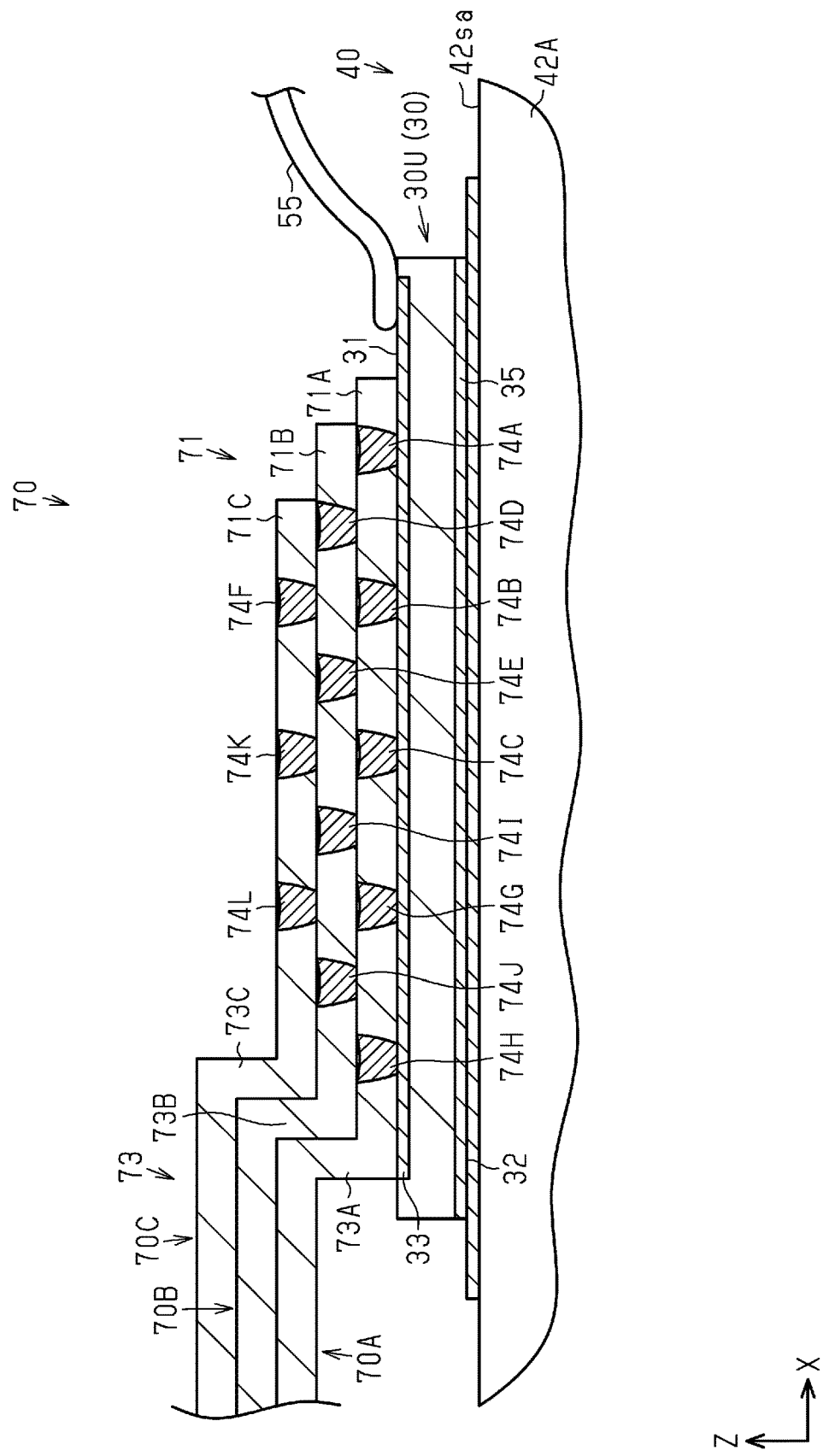
FIG. 45 is a cross-sectional view showing a structure that joins second drive leads to a semiconductor element in a modified example of a semiconductor device.

In an example, as shown in FIG. 45, five laser bonding portions 74A, 74B, 74C, 74G, and 74H are formed in the first connector 71A. The laser bonding portions 74G and 74H are formed in the first connector 71A at positions closer to the basal end (closer to joint 73A) than the laser bonding portions 74A, 74B, and 74C in the width-wise direction X. The laser bonding portion 74G is disposed adjacent to the laser bonding portion 74C in the width-wise direction X. The laser bonding portion 74H is disposed adjacent to the laser bonding portion 74G in the width-wise direction X. The laser bonding portions 74A, 74B, 74C, 74G, and 74H are formed in the first connector 71A at the same pitch in the width-wise direction X.

Four laser bonding portions 74D, 74E, 74I, and 74J are formed in the first connector 71B. The laser bonding portions 74I and 74J are formed in the first connector 71B at positions closer to the basal end (closer to joint 73B) than the laser bonding portions 74D and 74E in the width-wise direction X. The laser bonding portion 74I is disposed adjacent to the laser bonding portion 74E in the width-wise direction X. The laser bonding portion 74J is disposed adjacent to the laser bonding portion 74I in the width-wise direction X. The laser bonding portions 74D, 74E, 74I, and 74J are formed in the first connector 71B at the same pitch in the width-wise direction X. The laser bonding portions 74D, 74E, 74I, and 74J are disposed so as not to overlap the laser bonding portions 74A, 74B, 74C, 74G, and 74H in the thickness-wise direction Z. The laser bonding portion 74I is disposed between the laser bonding portion 74C and the laser bonding portion 74G in the width-wise direction X. The laser bonding portion 74J is disposed between the laser bonding portion 74G and the laser bonding portion 74H in the width-wise direction X.

Three laser bonding portions 74F, 74K, and 74L are formed in the first connector 71C. The laser bonding portions 74K and 74L are formed in the first connector 71C at positions closer to the basal end (closer to joint 73C) than the laser bonding portion 74F in the width-wise direction X. The laser bonding portion 74K is disposed adjacent to the laser bonding portion 74F in the width-wise direction X. The laser bonding portion 74L is disposed adjacent to the laser bonding portion 74K in the width-wise direction X. The laser bonding portions 74F, 74K, and 74L are formed in the first connector 71C at the same pitch in the width-wise direction X. The laser bonding portions 74F, 74K, and 74L are disposed so as not to overlap the laser bonding portions 74D, 74E, 74I, and 74J in the thickness-wise direction Z. The laser bonding portion 74K is disposed between the laser bonding portion 74E and the laser bonding portion 74I in the width-wise direction X. The laser bonding portion 74L is disposed between the laser bonding portion 74I and the laser bonding portion 74J in the width-wise direction X. In the thickness-wise direction Z, the laser bonding portion 74K overlaps the laser bonding portion 74C of the first connector 71A, and the laser bonding portion 74L overlaps the laser bonding portion 74G of the first connector 71A.

In each of the embodiments, the number of metal plates forming the drive leads (first drive leads 60 and 80, second drive leads 70 and 90, and drive lead 140) may be changed in any manner. In an example, FIG. 46 shows a structure obtained by omitting the metal plates 70B and 70C from the second drive lead 70 in the modified example shown in FIG. 42. That is, in FIG. 46, metal plates are not stacked in the second drive lead 70.

As shown in FIG. 46, the second drive lead 70 is formed of the metal plate 70A. Thus, the first connector 71 of the second drive lead 70 is formed of the first connector 71A of the metal plate 70A, the second connector 72 of the second drive lead 70 is formed of the second connector 72A of the metal plate 70A, and the joint 73 of the second drive lead 70 is formed of the joint 73A of the metal plate 70A. The first connector 71 (71A) is bonded to the source electrode 33 of the second semiconductor element 30L by laser beam welding. The laser bonding portions 74A, 74B, and 74C are formed in the first connector 71 (71A). The second connector 72 (72A) is bonded to the conductive member 42B by laser beam welding. The laser bonding portions 75A, 75B, and 75C are formed in the second connector 72 (72A).

In each of the embodiments, the structure of the second connector in the drive leads (first drive leads 60 and 80, second drive leads 70 and 90, and drive lead 140) may be changed in any manner. For example, the second connector does not have to have a stacking structure of metal plates.

Clauses

The technical aspects that are understood from the embodiments and the modified examples will be described below.

Clause 1. A semiconductor device including:
a semiconductor element including an element main surface on which a drive electrode is formed;
a drive conductor including a drive connection surface that faces in a same direction as the element main surface; and
a drive connection member that connects the drive electrode to the drive conductor, the drive connection member being formed of a thin metal plate that is belt-shaped as viewed in a first direction, which is a direction orthogonal to the element main surface of the semiconductor element, where
the drive connection member includes an element-side connector connected to the drive electrode, and
the element-side connector includes an element bonding portion bonded to the drive electrode by laser beam processing.

Clause 2. The semiconductor device according to clause 1, where
the drive connection member includes a conductor-side connector connected to the drive conductor, and
the conductor-side connector includes a conductor bonding portion bonded to the drive conductor by laser beam processing.

DESCRIPTION OF THE REFERENCE NUMERALS 1A, 1B, 1C, 1D, 1E) semiconductor device
10, 10C, 10E) encapsulation resin
22) input lead (drive conductor)
22c) extension
22cs) main surface (drive connection surface)
30) semiconductor element
30U) first semiconductor element
30L) second semiconductor element
31) element main surface
32) element back surface
33) source electrode (drive electrode)
34) gate electrode (control electrode)
42B) conductive member (drive conductor)
42sb) main surface (drive connection surface)
44A) gate layer (connection conductor)
44B) gate layer (connection conductor)
45A) detection layer (connection conductor)
45B) detection layer (connection conductor)
51) first control wire
52) second control wire
53) first connection wire
54) second connection wire
55) first detection wire
56) second detection wire
57) first connection wire
58) second connection wire
60) first drive lead (drive connection member, second drive connection member)
60A) metal plate (first metal plate)
60B) metal plate (second metal plate)
60C) metal plate (third metal plate)
61) first connector
61A) first connector (first element-side connector)
61B) first connector (second element-side connector)
61C) first connector (third element-side connector)
62) second connector
62A) second connector (first conductor-side connector)
62B) second connector (second conductor-side connector)
62C) second connector (third conductor-side connector)
63) joint 63A) joint (first joint)
63B) joint (second joint)
63C) joint (third joint) 64A, 64B, 64C) laser bonding portion (first element bonding portion)
64D, 64E) laser bonding portion (second element bonding portion)
64F) laser bonding portion (third element bonding portion) 65A, 65B, 65C) laser bonding portion (first conductor bonding portion)
65D, 65E) laser bonding portion (second conductor bonding portion)
65F) laser bonding portion (third conductor bonding portion)
70) second drive lead (drive connection members, first drive connection member)
70A) metal plate (first metal plate)
70B) metal plate (second metal plate)
70C) metal plate (third metal plate)
71) first connector
71A) first connector (first element-side connector)
71B) first connector (second element-side connector)
71C) first connector (third element-side connector)
72) second connector
72A) second connector (first conductor-side connector)
72B) second connector (second conductor-side connector)
72C) second connector (third conductor-side connector)
73) joint
73A) joint (first joint)
73B) joint (second joint)
73C) joint (third joint)
74A, 74B, 74C) laser bonding portion (first element bonding portion)
74D, 74E) laser bonding portion (second element bonding portion)
75F) laser bonding portion (third element bonding portion)
75A, 75B, 75C) laser bonding portion (first conductor bonding portion)
75D, 75E) laser bonding portion (second conductor bonding portion)
75F) laser bonding portion (third conductor bonding portion)
80) first drive lead (drive connection member)
80A) metal plate (first metal plate)
80B) metal plate (second metal plate)

80C) metal plate (third metal plate)
81) first connector
81A) first connector (first element bonding portion)
81B) first connector (second element bonding portion)
81C) first connector (third element bonding portion)
82) second connector
82A) second connector (first conductor bonding portion)
82B) second connector (second conductor bonding portion)
82C) second connector (third conductor bonding portion)
83) joint
83A) joint (first joint)
83B) joint (second joint)
83C) joint (third joint)
90) second drive lead (drive connection member)
90A) metal plate (first metal plate)
90B) metal plate (second metal plate)
90C) metal plate (third metal plate)
91) first connector
91A) first connector (first element bonding portion)
91B) first connector (second element bonding portion)
91C) first connector (third element bonding portion)
92) second connector
92A) second connector (first conductor bonding portion)
92B) second connector (second conductor bonding portion)
92C) second connector (third conductor bonding portion)
93) joint 93A) joint (first joint)
93B) joint (second joint)
93C) joint (third joint)
140) drive lead (drive connection members)
140A) metal plate (first metal plate)
140B) metal plate (second metal plate)
140C) metal plate (third metal plate)
141) first connector
142) second connector
143) joint.

The invention claimed is:

1. A semiconductor device comprising:
a semiconductor element including an element main surface on which a drive electrode is formed;
a drive conductor including a drive connection surface facing in a same direction as the element main surface; and
drive connection members that connect the drive electrode to the drive conductor, the drive connection members being formed of a thin metal plate that is belt-shaped as viewed in a first direction, which is a direction orthogonal to the element main surface of the semiconductor element, wherein
the drive connection members include at least a first metal plate connected to the semiconductor element and a second metal plate stacked on the first metal plate,
the first metal plate includes a first element-side connector connected to the drive electrode,
the second metal plate includes a second element-side connector connected to the first element-side connector, and
the first element-side connector and the second element-side connector are stacked in the first direction.

2. The semiconductor device according to claim 1, wherein
the first element-side connector includes a first element bonding portion bonded to the drive electrode by laser beam processing, and
the second element-side connector includes a second element bonding portion bonded to the first element-side connector by laser beam processing.

3. The semiconductor device according to claim 2, wherein the second element bonding portion is disposed so as not to overlap the first element bonding portion as viewed in the first direction.

4. The semiconductor device according to claim 1, wherein
the drive connection members include a third metal plate stacked on the second metal plate, and
the third metal plate includes a third element-side connector stacked on the second element-side connector in the first direction.

5. The semiconductor device according to claim 4, wherein the third element-side connector includes a third element bonding portion bonded to the second element-side connector by laser beam processing.

6. The semiconductor device according to claim 5, wherein
the second element-side connector includes a second element bonding portion bonded to the first element-side connector by laser beam processing, and
the second element bonding portion is disposed so as not to overlap the third element bonding portion as viewed in the first direction.

7. The semiconductor device according to claim 6, wherein
the first element-side connector includes a first element bonding portion bonded to the drive electrode by laser beam processing, and
the first element bonding portion overlaps the third element bonding portion as viewed in the first direction.

8. The semiconductor device according to claim 5, wherein
the first element-side connector includes a first element bonding portion bonded to the drive electrode by laser beam processing,
the second element-side connector includes a second element bonding portion bonded to the first element-side connector by laser beam processing,
there are fewer of the first element bonding portion than the second element bonding portion, and
there are fewer of the third element bonding portion than the second element bonding portion.

9. The semiconductor device according to claim 1, wherein as viewed in the first direction, the first element-side connector and the second element-side connector, which are stacked, are spaced from each other in a direction in which the drive connection members extend.

10. The semiconductor device according to claim 1, wherein
the drive connection members are formed from a same material, and
the drive connection members are equal to each other in width as viewed in the first direction.

11. The semiconductor device according to claim 1, wherein
the first metal plate includes a first conductor-side connector connected to the drive connection surface of the drive conductor,
the second metal plate includes a second conductor-side connector connected to the first conductor-side connector, and
the first conductor-side connector and the second conductor-side connector are stacked in the first direction.

12. The semiconductor device according to claim 11, wherein
the first conductor-side connector includes a first conductor bonding portion bonded to the drive connection surface of the drive conductor by laser beam processing, and
the second conductor-side connector includes a second conductor bonding portion bonded to the first conductor-side connector by laser beam processing.

13. The semiconductor device according to claim 12, wherein the first conductor bonding portion and the second conductor bonding portion are disposed so as not to overlap each other as viewed in the first direction.

14. The semiconductor device according to claim 11, wherein
the drive connection members include a third metal plate stacked on the second metal plate, and
the third metal plate includes a third conductor-side connector stacked on the second conductor-side connector in the first direction.

15. The semiconductor device according to claim 14, wherein the third conductor-side connector includes a third conductor bonding portion bonded to the second conductor-side connector by laser beam processing.

16. A method for manufacturing a semiconductor device that includes a semiconductor element including an element main surface on which an drive electrode is formed, a drive conductor including a drive connection surface facing in a same direction as the element main surface, and drive connection members connecting the drive electrode to the drive conductor and being formed of a thin plate that is belt-shaped as viewed in a first direction, which is a direction orthogonal to the element main surface of the semiconductor element, the method comprising:
a drive electrode connecting step of connecting a first metal plate, which is included in the drive connection members, to the drive electrode of the semiconductor element to form a first element-side connector; and
a first element stacking step of stacking a second metal plate, which is included in the drive connection members, on the first element-side connector in the first direction and connecting the second metal plate to the first element-side connector through laser beam processing to form a second element-side connector.

17. The method according to claim 16, further comprising a second element stacking step of stacking a third metal plate, which is included in the drive connection members, on the second element-side connector in the first direction and connecting the third metal plate to the second element-side connector through laser beam processing.

18. The method according to claim 17, further comprising a conductor connecting step of connecting the first metal plate to the drive conductor through laser beam processing to form a first conductor-side connector after the drive electrode connecting step before the first element stacking step.

19. The method according to claim 18, further comprising a first conductor stacking step of stacking the second metal plate on the first conductor-side connector in the first direction and connecting the second metal plate to the first conductor-side connector through laser beam processing to form a second conductor-side connector after the first element stacking step before the second element stacking step.

20. The method according to claim 19, further comprising a second conductor stacking step of stacking the third metal plate on the second conductor-side connector in the first direction and connecting the third metal plate to the second conductor-side connector through laser beam processing to form a third conductor-side connector after the second element stacking step.

* * * * *